(12) United States Patent
Kashima et al.

(10) Patent No.: US 11,309,454 B2
(45) Date of Patent: Apr. 19, 2022

(54) DEEP ULTRAVIOLET LED AND METHOD FOR PRODUCING THE SAME

(71) Applicants: MARUBUN CORPORATION, Tokyo (JP); SHIBAURA MACHINE CO., LTD., Tokyo (JP); RIKEN, Wako (JP); ULVAC, INC., Chigasaki (JP); TOKYO OHKA KOGYO CO., LTD., Kawasaki (JP); NIPPON TUNGSTEN CO., LTD., Fukuoka (JP); DAI NIPPON PRINTING CO., LTD., Tokyo (JP); DOWA HOLDINGS CO., LTD., Tokyo (JP)

(72) Inventors: Yukio Kashima, Tokyo (JP); Eriko Matsuura, Tokyo (JP); Mitsunori Kokubo, Shizuoka (JP); Takaharu Tashiro, Shizuoka (JP); Hideki Hirayama, Saitama (JP); Noritoshi Maeda, Saitama (JP); Masafumi Jo, Saitama (JP); Ryuichiro Kamimura, Kanagawa (JP); Yamato Osada, Kanagawa (JP); Kanji Furuta, Kanagawa (JP); Takeshi Iwai, Kanagawa (JP); Yohei Aoyama, Kanagawa (JP); Yasushi Iwaisako, Fukuoka (JP); Tsugumi Nagano, Tokyo (JP); Yasuhiro Watanabe, Tokyo (JP)

(73) Assignees: Marubun Corporation, Tokyo (JP); Shibaura Machine Co., Ltd., Tokyo (JP); RIKEN, Saitama (JP); ULVAC, Inc., Kanagawa (JP); Tokyo Ohka Kogyo Co., Ltd., Kanaga (JP); Nippon Tungsten Co., Ltd., Fukuoka (JP); Dai Nippon Printing Co., Ltd., Tokyo (JP); Dowa Holdings Co., Ltd., Tokyo (JP)

( * ) Notice: Subject to any disclaimer, the term of this patent is extended or adjusted under 35 U.S.C. 154(b) by 64 days.

(21) Appl. No.: 16/964,881

(22) PCT Filed: Jan. 25, 2019

(86) PCT No.: PCT/JP2019/002392
§ 371 (c)(1),
(2) Date: Jul. 24, 2020

(87) PCT Pub. No.: WO2019/146737
PCT Pub. Date: Aug. 1, 2019

(65) Prior Publication Data
US 2021/0036186 A1 Feb. 4, 2021

(30) Foreign Application Priority Data

Jan. 26, 2018 (JP) .............................. JP2018-012073

(51) Int. Cl.
*H01L 33/10* (2010.01)
*H01L 33/00* (2010.01)
(Continued)

(52) U.S. Cl.
CPC ............ *H01L 33/10* (2013.01); *H01L 33/007* (2013.01); *H01L 33/06* (2013.01); *H01L 33/32* (2013.01);
(Continued)

(58) Field of Classification Search
None
See application file for complete search history.

(56) References Cited

U.S. PATENT DOCUMENTS 5,337,328 A 8/1994 Lang et al.
5,955,749 A 9/1999 Joannopoulos et al.
(Continued)

FOREIGN PATENT DOCUMENTS

CN 103354956 10/2013
DE 102009057780 6/2001
(Continued)

OTHER PUBLICATIONS

International Search Report issued in corresponding International Application No. PCT/JP2016/082397 (3 pages).
(Continued)

*Primary Examiner* — Bradley Smith
(74) *Attorney, Agent, or Firm* — Hamre, Schumann, Mueller & Larson, P.C.

(57) ABSTRACT

A deep ultraviolet LED with a design wavelength λ, including a reflecting electrode layer (Au), a metal layer (Ni), a
(Continued)

p-GaN contact layer, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate, in which the thickness of the p-block layer is 52 to 56 nm, a two-dimensional reflecting photonic crystal periodic structure having a plurality of voids is provided in a region from the interface between the metal layer and the p-GaN contact layer to a position not beyond the interface between the p-GaN contact layer and the p-block layer in the thickness direction of the p-GaN contact layer, the distance from an end face of each of the voids in the direction of the sapphire substrate to the interface between the multi-quantum well layer and the i-guide layer satisfies $\lambda/2n_{1Deff}$ (where $\lambda$ is the design wavelength and n1Deff is the effective average refractive index of each film of the stacked structure from the end face of each void to the i-guide layer) in the perpendicular direction, the distance being in the range of 53 to 57 nm, the two-dimensional reflecting photonic crystal periodic structure has a photonic band gap that opens for TE polarized components, and provided that the period a of the two-dimensional reflecting photonic crystal periodic structure satisfies a Bragg condition with respect to light with the design wavelength $\lambda$, the order m of a formula of the Bragg condition: $m\lambda/n_{2Deff}=2a$ (where m is the order, $\lambda$ is the design wavelength, $n_{2Deff}$ is the effective refractive index of two-dimensional photonic crystals, and a is the period of the two-dimensional photonic crystals) satisfies $2 \le m \le 4$, and the radius of each void is R, R/a satisfies $0.30 \le R/a \le 0.40$.

6 Claims, 27 Drawing Sheets

(51) Int. Cl.
 *H01L 33/06* (2010.01)
 *H01L 33/32* (2010.01)
 *H01L 33/40* (2010.01)
(52) U.S. Cl.
 CPC .... *H01L 33/405* (2013.01); *H01L 2933/0016* (2013.01); *H01L 2933/0083* (2013.01)

(56) References Cited

U.S. PATENT DOCUMENTS

| | | | |
|---|---|---|---|
| 7,520,742 B2 | 4/2009 | Motowaki et al. | |
| 7,687,811 B2 | 3/2010 | Jang et al. | |
| 7,872,280 B2 | 1/2011 | Nagai et al. | |
| 8,405,103 B2 | 3/2013 | Lee et al. | |
| 8,419,995 B2 | 4/2013 | Yoneda et al. | |
| 8,703,837 B2 | 4/2014 | Kawaguchi | |
| 9,005,502 B2 | 4/2015 | Chiba et al. | |
| 9,073,102 B2 | 7/2015 | Yoshida | |
| 9,263,649 B2 | 2/2016 | Koike et al. | |
| 9,349,918 B2 | 5/2016 | Kashima et al. | |
| 9,806,229 B2 | 10/2017 | Kashima et al. | |
| 9,929,311 B2 | 3/2018 | Kashima et al. | |
| 9,929,317 B2 | 3/2018 | Kashima et al. | |
| 10,056,526 B2 | 8/2018 | Kashima et al. | |
| 2002/0167013 A1 | 11/2002 | Iwasaki et al. | |
| 2004/0016936 A1 | 1/2004 | Tanaka et al. | |
| 2004/0113166 A1 | 6/2004 | Tadatomo et al. | |
| 2004/0114652 A1 | 6/2004 | Yoshikawa | |
| 2004/0206962 A1 | 10/2004 | Erchak et al. | |
| 2004/0252509 A1 | 12/2004 | Lin | |
| 2004/0264903 A1 | 12/2004 | Dridi et al. | |
| 2006/0043400 A1 | 3/2006 | Erchak et al. | |
| 2006/0255341 A1 | 11/2006 | Pinnington et al. | |
| 2006/0284187 A1 | 12/2006 | Wierer et al. | |
| 2006/0284190 A1 | 12/2006 | Zimmerman et al. | |
| 2007/0081253 A1 | 4/2007 | Yamauchi | |
| 2007/0121694 A1 | 5/2007 | Okamoto | |
| 2007/0125995 A1 | 6/2007 | Weisbuch et al. | |
| 2007/0177644 A1 | 8/2007 | Corzine | |
| 2007/0257269 A1 | 11/2007 | Cho et al. | |
| 2007/0267646 A1 | 11/2007 | Wierer et al. | |
| 2008/0024053 A1 | 1/2008 | Fujimoto et al. | |
| 2008/0043444 A1 | 2/2008 | Hasegawa et al. | |
| 2008/0061304 A1 | 3/2008 | Huang et al. | |
| 2008/0080581 A1 | 4/2008 | Wierer et al. | |
| 2008/0258160 A1 | 10/2008 | Do | |
| 2009/0134425 A1 | 5/2009 | Nagai | |
| 2009/0184334 A1 | 7/2009 | Lee et al. | |
| 2010/0072501 A1 | 3/2010 | Wakai et al. | |
| 2010/0140643 A1 | 6/2010 | Cho et al. | |
| 2010/0219395 A1* | 9/2010 | Hirayama | H01L 33/06 257/13 |
| 2010/0237372 A1 | 9/2010 | Kim et al. | |
| 2011/0062469 A1 | 3/2011 | Camras et al. | |
| 2011/0068676 A1 | 3/2011 | Jeon et al. | |
| 2011/0309326 A1 | 12/2011 | Gaska et al. | |
| 2012/0027038 A1 | 2/2012 | Noda et al. | |
| 2012/0112165 A1 | 5/2012 | Charlton et al. | |
| 2012/0224147 A1 | 9/2012 | Tomiyama et al. | |
| 2012/0228653 A1 | 9/2012 | Ishida et al. | |
| 2012/0247950 A1 | 10/2012 | Kaida et al. | |
| 2012/0261642 A1 | 10/2012 | Bergenek et al. | |
| 2012/0286319 A1 | 11/2012 | Lee et al. | |
| 2013/0009167 A1 | 1/2013 | Tan et al. | |
| 2013/0026531 A1 | 1/2013 | Seo et al. | |
| 2013/0037820 A1 | 2/2013 | Tsukihara et al. | |
| 2013/0043499 A1 | 2/2013 | Ohta et al. | |
| 2013/0043500 A1 | 2/2013 | Orita | |
| 2013/0069034 A1 | 3/2013 | Hirayama | |
| 2013/0146916 A1 | 6/2013 | Vamamoto | |
| 2013/0222770 A1 | 8/2013 | Tomiyama | |
| 2013/0320301 A1 | 12/2013 | Seo et al. | |
| 2013/0328013 A1 | 12/2013 | Inazu et al. | |
| 2014/0024150 A1 | 1/2014 | Matsumura et al. | |
| 2014/0057377 A1 | 2/2014 | Kamimura et al. | |
| 2014/0084317 A1 | 3/2014 | Lee et al. | |
| 2014/0151733 A1 | 6/2014 | Koike et al. | |
| 2014/0167066 A1 | 6/2014 | Kashima et al. | |
| 2015/0044417 A1 | 2/2015 | Koike | |
| 2015/0214448 A1 | 7/2015 | Lee et al. | |
| 2015/0280069 A1 | 10/2015 | Zhang et al. | |
| 2015/0372190 A1 | 12/2015 | Hirayama | |
| 2016/0042102 A1* | 2/2016 | Kashima | H01L 33/44 257/98 |
| 2016/0133785 A1* | 5/2016 | Kashima | H01L 33/0025 257/76 |
| 2017/0358712 A1 | 12/2017 | Kashima et al. | |
| 2018/0198026 A1 | 7/2018 | Kashima et al. | |
| 2018/0248075 A1 | 8/2018 | Kashima et al. | |
| 2019/0006558 A1 | 1/2019 | Watanabe et al. | |

FOREIGN PATENT DOCUMENTS

| | | |
|---|---|---|
| EP | 1526583 | 4/2005 |
| EP | 2690650 | 1/2014 |
| EP | 2733752 | 5/2014 |
| EP | 2827361 | 1/2015 |
| EP | 2942818 | 11/2015 |
| JP | 2002305328 | 10/2002 |
| JP | 2007109689 | 4/2004 |
| JP | 2004-179428 | 6/2004 |
| JP | 2004200209 | 7/2004 |
| JP | 2005012160 | 1/2005 |
| JP | 2005-317596 | 11/2005 |
| JP | 2006196658 | 7/2006 |
| JP | 2006276388 | 10/2006 |
| JP | 2006523953 | 10/2006 |
| JP | 2007036186 | 2/2007 |
| JP | 2007294789 | 11/2007 |
| JP | 2007305998 | 11/2007 |
| JP | 2008030235 | 2/2008 |
| JP | 2008053425 | 3/2008 |

(56) References Cited

FOREIGN PATENT DOCUMENTS

| | | |
|---|---|---|
| JP | 2008098526 | 4/2008 |
| JP | 2008117922 | 5/2008 |
| JP | 2008538658 | 10/2008 |
| JP | 2008311317 | 12/2008 |
| JP | 2009033180 | 2/2009 |
| JP | 4329374 | 9/2009 |
| JP | 2009267263 | 11/2009 |
| JP | 2010074008 | 4/2010 |
| JP | 2010074090 | 4/2010 |
| JP | 2010135798 | 6/2010 |
| JP | 200981469 | 10/2010 |
| JP | 4610863 | 1/2011 |
| JP | 2011086853 | 4/2011 |
| JP | 2011-151393 | 8/2011 |
| JP | 2011228513 | 11/2011 |
| JP | 4839687 B | 12/2011 |
| JP | 2012186414 | 9/2012 |
| JP | 2012-244170 | 12/2012 |
| JP | 2013009002 | 1/2013 |
| JP | 2013-042079 | 2/2013 |
| JP | 2013120829 | 6/2013 |
| JP | 2013530537 | 7/2013 |
| JP | 5315513 | 10/2013 |
| JP | 2014068010 | 4/2014 |
| JP | 2014-103240 | 6/2014 |
| JP | 201541763 | 3/2015 |
| JP | 2015-130386 | 7/2015 |
| JP | 5757512 | 7/2015 |
| JP | 2015195388 | 11/2015 |
| JP | 5983125 B | 8/2016 |
| JP | 2017-034036 | 2/2017 |
| JP | 2017-117982 | 6/2017 |
| KR | 20090001903 | 1/2009 |
| KR | 20110131212 | 12/2011 |
| KR | 10-2012-0082898 | 7/2012 |
| KR | 20120117892 | 10/2012 |
| KR | 20130055015 | 5/2013 |
| KR | 20140133607 | 11/2014 |
| KR | 10-2015-0082264 | 7/2015 |
| TW | 201535782 | 9/2015 |
| WO | 2008041161 | 4/2008 |
| WO | 2009148138 | 12/2009 |
| WO | 2011/026033 | 3/2011 |
| WO | 2011049018 | 4/2011 |
| WO | 2011104969 | 9/2011 |
| WO | 2011159993 | 12/2011 |
| WO | 2012067080 | 5/2012 |
| WO | 2012127660 | 9/2012 |
| WO | 2013008556 | 1/2013 |
| WO | 2013132993 | 9/2013 |
| WO | 2013/152231 | 10/2013 |
| WO | 2014154047 | 10/2014 |
| WO | 2015008776 | 1/2015 |
| WO | 2013137176 | 8/2015 |
| WO | 2015133000 | 9/2015 |
| WO | 2016113935 | 7/2016 |
| WO | 2017/017891 | 2/2017 |
| WO | 2017/038961 | 3/2017 |
| WO | 2017/168811 | 10/2017 |

OTHER PUBLICATIONS

International Search Report issued in corresponding International Application No. PCT/JP2016/075756 (3 pages).
Supplementary European Search Report issued in European Application No. 16861100.2 dated Jul. 17, 2017 (12 pages).
CREST Research Area of the Strategic Basic Research Programs: "Light/Photon Science and Technology toward Creation of New Function," Report of Termination of Research for Research Subject: "Research of 230-350mm Band in AlGaN-based Deep Ultraviolet High-Efficiency Light Emitting Device," Research period: Oct. 2007 to Mar. 2013, 53 pages total (Partial EnglishTranslation provided).
Additional Translation to the Non Patent Literature: CREST: "Light/Photon Science and Technology toward Creation of New Function,", Report of Termination of Research for Research Subject: "Research of 230-350mm Band in AlGaN-based Deep Ultraviolet High-Efficiency Light Emitting Device," Research period: Oct. 2007 to Mar. 2013, 2 pages.
Ichikawa et al.: "High Output Power Deep Ultraviolet LEDs"; The Japan Society of Applied Physics, English translation provided, 3 pages.
Taiwan Office Action issued in Taiwan Application No. 105128384 dated Apr. 11, 2018 (5 pages).
European Search Report issued in European Application No. 15877887.8 dated Apr. 19, 2018 (4 pages).
Korean Office Action, issued in the Korean patent application No. 10-2018-7005503, dated Jan. 28, 2019, 16 pages including machine translation.
Office Action issued in European Patent Application No. 15877887. 8, dated Mar. 8, 2019, 13 pages.
Office Action issued in Japanese Patent Application No. 2017-508579, dated May 9, 2017, 4 pages.
Office Action issued in Chinese Patent Application No. 201680051208. 3, dated Nov. 4, 2019, 18 pages.
International Search Report issued in corresponding International Application No. PCT/JP2019/002392 (6 pages).
International Search Report issued in corresponding International Application No. PCT/JP2019/033110 (5 pages).
International Search Report issued in corresponding International Application No. PCT/JP2019/050774 (5 pages).
International search report and Written Opinion for the International application No. PCT/JP2015/071453, dated Sep. 29, 2015 (9 pages).
Hirayama et al.: "Recent progress and future prospects of ALgaN-based high-efficiency deep-ultraviolet light-emitting diodes"; Japanese Journal of Applied Physics, vol. 53, 2014, pp. 1-10.
Shinji Matsui: "Current Nano-imprint processing technologies"; Monthly Display, 2005, vol. 11, No. 5, pp. 82-89 (partial English translation).
Nakamatsu et al.: "Bilayer Resist Method for Room-Temperature Nanoimprint Lithography"; Japanese Journal of Applied Physics, 2004, vol. 43, No. 6B, pp. 4050-4053.
Korean Office Action for Korean application No. 2015-7005308, dated Oct. 21, 2015 (6 pages).
Extended European Search Report issued in the European Patent Application No. 14841324.8 dated Oct. 23, 2015 (6 pages).
International search report for International application No. PCT/JP2014/068864 dated Sep. 9, 2014 (4 pages).
Office Action dated Jun. 1, 2015 in Korean Application No. 2015-7005308 (6 pages).
T. Nakashima et al.: "Improvment of the light extraction efficiency in 350-nm-emission UV-LED," Proceedings of the [[6]]60th Lecture Presentation in Spring of the Japan Society of Applied Physics, 2013, 29p-G21-10, 2 pages total (English translation provided).
Chinese Office Action dated Dec. 19, 2016 for Chinese Patent Application Serial No. 201480002228.2, 3 pages.
Delbeke et al.: "Rigorous electromagnetic analysis of dipole in periodically corrugated layers: the grating-assisted resonant-cavity light-emitting diode." J. Opt. Soc. Am. A, 2002, vol. 64, No. 19, No. 5, pp. 871-880.
Gourley et al.: "Optical properties of two-dimensional photonic lattices fabricated as honeycomb nanostructures in compound semiconductors," Applied Physics Letters, 1994, vol. 64, No. 6, pp. 687-689.
Xie et al.: "Optimization design and fabrication of photonic crystal waveguides based on SOI using 248nm deep UV lithography," Proceedings of SPIE, 2004, vol. 5280, pp. 798-804.
Japan Society for the Promotion of Science: "Wide-gap semiconductor/ electronic device, No. 162 committee"; The 74th Workshop Document: Development of DUVLED by UV Craftory, Co., Ltd., dated Apr. 22, 2011.
Japanese Office Action for Japanese Application No. 2015-559356, dated Apr. 26, 2016. (5 pages).
International Search Report issued in Japanese Application No. PCT/JP2015/084461 dated Jan. 12, 2016 (10 pages).

(56) References Cited

OTHER PUBLICATIONS

Choi et al.: "Design of an LED Chip Structure with an Integrated Two-dimensional Photonic Crystal to Enhance the light-extraction Efficiency"; Journal of Korean Physical Society, 2014, vol. 94, No. 10, pp. 1425-1429.
Lai et al.: "Directional light extraction enhancement from GaN-based film-transferred photonic crystal light-emitting diodes"; Applied Physics Letters, 2009, vol. 64, pp. 123106-1 to 123106-3 (4 pages).
Orita et al.: "High-Extraction-Efficiency blue Light-Emitting Diode using Extended-Pitch Photonic Crystal"; 2004, vol. 43, No. 8B, pp. 5809-5813.
Ding et al.: "Improving the Vertical light-Extraction Efficiency of GaN-Based Thin-Film Flip-Chip LED's With p-slide Deep-Hole Photonic Crystals"; Journal of Display Technology, 2014, vol. 10, No. 11, pp. 909-916.
Kashima et al.: "The micro machining process technology of nano imprint and dry etcing to improve the efficiency of notride LED"; IEICE Technical Report, 2014, vol. 114, No. 336, pp. 27-32.
Office Action issued in Japanese Patent Application No. 2019-567174, dated Oct. 5, 2021, 4 pages.

\* cited by examiner

Fig. 1A (a-1)

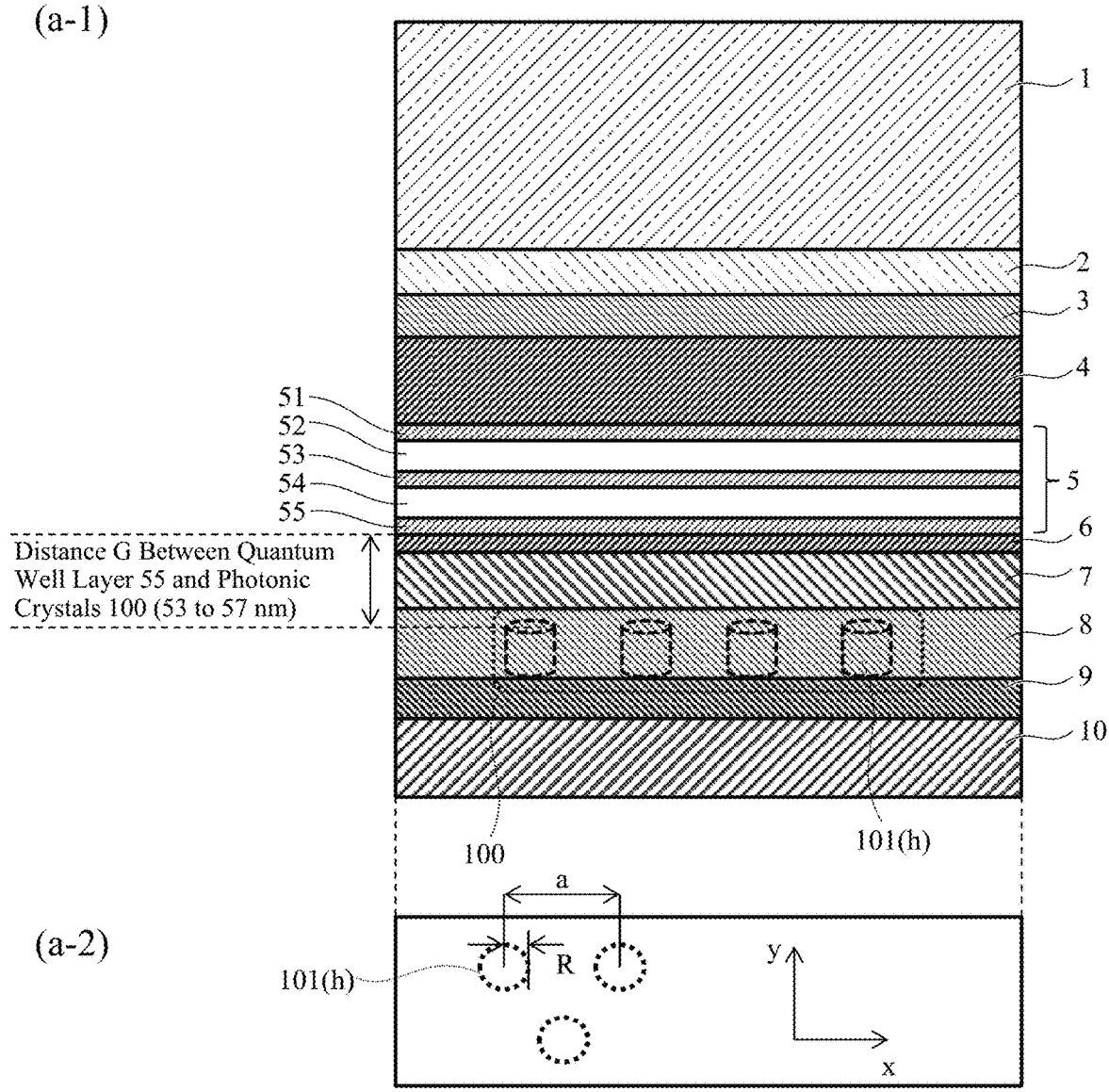

Distance G Between Quantum
Well Layer 55 and Photonic
Crystals 100 (53 to 57 nm)

(a-2)

1. Sapphire Substrate (Thickness: 1.3um, n=1.83)
2. AlN Template (Thickness: 200nm, n=2.3)
3. u-AlGaN Layer (Thickness: 100nm, n=2.415)
4. n-AlGaN Contact Layer (Thickness: 200nm, n=2.623)
5. Multi-Quantum Well Layer
51. Well Layer (Thickness: 2nm, n=2.773),
52. Barrier Layer (Thickness: 7nm, n=2.623),
53. Well Layer (Thickness: 2nm, n=2.773),
54. Barrier Layer (Thickness: 7nm, n=2.623),
55. Well Layer (Thickness: 2nm, n=2.773), 6. i-Guide Layer (Thickness: 1nm, n=2.3)
7. p-Block Layer (Thickness: 52nm~56nm, n=2.594)
8. p-GaN Contact Layer (Thickness: 138nm, n=2.631, k=0.432)
9. Metal Layer(Ni) (Thickness: 30nm, n=1.667, k=2.072)
10. Reflecting Electrode Layer(Au) (Thickness: 200nm, n=1.644, k=1.850)
100. Two-Dimensional Reflecting Photonic Crystal Periodic Structure
101(h). Voids (i.e., Columnar Structures or Holes)
Refractive Index: n, Extinction Coefficient: k

Fig. 1B

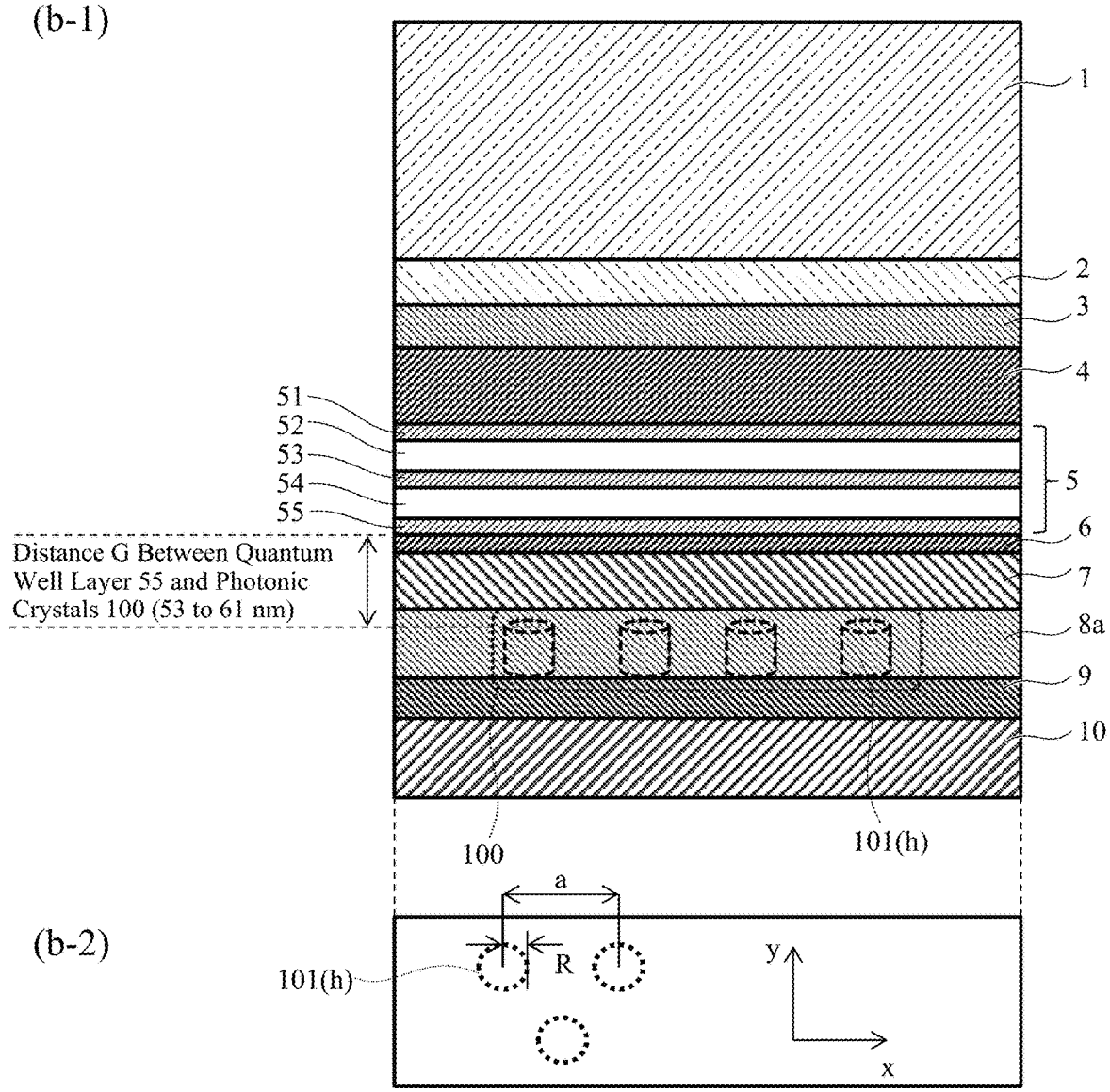

1. Sapphire Substrate (Thickness: 1.3μm, n=1.83)
2. AlN Template (Thickness: 200nm, n=2.3)
3. u-AlGaN Layer (Thickness: 100nm, n=2.415)
4. n-AlGaN Contact Layer (Thickness: 200nm, n=2.623)
5. Multi-Quantum Well Layer
51. Well Layer (Thickness: 2nm, n=2.773),
52. Barrier Layer (Thickness: 7nm, n=2.623),
53. Well Layer (Thickness: 2nm, n=2.773),
54. Barrier Layer (Thickness: 7nm, n=2.623),
55. Well Layer (Thickness: 2nm, n=2.773),
6. i-Guide Layer (Thickness: 1nm, n=2.3)
7. p-Block Layer (Thickness: 44nm~48nm, n=2.594)
8a. p-AlGaN Contact Layer (Thickness: 70nm, n=2.723)
9. Metal Layer(Ni) (Thickness: 30nm, n=1.667, k=2.072)
10. Reflecting Electrode Layer(Au) (Thickness: 200nm, n=1.644, k=1.850)
100. Two-Dimensional Reflecting Photonic Crystal Periodic Structure
101(h). Voids (i.e., Columnar Structures or Holes)
Refractive Index: n, Extinction Coefficient: k

Fig. 1C

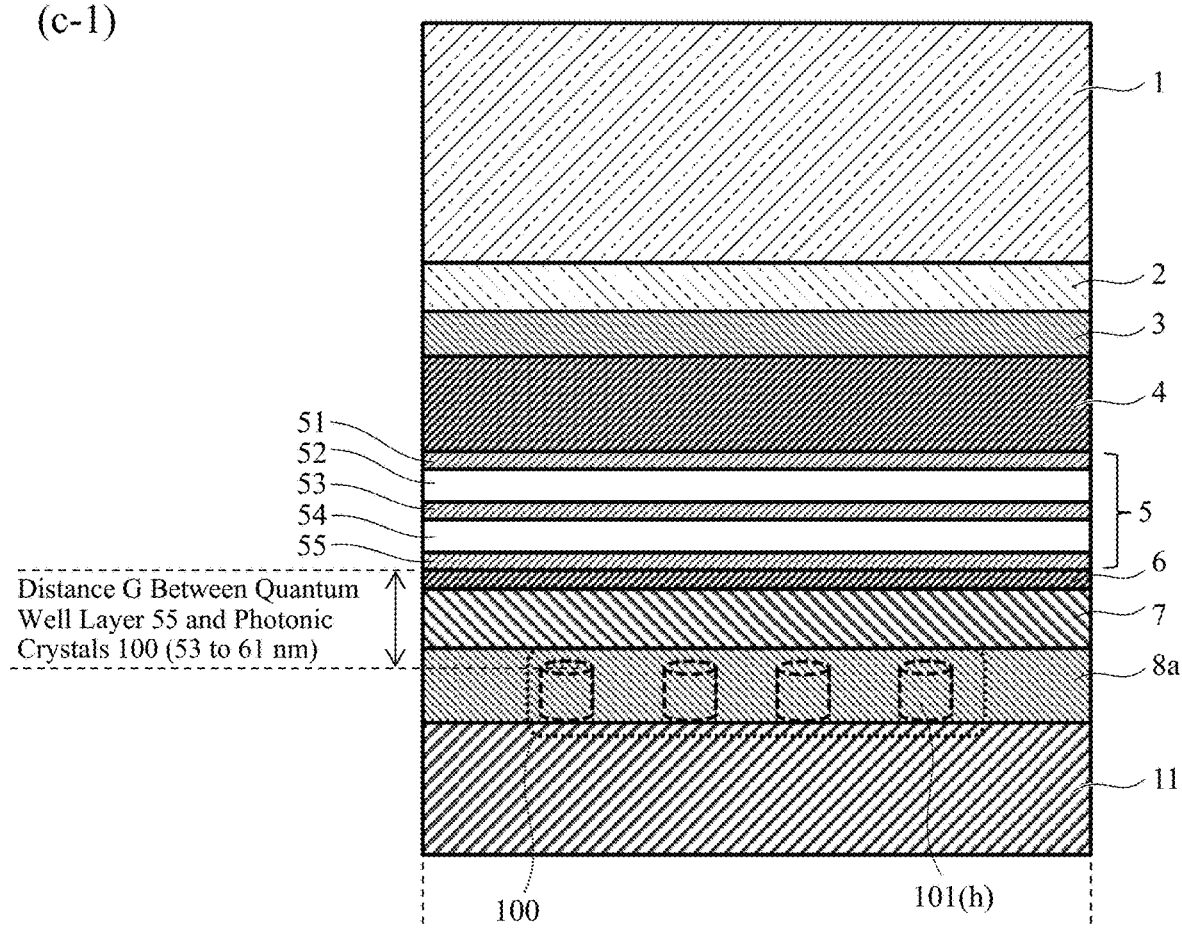

(c-1)

Distance G Between Quantum Well Layer 55 and Photonic Crystals 100 (53 to 61 nm)

(c-2)

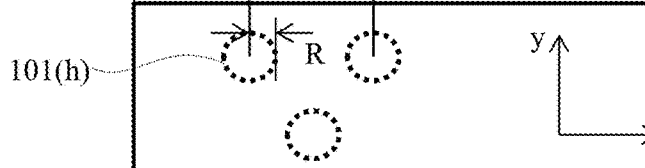

1. Sapphire Substrate (Thickness: 1.3μm, n=1.83)
2. AlN Template (Thickness: 200nm, n=2.3)
3. u-AlGaN Layer (Thickness: 100nm, n=2.415)
4. n-AlGaN Contact Layer (Thickness: 200nm, n=2.623)
5. Multi-Quantum Well Layer
51. Well Layer (Thickness: 2nm, n=2.773),
52. Barrier Layer (Thickness: 7nm, n=2.623),
53. Well Layer (Thickness: 2nm, n=2.773),
54. Barrier Layer (Thickness: 7nm, n=2.623),
55. Well Layer (Thickness: 2nm, n=2.773),
6. i-Guide Layer (Thickness: 1nm, n=2.3)
7. p-Block Layer (Thickness: 44nm~48nm, n=2.594)
8a. p-AlGaN Contact Layer (Thickness: 70nm, n=2.723)
11. Reflecting Electrode Layer(Rh) (Thickness: 230nm, n=0.791, k=2.679)
100. Two-Dimensional Reflecting Photonic Crystal Periodic Structure
101(h). Voids (i.e., Columnar Structures or Holes)
Refractive Index: n, Extinction Coefficient: k

Fig. 3A
(a-1)
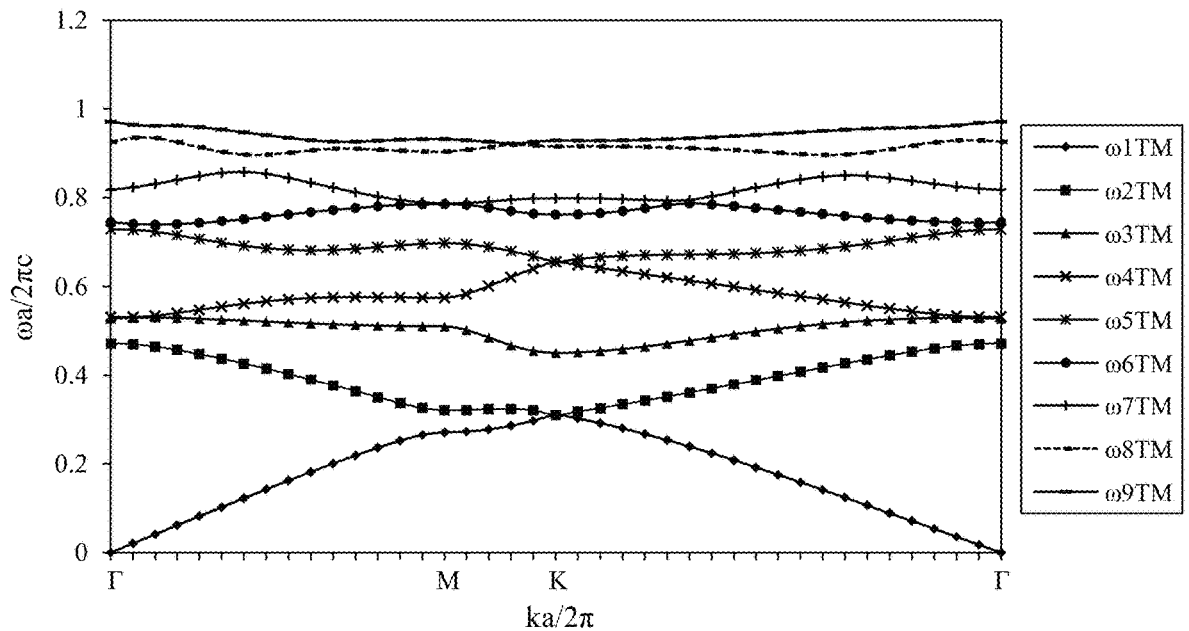
(a-2)
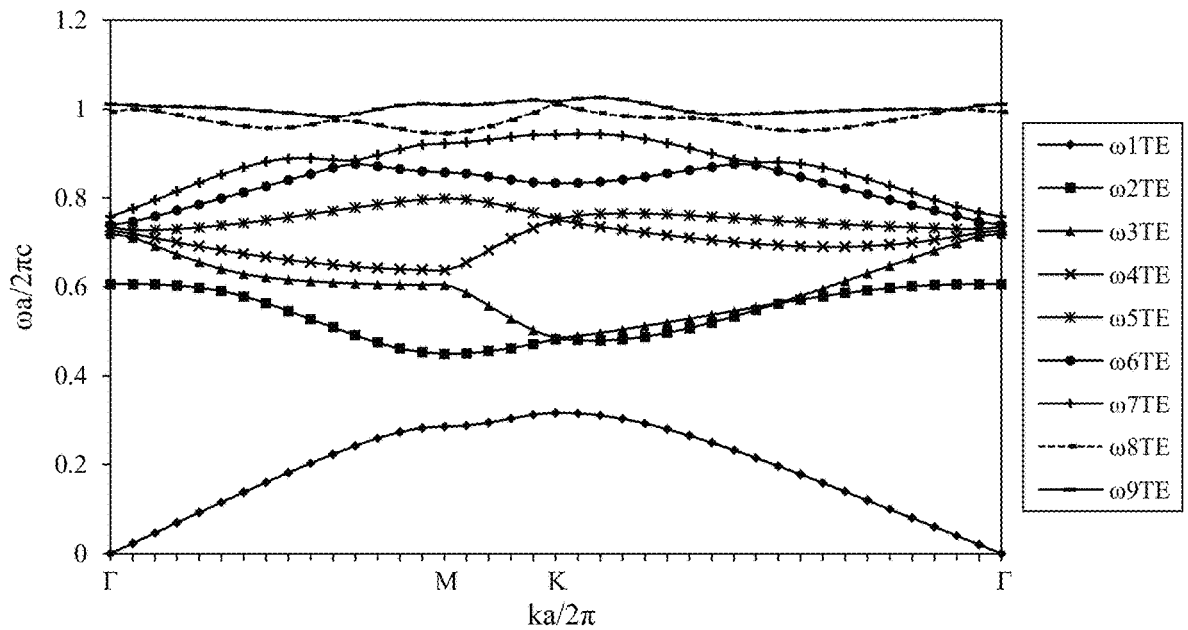

Fig. 3B
(b-1)
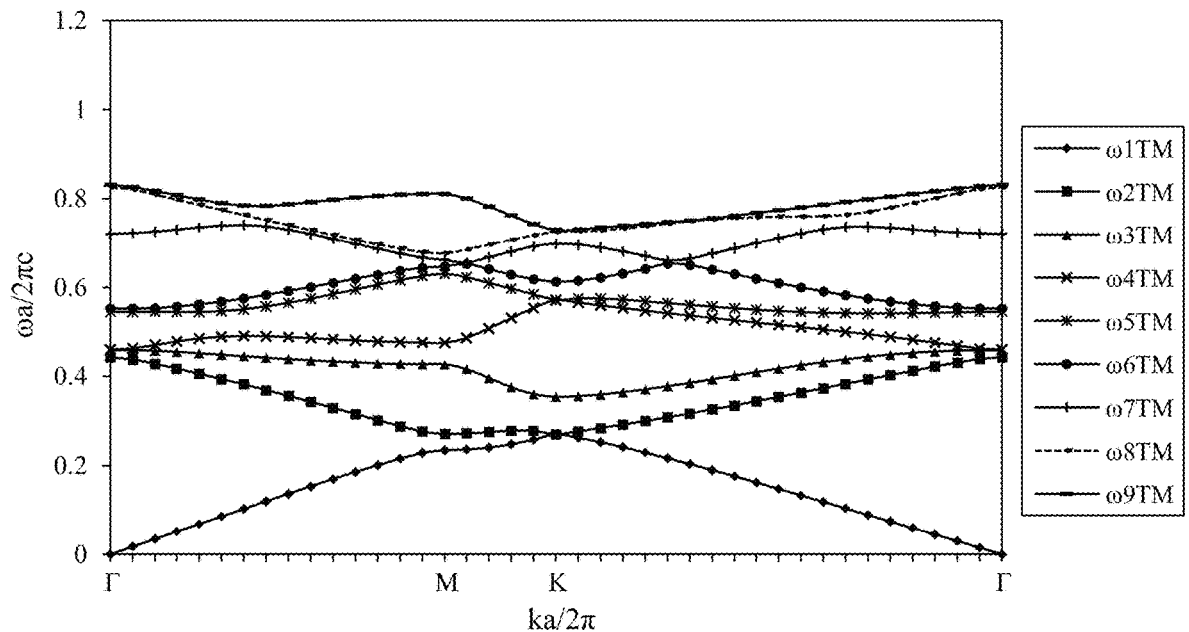
(b-2)
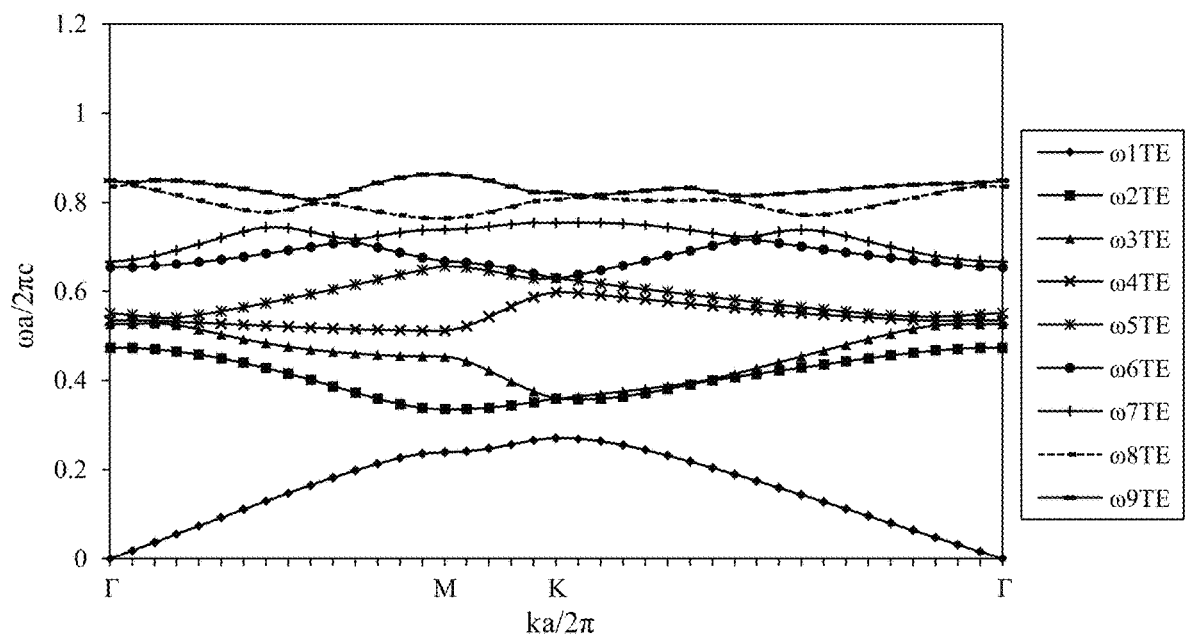

Fig. 3C
(c-1)
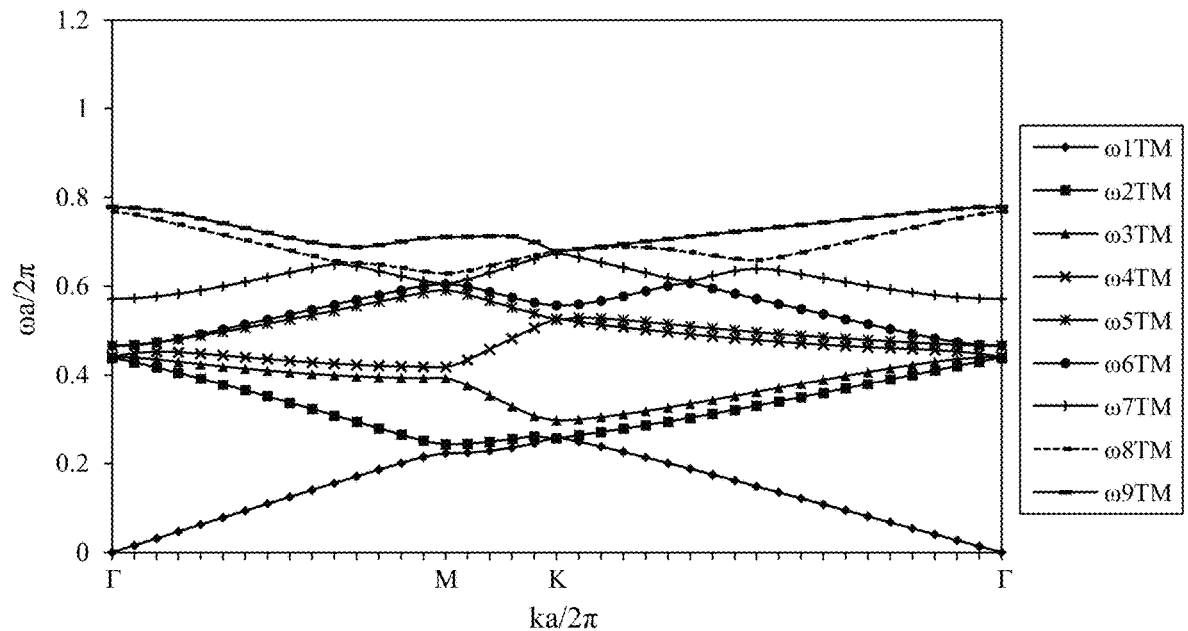
(c-2)
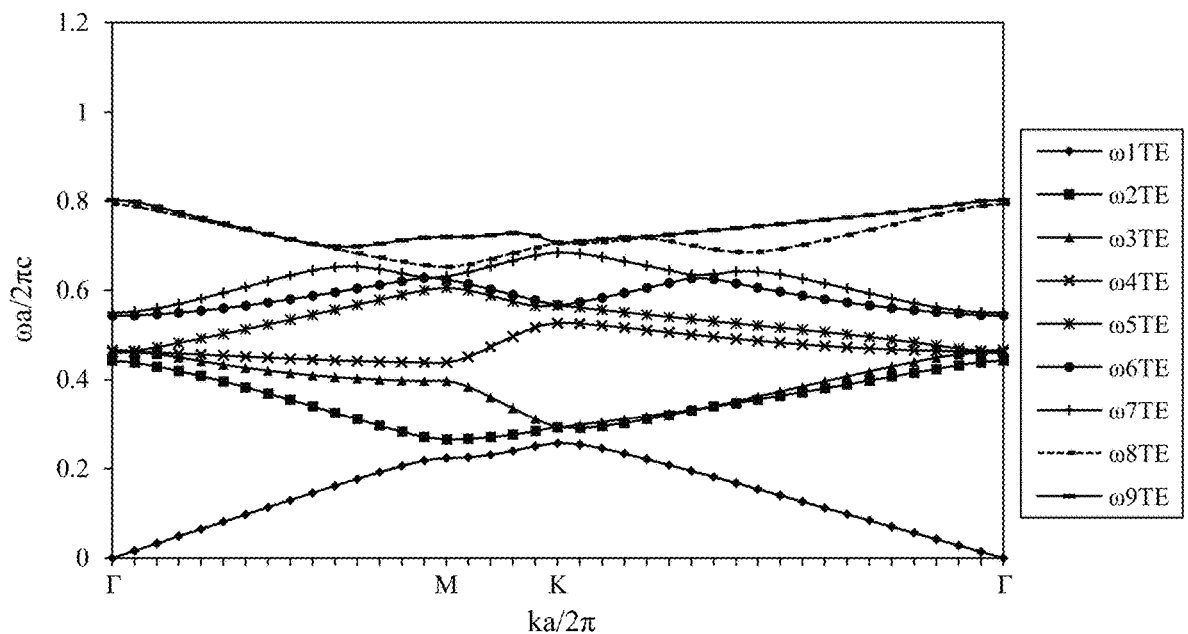

Fig. 12
(a)
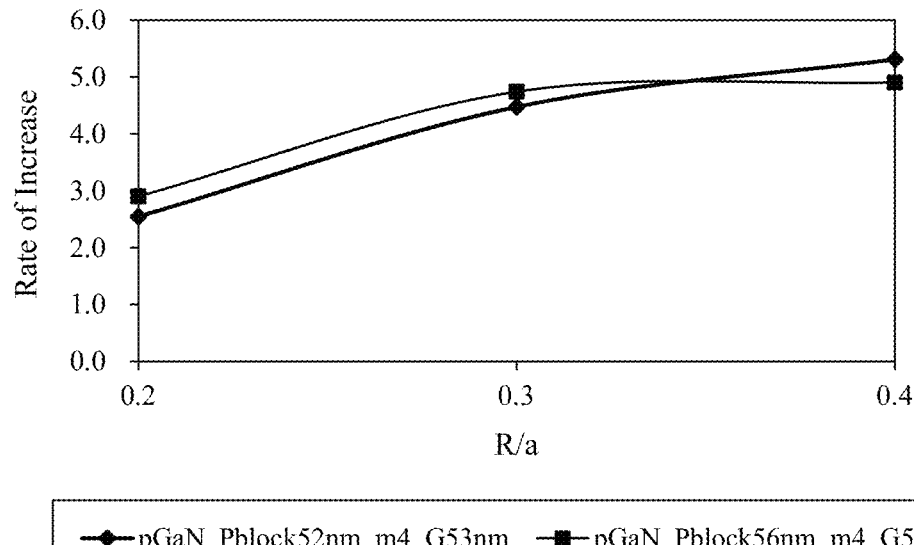
(b)
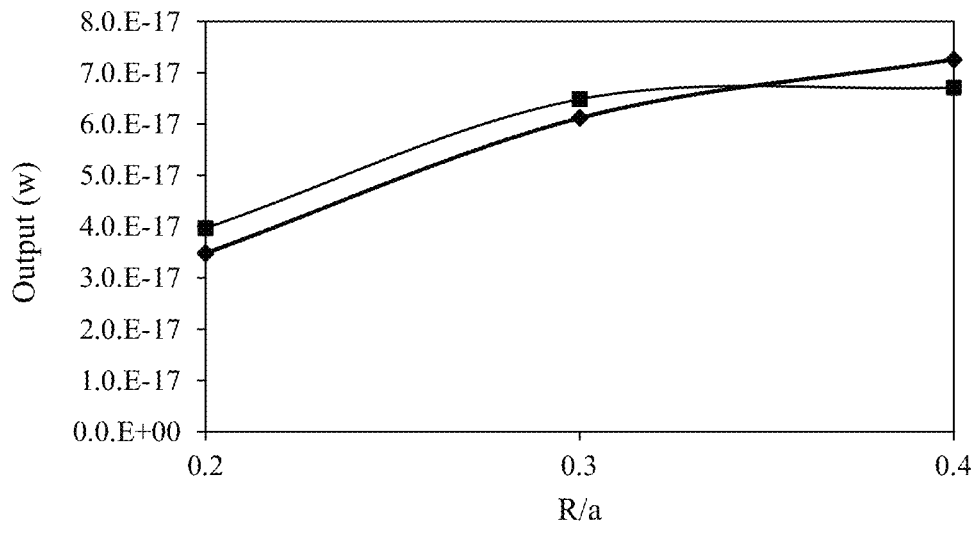

Fig. 13
(a)
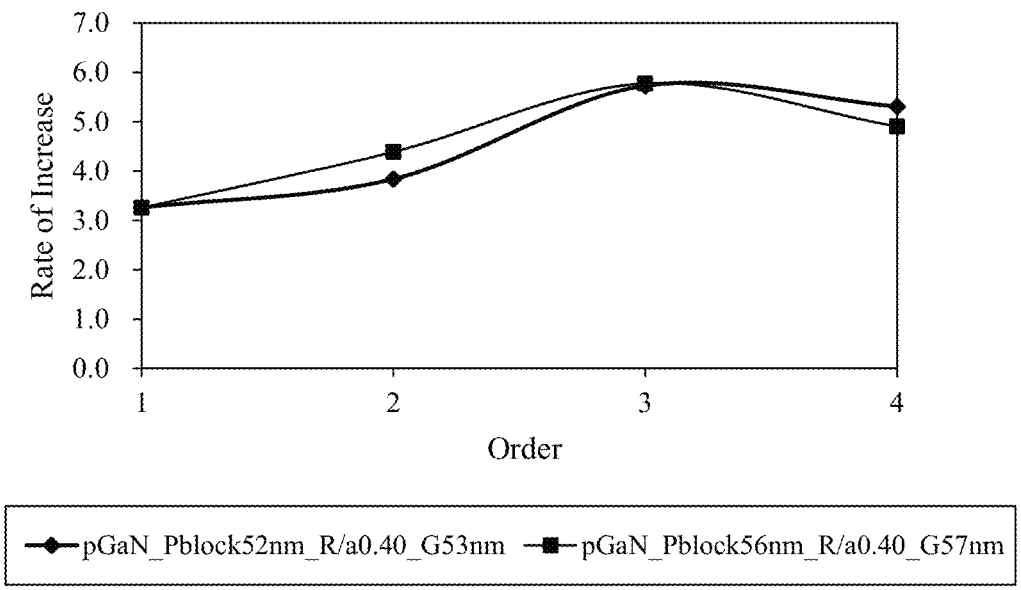
(b)
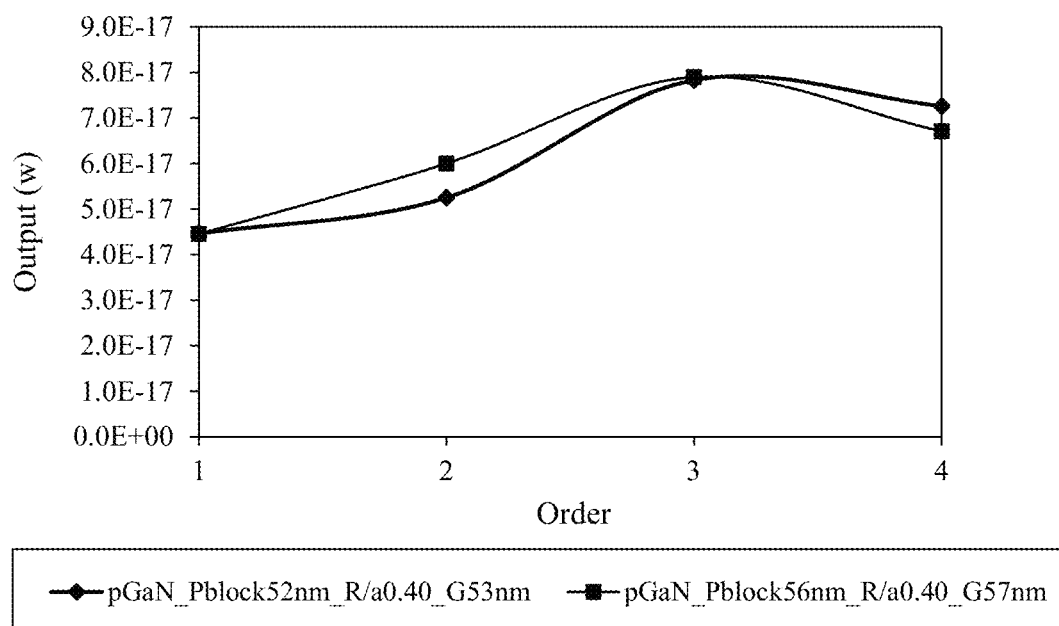

Fig. 14
(a)
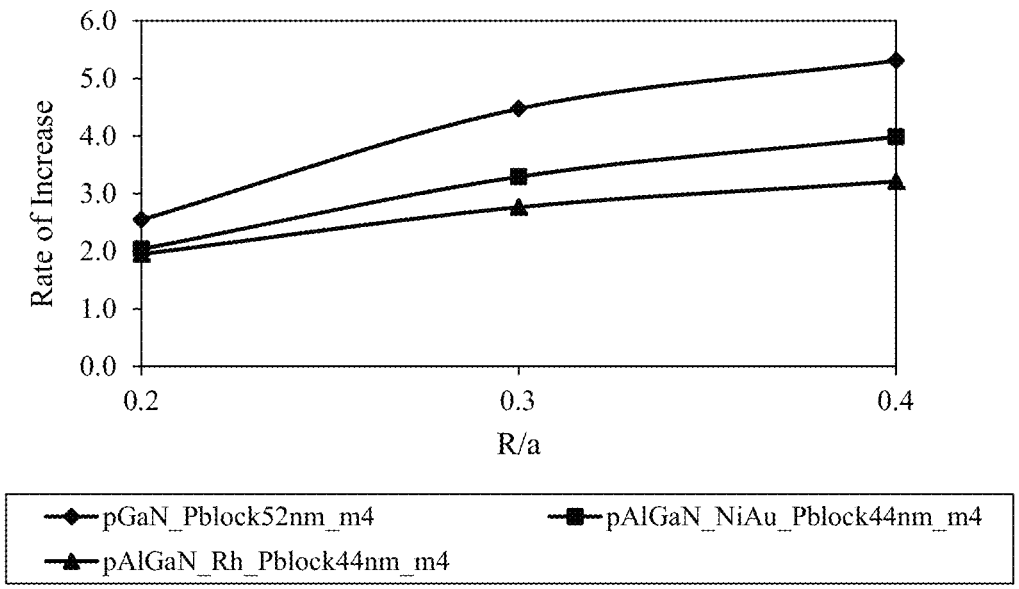
(b)
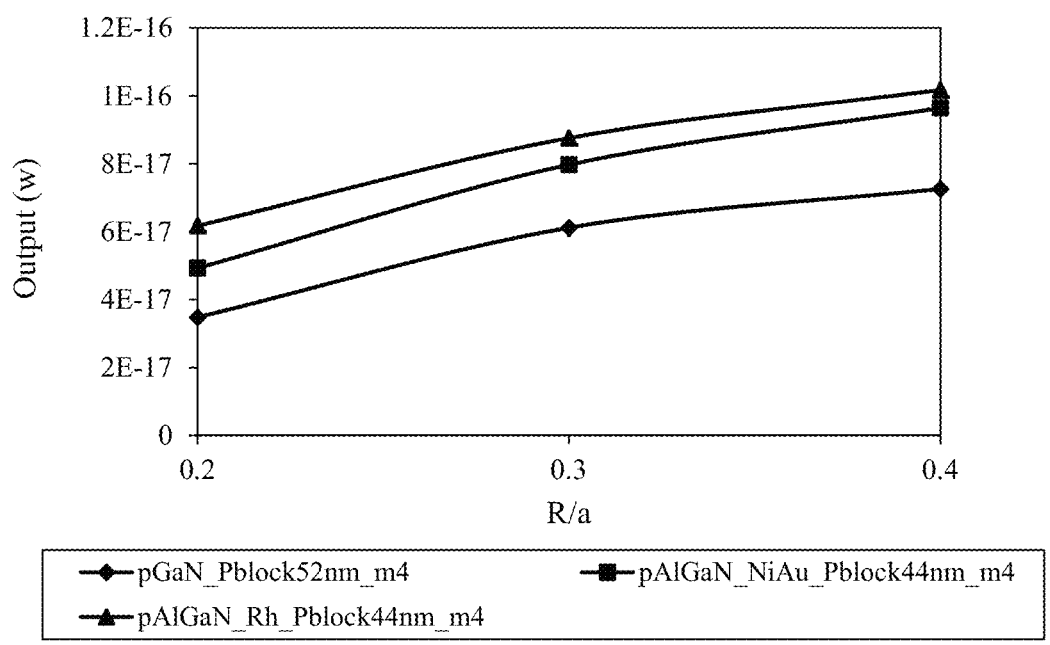

Fig. 15
(a)
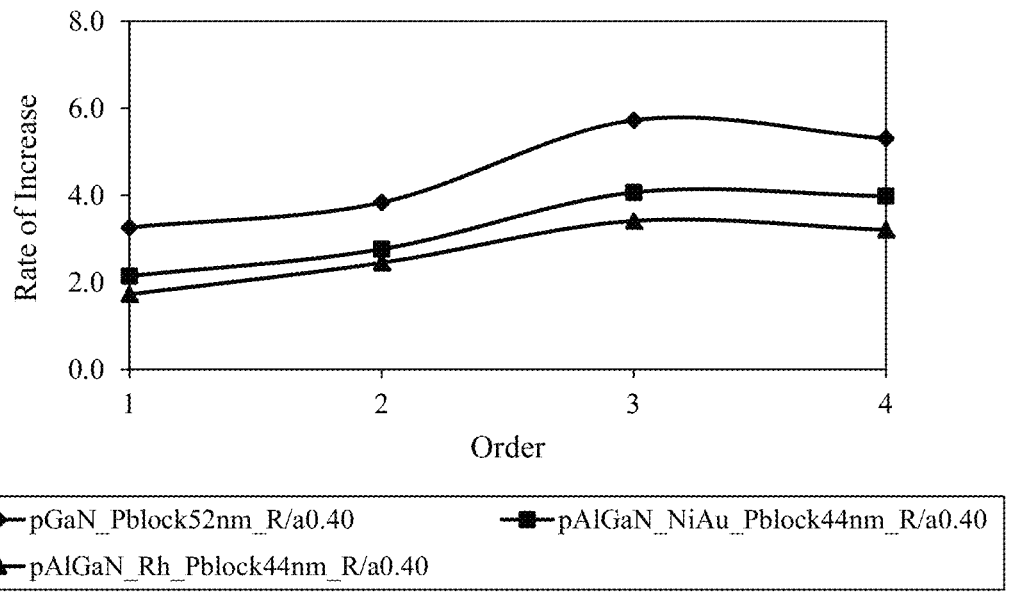
(b)
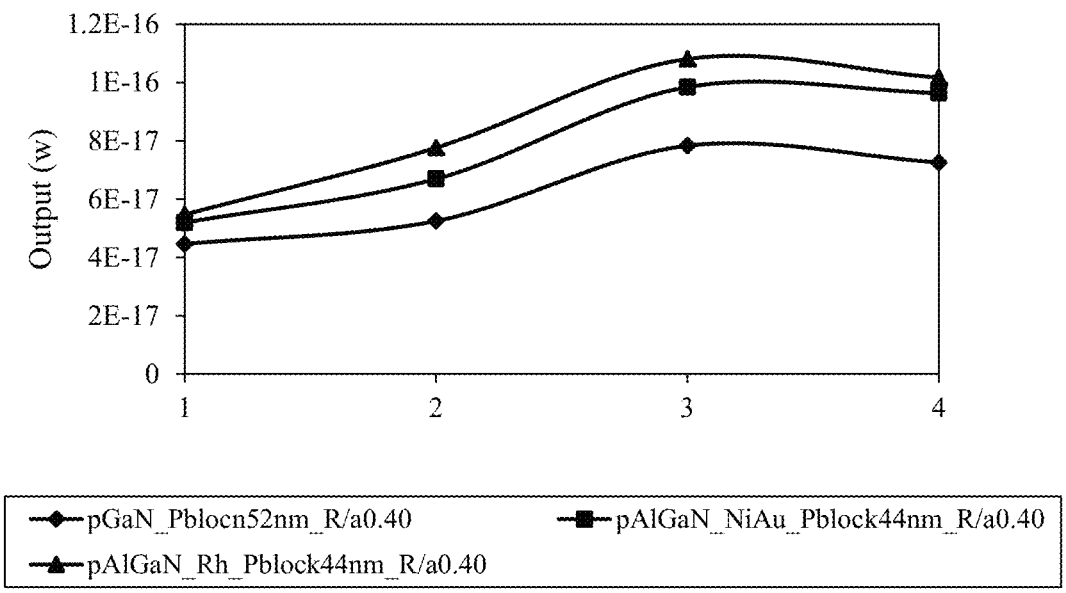

Fig. 16

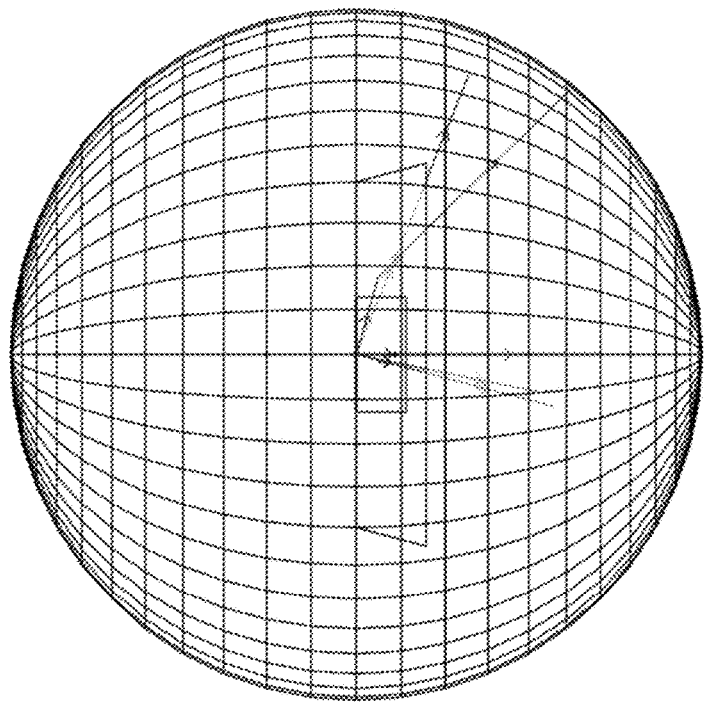

Model of LEE Analyzed With Ray-Tracing Method [p-GaN Contact]

[Analysis Conditions]
Thickness of Sapphire Substrate: 430um
Thickness of AlN Buffer Layer: 500nm
Thickness of AlGaN Layer: 2um
Thickness of p-GaN Contact Layer: 200nm
Wavelength: 275nm
Reflectivity of Ni/Au Electrodes: 30%
Element Size: 1mm☐
Sidewall Angle of Package: 75 Degrees
Reflectivity of Al Reflecting Plate: 92%

[Result] LEE:4.8%

Fig. 18
(a)
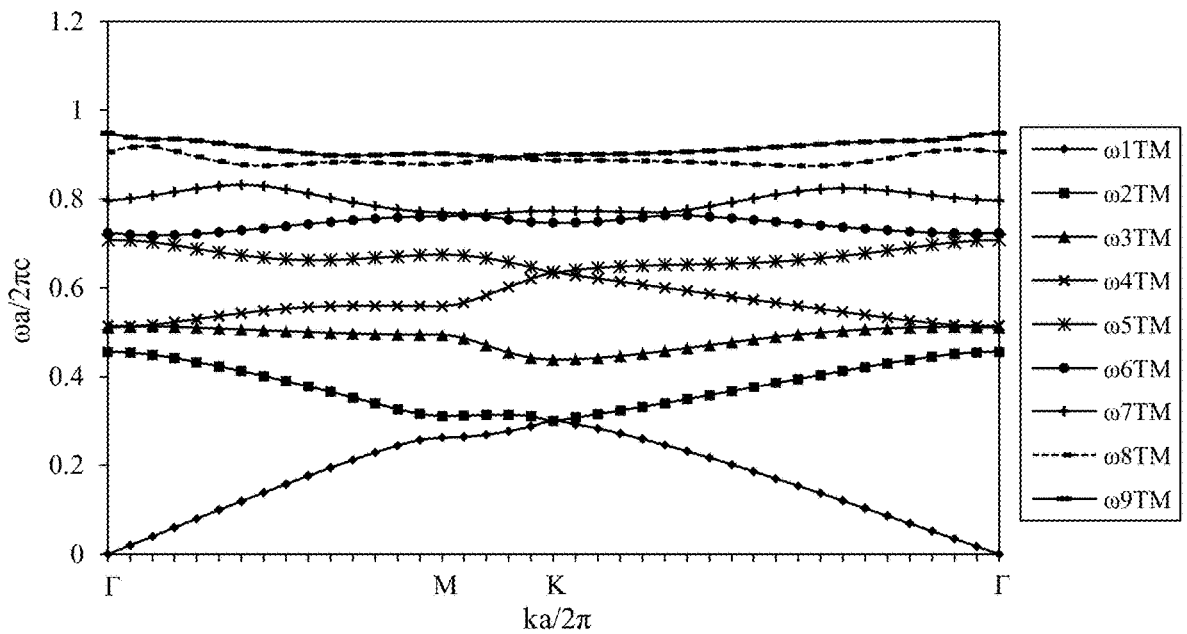
(b)
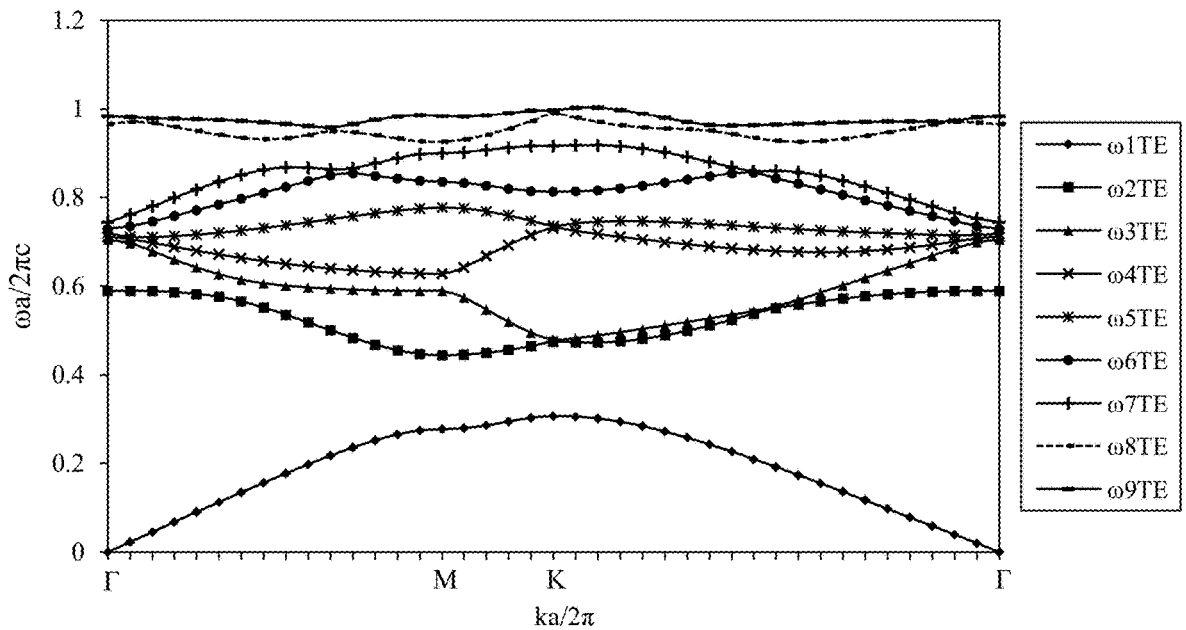

Model of the LEE Analyzed With Ray-Tracing Method
[p-AlGaN Contact/Rh Electrode]

[Analysis Conditions]
Thickness of Sapphire Substrate: 430um
Thickness of AlN Buffer Layer: 500nm
Thickness of AlGaN Layer: 2um
Wavelength: 275nm
Reflectivity of Rh Electrode: 70%
Element Size: 1mm☐
Sidewall Angle of Package: 75 Degrees
Reflectivity of Al Reflecting Plate: 92%

[Result] LEE: 17.2%

200. Resin Mold
205. Multi-Quantum Well Layer
206. i-Guide Layer
207. p-Block Layer
208. p-GaN Contact Layer
209. Upper-Layer Resist
210. Lower-Layer Resist
211. Photonic Crystal Pattern (Holes)
212. Mask 200. Resin Mold
205. Multi-Quantum Well Layer
206. i-Guide Layer
207. p-Block Layer
208a. p-AlGaN Contact Layer
209. Upper-Layer Resist
210. Lower-Layer Resist
211. Photonic Crystal Pattern (Holes)
212. Mask

DEEP ULTRAVIOLET LED AND METHOD FOR PRODUCING THE SAME

TECHNICAL FIELD

The present invention relates to a technology of AlGaN-based deep ultraviolet LEDs.

BACKGROUND ART

Deep ultraviolet LEDs with light emission wavelengths of 200 to 355 nm are gathering attention as an alternative technology for mercury germicidal lamps in a wide field of applications, such as disinfection, purification of water or air, and medical treatment. However, the wall-plug efficiency (WPE) of LEDs is only 2% to 3%, which is significantly lower than that (20%) of mercury lamps. This is mainly because almost 100% of light emitted from a LED is absorbed by its p-GaN contact layer, which results in a light extraction efficiency (LEE) as low as 8% or less.

Patent Literature 1 discloses a deep ultraviolet LED in which a p-AlGaN layer is formed as thin as 100 nm or less and the position of a reflecting photonic crystal structure is made closer to a quantum well layer so that the LEE can be increased by about two to three times; specifically, a LEE of about 23% is obtained when a p-AlGaN contact layer is provided and a LEE of about 18% is obtained when a p-GaN contact layer is provided. However, provided that the internal quantum efficiency is 50% and the voltage efficiency (i.e., electron injection efficiency×theoretical voltage/forward voltage) is 80%, the WPE is estimated to be still 7% to 9%.

CITATION LIST

Patent Literature

Patent Literature 1: JP 6156898 B

SUMMARY OF INVENTION

Technical Problem

To increase the wall-plug efficiency (WPE), which is determined by the formula: "(internal quantum efficiency (IQE)×electron injection efficiency (EIE)×light extraction efficiency (LEE))×((theoretical voltage (Vt)/forward voltage (Vf))," to more than that (20%) of mercury lamps, it is required to suppress the forward voltage (Vf) as much as possible and also increase the LEE to more than the value indicated in Patent Literature 1.

The present invention provides a novel technique for further improving the light extraction efficiency of deep ultraviolet LEDs.

Solution to Problem

According to a first aspect of the present invention, there is provided a deep ultraviolet LED with a design wavelength λ, including a reflecting electrode layer (Au), a metal layer (Ni), a p-GaN contact layer, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate, in which the thickness of the p-block layer is 52 to 56 nm, a two-dimensional reflecting photonic crystal periodic structure having a plurality of voids is provided in a region from the interface between the metal layer and the p-GaN contact layer to a position not beyond the interface between the p-GaN contact layer and the p-block layer in the thickness direction of the p-GaN contact layer, the distance from an end face of each of the voids in the direction of the sapphire substrate to the interface between the multi-quantum well layer and the i-guide layer satisfies $\lambda/2n_{1Deff}$ (where $\lambda$ is the design wavelength and $n_{1Deff}$ is the effective average refractive index of each film of the stacked structure from the end face of each void to the i-guide layer) in the perpendicular direction, the distance being in the range of 53 to 57 nm, the two-dimensional reflecting photonic crystal periodic structure has a photonic band gap that opens for TE polarized components, and provided that the period a of the two-dimensional reflecting photonic crystal periodic structure satisfies a Bragg condition with respect to light with the design wavelength $\lambda$, the order m of a formula of the Bragg condition: $m\lambda/n_{2Deff}=2a$ (where m is the order, $\lambda$ is the design wavelength, $n_{2Deff}$ is the effective refractive index of two-dimensional photonic crystals, and a is the period of the two-dimensional photonic crystals) satisfies $2 \le m \le 4$, and the radius of each void is R, R/a satisfies $0.30 \le R/a \le 0.40$.

Regarding the method for measuring the parameters of the deep ultraviolet LED, the entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

According to a second aspect of the present invention, there is provided a deep ultraviolet LED with a design wavelength λ, including a reflecting electrode layer (Au), a metal layer (Ni), a p-AlGaN contact layer transparent to light with the wavelength $\lambda$, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate, in which the thickness of the p-block layer is 44 to 48 nm, a two-dimensional reflecting photonic crystal periodic structure having a plurality of voids is provided in a region from the interface between the metal layer and the p-AlGaN contact layer to a position not beyond the interface between the p-AlGaN contact layer and the p-block layer in the thickness direction of the p-AlGaN contact layer, the distance from an end face of each of the voids in the direction of the sapphire substrate to the interface between the multi-quantum well layer and the i-guide layer satisfies a condition of Bragg reflection: $\lambda/2n_{1Deff}$ (where $\lambda$ is the design wavelength and $n_{1Deff}$ is the effective average refractive index of each film of the stacked structure from the end face of each void to the i-guide layer) in the perpendicular direction, the distance being in the range of 53 to 61 nm, the two-dimensional reflecting photonic crystal periodic structure has a photonic band gap that opens for TE polarized components, and provided that the period a of the two-dimensional reflecting photonic crystal periodic structure satisfies the Bragg condition with respect to light with the design wavelength λ, the order m of a formula of the Bragg condition: $m\lambda/n_{2Deff}=2a$ (where m is the order, λ is the design wavelength, $n_{2Deff}$ is the effective refractive index of two-dimensional photonic crystals, and a is the period of the two-dimensional photonic crystals) satisfies 1≤m≤4, and the radius of each void is R, R/a satisfies 0.20≤R/a≤0.40.

Regarding the method for measuring the parameters of the deep ultraviolet LED, the entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

According to a third aspect of the present invention, there is provided a deep ultraviolet LED with a design wavelength λ, including a reflecting electrode layer (Rh), a p-AlGaN contact layer transparent to light with the wavelength λ, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate, in which the thickness of the p-block layer is 44 to 48 nm, a two-dimensional reflecting photonic crystal periodic structure having a plurality of voids is provided in a region from the interface between the reflecting electrode layer and the p-AlGaN contact layer to a position not beyond the interface between the p-AlGaN contact layer and the p-block layer in the thickness direction of the p-AlGaN contact layer, the distance from an end face of each of the voids in the direction of the sapphire substrate to the interface between the multi-quantum well layer and the i-guide layer satisfies a condition of Bragg reflection: $\lambda/2n_{1Deff}$ (where λ is the design wavelength and $n_{1Deff}$ is the effective average refractive index of each film of the stacked structure from the end face of each void to the i-guide layer) in the perpendicular direction, the distance being in the range of 53 to 61 nm, the two-dimensional reflecting photonic crystal periodic structure has a photonic band gap that opens for TE polarized components, and provided that the period a of the two-dimensional reflecting photonic crystal periodic structure satisfies a Bragg condition with respect to light with the design wavelength λ, the order m of a formula of the Bragg condition: $m\lambda/n_{2Deff}=2a$ (where m is the order, λ is the design wavelength, $n_{2Deff}$ is the effective refractive index of two-dimensional photonic crystals, and a is the period of the two-dimensional photonic crystals) satisfies 1≤m≤4, and the radius of each void is R, R/a satisfies 0.20≤R/a≤0.40. Regarding the method for measuring the parameters of the deep ultraviolet LED, the entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

According to a fourth aspect of the present invention, there is provided a method for producing a deep ultraviolet LED with a design wavelength λ, including forming a stacked structure on a sapphire substrate as a substrate for growth, the stacked structure including a reflecting electrode layer, a metal layer, a p-GaN contact layer, a p-block layer made of a p-AlGaN layer transparent to light with the wavelength λ, an i-guide layer made of an AlN layer, a multi-quantum well layer, an n-AlGaN contact layer, a u-AlGaN layer, and an AlN template that are arranged in this order from a side opposite to the sapphire substrate, the p-block layer being formed to a thickness of 52 to 56 nm through crystal growth; forming a two-dimensional reflecting photonic crystal periodic structure having a plurality of voids in a region from the interface between the metal layer and the p-GaN contact layer to a position not beyond the interface between the p-GaN contact layer and the p-block layer in the thickness direction of the p-GaN contact layer; forming each of the voids in a position such that the distance from an end face of the void in the direction of the sapphire substrate to the interface between the multi-quantum well layer and the i-guide layer is in the range of 53 to 57 nm; preparing a mold for forming the two-dimensional reflecting photonic crystal periodic structure; forming a resist layer on the p-GaN contact layer and imprinting a structure of the mold to the resist layer through nanoimprinting; partially etching the p-GaN contact layer using the resist layer as a mask, thereby forming a two-dimensional photonic crystal periodic structure; forming the metal layer and the reflecting electrode layer in this order on the two-dimensional reflecting photonic crystal structure through oblique deposition; and forming the reflecting electrode layer on the metal layer.

Regarding the method for measuring the parameters of the method for producing the deep ultraviolet LED, the entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

According to a fifth aspect of the present invention, there is provided a method for producing a deep ultraviolet LED with a design wavelength λ, including preparing a stacked structure formed on a sapphire substrate as a substrate for growth, the stacked structure including a reflecting electrode layer, a metal layer, a p-AlGaN contact layer transparent to light with the wavelength λ, a p-block layer made of a p-AlGaN layer, an i-guide layer made of an AlN layer, a multi-quantum well layer, an n-AlGaN contact layer, a u-AlGaN layer, and an AlN template that are arranged in this order from a side opposite to the sapphire substrate, the p-block layer being formed to a thickness of 44 to 48 nm through crystal growth; forming a two-dimensional reflecting photonic crystal periodic structure having a plurality of voids in a region from the interface between the metal layer and the p-AlGaN contact layer to a position not beyond the interface between the p-AlGaN contact layer and the p-block layer in the thickness direction of the p-AlGaN contact layer, each of the voids being formed in a position such that the distance from an end face of the void in the direction of the substrate for growth to the interface between the multi-quantum well layer and the i-guide layer is in the range of 53 to 61 nm; preparing a mold for forming the two-dimensional reflecting photonic crystal periodic structure; forming a resist layer on the p-AlGaN contact layer and imprinting a structure of the mold to the resist layer through nanoimprinting; partially etching the p-AlGaN contact layer using the resist layer as a mask, thereby forming a two-dimensional photonic crystal periodic structure; forming the metal layer using Ni on the two-dimensional reflecting photonic crystal structure through oblique deposition; and forming the reflecting electrode layer using Au on the metal layer.

Regarding the method for measuring the parameters of the method for producing the deep ultraviolet LED, the entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

According to a sixth aspect of the present invention, there is provided a method for producing a deep ultraviolet LED with a design wavelength λ, including forming a stacked structure on a sapphire substrate as a substrate for growth, the stacked structure including a reflecting electrode layer, a p-AlGaN contact layer transparent to light with the wavelength λ, a p-block layer made of a p-AlGaN layer, an i-guide layer made of an AlN layer, a multi-quantum well layer, an n-AlGaN contact layer, a u-AlGaN layer, and an AlN template that are arranged in this order from a side opposite to the sapphire substrate, the p-block layer being formed to a thickness of 44 to 48 nm through crystal growth; forming a two-dimensional reflecting photonic crystal periodic structure having a plurality of voids in a region from the interface between the reflecting electrode and the p-AlGaN contact layer to a position not beyond the interface between the p-AlGaN contact layer and the p-block layer in the thickness direction of the p-AlGaN contact layer; forming each of the voids in a position such that the distance from an end face of the void in the direction of the substrate for growth to the interface between the multi-quantum well layer and the i-guide layer is in the range of 53 to 61 nm; preparing a mold for forming the two-dimensional reflecting photonic crystal periodic structure; forming a resist layer on the p-AlGaN contact layer and imprinting a structure of the mold to the resist layer through nanoimprinting; partially etching the p-AlGaN contact layer using the resist layer as a mask, thereby forming a two-dimensional photonic crystal periodic structure; and forming the reflecting electrode layer using Rh on the two-dimensional reflecting photonic crystal structure through oblique deposition.

Regarding the method for measuring the parameters of the method for producing the deep ultraviolet LED, the entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

The present specification incorporates the disclosure of JP Patent Application No. 2018-012073 that serves as a basis for priority claim of the present application.

Advantageous Effects of Invention

The present invention can significantly improve the LEE of deep ultraviolet LEDs, and thus, the WPE thereof with the combined effect of Bragg reflection in the perpendicular direction and the two-dimensional reflecting photonic crystals.

BRIEF DESCRIPTION OF DRAWINGS

FIG. 1A(a-1) is a cross-sectional view of an exemplary structure of a deep ultraviolet LED in accordance with a first embodiment of the present invention, and FIG. 1A(a-2) is a plan view of a two-dimensional reflecting photonic crystal periodic structure.

FIG. 1B(b-1) is a cross-sectional view of an exemplary structure of a deep ultraviolet LED in accordance with a second embodiment of the present invention, and FIG. 1B(b-2) is a plan view of a two-dimensional reflecting photonic crystal periodic structure.

FIG. 1C(c-1) is a cross-sectional view of an exemplary structure of a deep ultraviolet LED in accordance with a third embodiment of the present invention, and FIG. 1C(c-2) is a plan view of a two-dimensional reflecting photonic crystal periodic structure.

FIG. 3A(a-1) is a graph of the photonic band structure for TM light of two-dimensional photonic crystals with R/a=0.40, analyzed with the plane wave expansion method, and similarly, FIG. 3A(a-2) is a graph of the photonic band structure for TE light.

FIG. 3B(b-1) is a graph of the photonic band structure for TM light of two-dimensional photonic crystals with R/a=0.30, analyzed with the plane wave expansion method, and similarly, FIG. 3B(b-2) is a graph of the photonic band structure for TE light.

FIG. 3C(c-1) is a graph of the photonic band structure for TM light of two-dimensional photonic crystals with R/a=0.20, analyzed with the plane wave expansion method, and similarly, FIG. 3C(c-2) is a graph of the photonic band structure for TE light.

FIG. 12(a) is a graph illustrating the dependence of each rate of increase in the LEE on R/a when the thickness of the p-block layer is 52 nm or 56 nm, and similarly, FIG. 12(b) is a graph illustrating the dependence of each output value on R/a for each case.

FIG. 13(a) is a graph illustrating the dependence of each rate of increase in the LEE on the order when the thickness of the p-block layer is 52 nm or 56 nm, and similarly, FIG. 13(b) is a graph illustrating the dependence of each output value on the order for each case.

FIG. 14(a) is a graph illustrating the dependence of the rate of increase in the LEE on R/a when a p-GaN contact layer/a p-block layer with a thickness of 52 nm are provided, when a p-AlGaN contact layer/a p-block layer with a thickness of 44 nm are provided, and when the order m=4, and similarly, FIG. 14(b) is a graph illustrating the dependence of the output value on R/a for each case.

FIG. 15(a) is a graph illustrating the dependence of the rate of increase in the LEE on the order when a p-GaN contact layer/a p-block layer with a thickness of 52 nm are provided, when a p-AlGaN contact layer/a p-block layer with a thickness of 44 nm are provided, and when R/a=0.40, and similarly, FIG. 15(b) is a graph illustrating the dependence of the output value on the order for each case.

FIG. 16 illustrates a model of the LEE, analyzed with the ray-tracing method, of a structure with a p-GaN contact layer.

FIG. 18(a) is a graph of the photonic band structure for TM light of two-dimensional photonic crystals with R/a=0.40, analyzed with the plane wave expansion method, and similarly, FIG. 18(b) is a graph of the photonic band structure for TE light.

DESCRIPTION OF EMBODIMENTS

Figure 2:
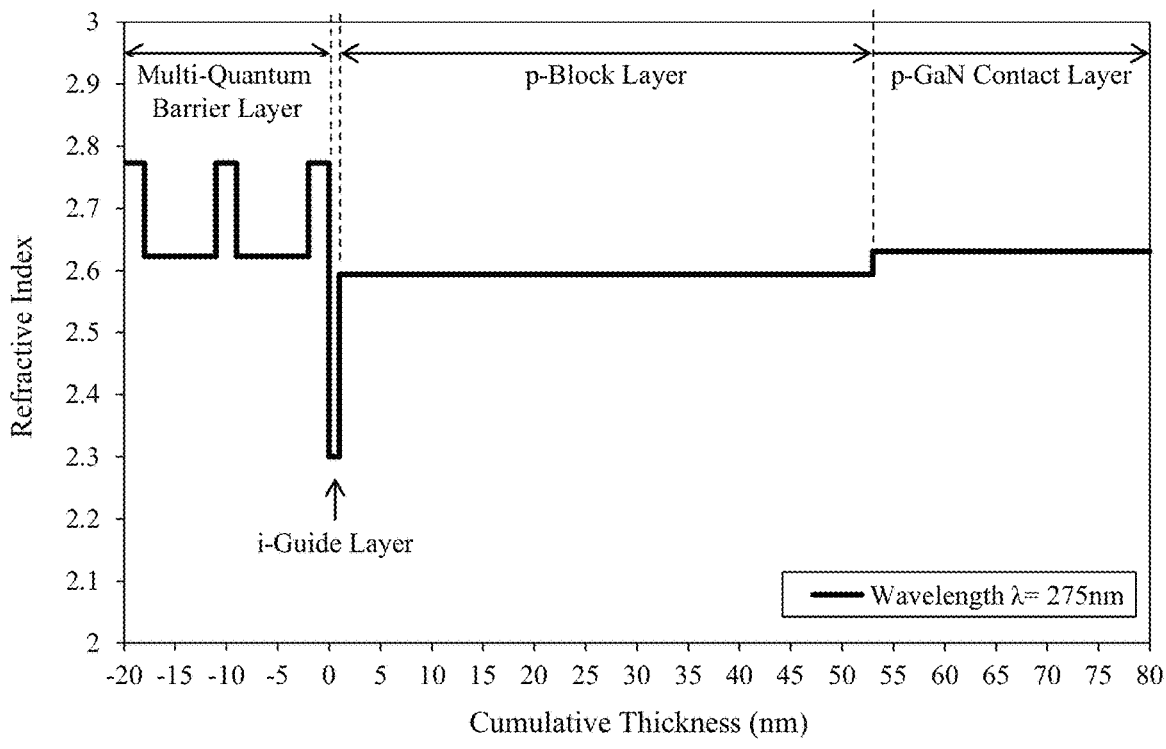
FIG. 2 illustrates the relationship between the cumulative thickness of the layers from the multi-quantum well layer and the difference in refractive index, regarding Bragg reflection in the perpendicular direction.

Hereinafter, deep ultraviolet LEDs in accordance with embodiments of the present invention will be described in detail with reference to the accompanying drawings.

First Embodiment

FIGS. 1A(a-1) and 1A(a-2) represent the structure (i.e., a cross-sectional view and a plan view, respectively) of an AlGaN-based deep ultraviolet LED with a design wavelength λ of 275 nm, as a deep ultraviolet LED in accordance with a first embodiment of the present invention.

Specifically, the deep ultraviolet LED includes, sequentially arranged from the top of the cross-sectional view of FIG. 1A(a-1), a sapphire substrate 1, an MN template 2, a u-AlGaN layer 3, an n-AlGaN contact layer 4, a multi-quantum well layer 5 (which includes three quantum well layers (51, 53, and 55) and barrier layers (52 and 54) sandwiched between the respective adjacent quantum well layers), an i-guide layer 6 (which is made of an MN layer), a p-block layer 7 (which is made of an AlGaN layer), a p-GaN contact layer 8, a metal layer 9 (which is made of a Ni layer), and a reflecting electrode layer 10 (which contains Au). The thickness of the p-block layer 7 is 52 to 56 nm. In addition, a two-dimensional reflecting photonic crystal periodic structure 100 is provided within the range of the thickness direction of the p-GaN contact layer 8 in a position not beyond the interface between the p-GaN contact layer 8 and the p-block layer 7. The photonic crystal periodic structure 100 has voids (i.e., columnar structures or holes) 101(h). Each void 101 is provided in a position such that the distance G between an end face of the void 101 in the direction of the sapphire substrate 1 and the interface between the multi-quantum well layer 5 and the i-guide layer 6 is 53 to 57 nm, and this distance G satisfies the condition of Bragg reflection in the perpendicular direction. The entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

FIG. 2 illustrates the relationship between the cumulative thickness of the stacked structure from the multi-quantum well layer 5 to the p-GaN contact layer 8, and the difference in refractive index, regarding Bragg reflection in the perpendicular direction.

The distance G (i.e., period) and the thickness of the p-block layer 7 at which the effect of Bragg reflection in the perpendicular direction is obtained are computed from the formula of the Bragg scattering condition ($m\lambda/n_{1Deff}=2a$, where m is the order, $n_{1Deff}$ is the effective refractive index of each film of the stacked structure from an end face of each void 101(h) to the i-guide layer 6, λ is the design wavelength, and a is the period).

The refractive indices (n) of the i-guide layer 6 and the p-block layer 7 at a design wavelength of 275 nm are $n_1=2.300$ and $n_2=2.594$, respectively. The effective refractive index $n_{1Deff}$ is determined by the formula: $n_{1Deff}=[n_2^2+(n_1^2-n_2^2)(d/a)^2]^{0.5}$. Provided that the thickness of the i-guide layer 6 is d, which is 1 nm, for example, the value of d/a equals 0.019. Therefore, $n_{1Deff}$ is 2.589. Provided that m=1 and these values are substituted into the formula of the Bragg scattering condition, the period a is derived as 53 nm. Herein, since the thickness of the i-guide layer 6 is 1 nm, the thickness of the p-block layer 7 is 52 nm. That is, herein, the thickness of the p-block layer 7 at which the reflection effect in the perpendicular direction is obtained is 52 nm.

Table 1 illustrates the simulation analysis results of the FDTD method regarding the effect of Bragg reflection in the perpendicular direction.

TABLE 1

FDTD Simulation Analysis Illustrating Bragg Reflection in Perpendicular Direction [p-GaN Contact]

| Center Wavelength (275 nm) | −G53 nm | | +G53 nm | |
| --- | --- | --- | --- | --- |
| | Output (w) | Output Ratio | Output (w) | Output Ratio |
| P-Block with Thickness of 40 nm | 4.8E−24 | — | 3.1E−24 | — |
| P-Block with Thickness of 52 nm | 8.5E−24 | 1.8 | 8.2E−24 | 2.6 |

[Note]
−G53 nm: A monitor was disposed at a position of 53 nm in the direction of the sapphire substrate from the interface between the quantum well layer 55 and the i-guide layer 6.
+G53 nm: A monitor was disposed at a position of 53 nm in the direction of the p-GaN contact layer from the interface between the quantum well layer 55 and the i-guide layer 6.
Output ratio: P-block thickness: 52 nm/40 nm Table 1 illustrates the output values of structures having a p-block layer with a thickness of 40 nm and that with a thickness of 52 nm, which have been measured by disposing monitors in the respective structures at a position of a distance of 53 nm in the direction of the sapphire substrate 1 from the interface between the quantum well layer 55 and the i-guide layer 6 (indicated by "−G53 nm" in Table 1) and a position of a distance of 53 nm in the direction of the p-GaN contact layer 8 from the interface between the quantum well layer 55 and the i-guide layer 6 (indicated by "+G53 nm" in Table 1), and the output ratio between them.

Table 1 can confirm that from the upper monitor ("−G53 nm") located across the quantum well layer, the output of the structure having the p-block layer with a thickness of 52 nm is found to be 1.8 times that of the structure having the p-block layer with a thickness of 40 nm, while from the lower monitor ("+G53 nm"), the output ratio is found to be 2.6. This is because the position of the lower monitor ("+G53 nm") at a distance of 53 nm in the structure having the p-block layer with a thickness of 40 nm is included in the absorption region of the p-GaN contact layer, which results in a significantly decreased output of the structure having the p-block layer with a thickness of 40 nm.

These results can confirm that determining the distance G and the thickness of the p-block layer at which the effect of Bragg reflection in the perpendicular direction is obtained as 53 nm and 52 nm, respectively, can prevent the position at the distance G from being included in the absorption region of the p-GaN contact layer and thus can obtain reflection effect.

Next, the two-dimensional reflecting photonic crystal periodic structure 100 has, as illustrated in the xy plan view of FIG. 1A(a-2), columnar structures (i.e., hole structures) formed in a triangular lattice pattern with a period of a along the x-direction and the y-direction such that voids 101(h) each having a circular cross-section with a radius R include the air with a refractive index smaller than that of the p-GaN contact layer 8. The voids 101(h) are structures formed so as not to reach the interface between the p-GaN contact layer 8 and the p-block layer 7 to prevent damage to the p-block layer 7 due to dry etching. Each void 101(h) is provided in a position such that the distance (G) from an end face of the void 101(h) in the direction of the sapphire substrate 1 to the quantum well layer 55 is in the range of 53 to 57 nm.

In the two-dimensional reflecting photonic crystal periodic structure 100, TE light and TM light of deep ultraviolet light with a wavelength λ emitted from the multi-quantum well layer 5 is radiated in all directions and propagate through the medium while being elliptically polarized.

The two-dimensional reflecting photonic crystal periodic structure 100 provided in the p-GaN contact layer 8 at a distance G of 53 to 57 nm from the quantum well layer 55 is formed to include two structures that are the p-GaN contact layer 8 and the air having different refractive indices. Provided that R/a (the ratio of the radius R of each void 101(h) to the period a) is 0.40, for example, the filling factor of the photonic crystals 100, which is computed by the formula: $f=2\pi/3^{0.5}\times(R/a)^2$, is $f=0.58$. In addition, from the refractive index of the air ($n_3=1.0$), the refractive index of the p-GaN contact layer 8 ($n_4=2.631$), and $f=0.58$, the effective refractive index $n_{2Deff}$ is computed by the formula: $n_{2Deff}=(n_4^2+(n_3^2-n_4^2)\times f)^{0.5}=1.867$.

It should be noted that the wavelength region of deep ultraviolet (DUV) light is 200 to 355 nm, and the refractive index n and the extinction coefficient k will differ depending on the wavelength. Thus, when the wavelength λ to be selected is changed, computation parameters related to the photonic crystals will also change, and thus, the thickness of the p-block layer as well as the distance between the quantum well layer and the two-dimensional photonic crystals will also change. It should be noted that the refractive index and the extinction coefficient used for the computation herein are based on the values from a document. These values will slightly change depending on the thickness of each layer. Thus, the thickness of the p-block layer as well as the distance between the quantum well layer and the two-dimensional photonic crystals will also change.

Photonic band structures for TM light and TE light when the light emission wavelength λ=275 nm and the two-dimensional reflecting photonic crystal periodic structure 100 satisfies the Bragg scattering condition ($m\lambda/n_{2Deff}=2a$, where $n_{2Deff}$ is the effective refractive index of the two-dimensional photonic crystals, a is the period of the 2D-PhC, and m is the order) are determined using the plane wave expansion method. FIGS. 3A(a-1) and 3A(a-2) illustrate the photonic band structures for TM light and TE light, respectively, when R/a=0.40.

Similarly, FIGS. 3B(b-1) and 3B(b-2) illustrate the photonic band structures for TM light and TE light, respectively, when R/a=0.30, and FIGS. 3C(c-1) and 3C(c-2) illustrate the photonic band structures for TM light and TE light, respectively, when R/a=0.20.

In the two-dimensional reflecting photonic crystals, a photonic band gap (PBG) for TM light is not observed as can be seen in FIG. 3A(a-1), FIG. 3B(b-1), and FIG. 3C(c-1), while a PBG for TE light is observed between a first photonic band (ω1TE) and a second photonic band (ω2TE) as can be seen in FIG. 3A(a-2), FIG. 3B(b-2), and FIG. 3C(c-2). In addition, as can be seen in FIG. 3A(a-2), FIG. 3B(b-2), and FIG. 3C(c-2), the PBG for TE light is the largest when R/a=0.40 and becomes larger with an increase in R/a.

By the way, when the thickness of the p-block layer 7 is increased, the forward voltage (Vf) is increased correspondingly. For example, when the wavelength is 275 nm and the thickness of the p-block layer is 40 nm, Vf is about 6 V, but when the thickness of the p-block layer is increased by 10 nm, Vf is also increased by 1 V. Therefore, to suppress Vf, the thickness of the p-block layer should be suppressed as much as possible. However, since the light extraction efficiency significantly improves with the combined effect of Bragg reflection in the perpendicular direction and the two-dimensional reflecting photonic crystals, it is important to optimize the thickness of the p-block layer. Therefore, in the present embodiment, optimal conditions under which the LEE significantly improves with the combined effect of Bragg reflection in the perpendicular direction and the two-dimensional reflecting photonic crystals and for which trade-off between Vf and the thickness of the p-block layer is also considered are analyzed, that is, parameters of the distance between the quantum well layer 55 and the two-dimensional reflecting photonic crystal structure, the thickness of the p-block layer, and the two-dimensional photonic crystal periodic structure (i.e., the order m, the period a, and R/a that satisfy the Bragg scattering condition $m\lambda/n_{2Deff}=2a$) are determined through simulation analysis using the FDTD method and the ray-tracing method.

Table 2 illustrates a computation model of the deep ultraviolet LED structure obtained with the FDTD method, and Table 3 illustrates the parameters of a computation model of the two-dimensional reflecting photonic crystal structure.

TABLE 2

Computation Model and Parameters of LED with pGaN Contact Layer Obtained with FDTD Method

| | Thickness (nm) | Al Content (%) | Refractive Index | Extinction Coefficient |
|---|---|---|---|---|
| Reflecting Electrode (Au) | 200 nm | — | 1.644 | 1.85 |
| Metal Layer (Ni) | 30 nm | — | 1.667 | 2.072 |
| p-GaN Contact Layer | 138 nm | — | 2.631 | 0.432 |
| p-Block Layer (Variable in Increments of 4 nm) | 40 nm-60 nm | 68% | 2.594 | — |
| i-Guide Layer | 1 nm | 100% | 2.300 | — |
| Multi-Quantum Well Layer: 3pair | — | — | — | — |
| Well | 2 nm | 45% | 2.773 | — |
| Barrier | 7 nm | 65% | 2.623 | — |
| n-AlGaN Contact Layer | 200 nm | 65% | 2.623 | — |
| u-AlGaN Layer | 100 nm | 85% | 2.415 | — |
| AlN Template | 200 nm | 100% | 2.300 | — |
| Sapphire Substrate | 1,300 nm | — | 1.830 | — |

TABLE 3

Computation Model and Shape Parameters of Two-Dimensional Reflecting Photonic Crystal Structure [p-GaN Contact]

| R/a | Order | Diameter (nm) | Period (nm) |
|---|---|---|---|
| R/a = 0.20 | m = 4 | 89 nm | 223 nm |
| R/a = 0.30 | m = 4 | 148 nm | 246 nm |
| R/a = 0.40 | m = 1 | 59 nm | 74 nm |
| R/a = 0.40 | m = 2 | 118 nm | 147 nm |
| R/a = 0.40 | m = 3 | 177 nm | 221 nm |
| R/a = 0.40 | m = 4 | 236 nm | 295 nm |

Figure 4:
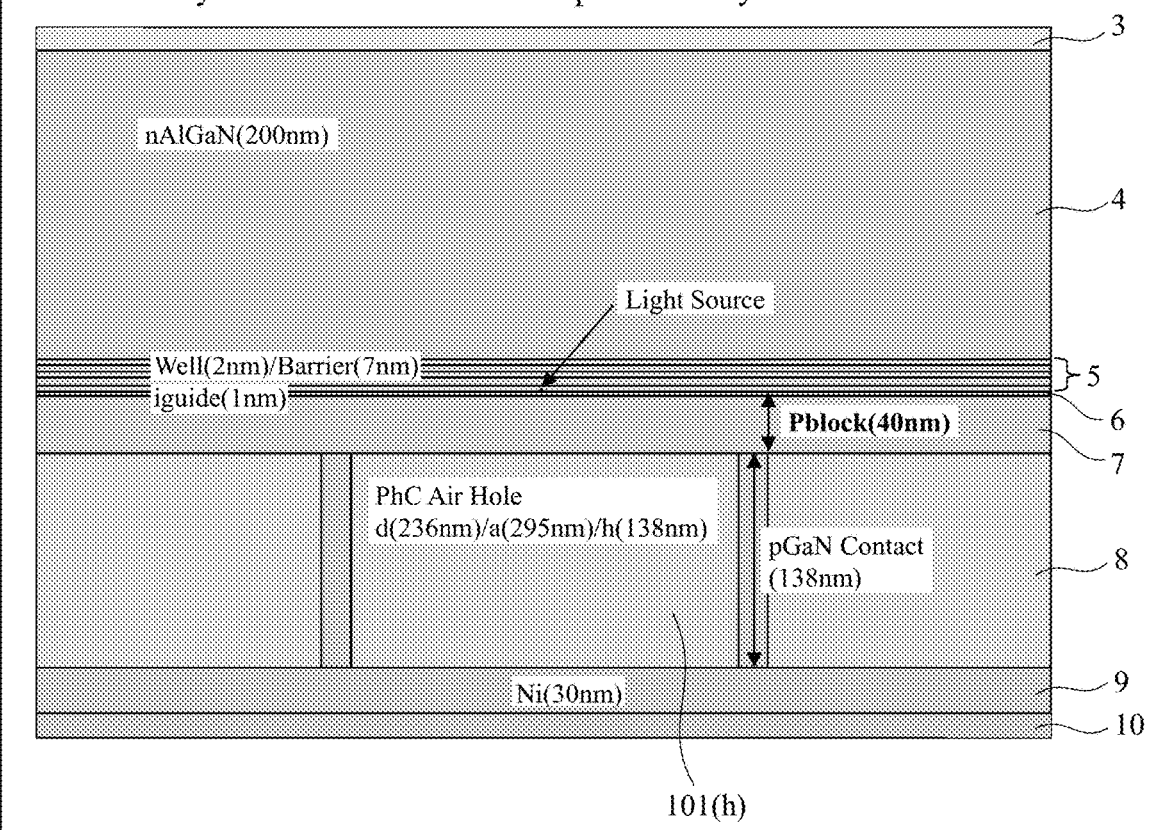
FIG. 4 is a cross-sectional view of a region around photonic crystals when the thickness of a p-block layer is 40 nm as a computation model obtained with the FDTD method.

FIG. 4 is a cross-sectional view of a region around a photonic crystal periodic structure of a deep ultraviolet LED structure having a p-block layer with a thickness of 40 nm as an exemplary computation model obtained with the FDTD method. The structure of the computation model was analyzed by varying the thickness of the p-block layer in increments of 4 nm in the range of 40 to 60 nm and also through comparison between cases where a two-dimensional reflecting photonic crystal periodic structure (2D-PhC) was provided and was not provided. The 2D-PhC was formed in a region from the interface between the p-block layer and the p-GaN contact layer to the interface between the metal layer (Ni) and the p-GaN contact layer, as illustrated in FIG. 4.

Figure 5:
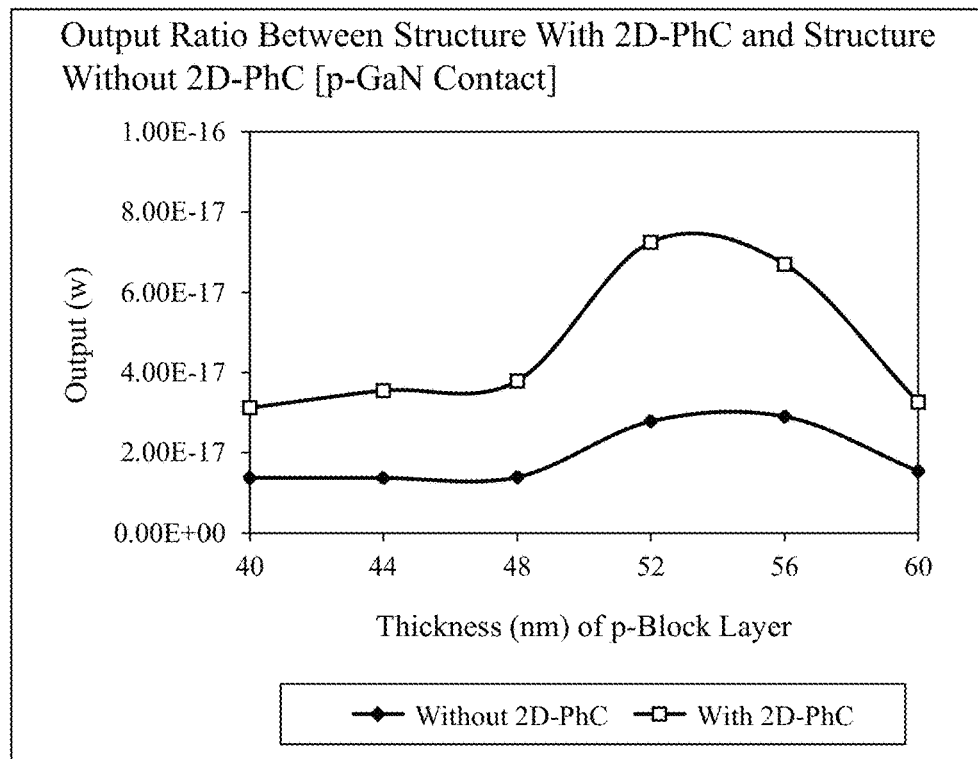
FIG. 5 is a graph illustrating the analysis results of the FDTD method regarding the comparison between the output values of a structure with two-dimensional photonic crystals and a structure without two-dimensional photonic crystals.
Figure 6:
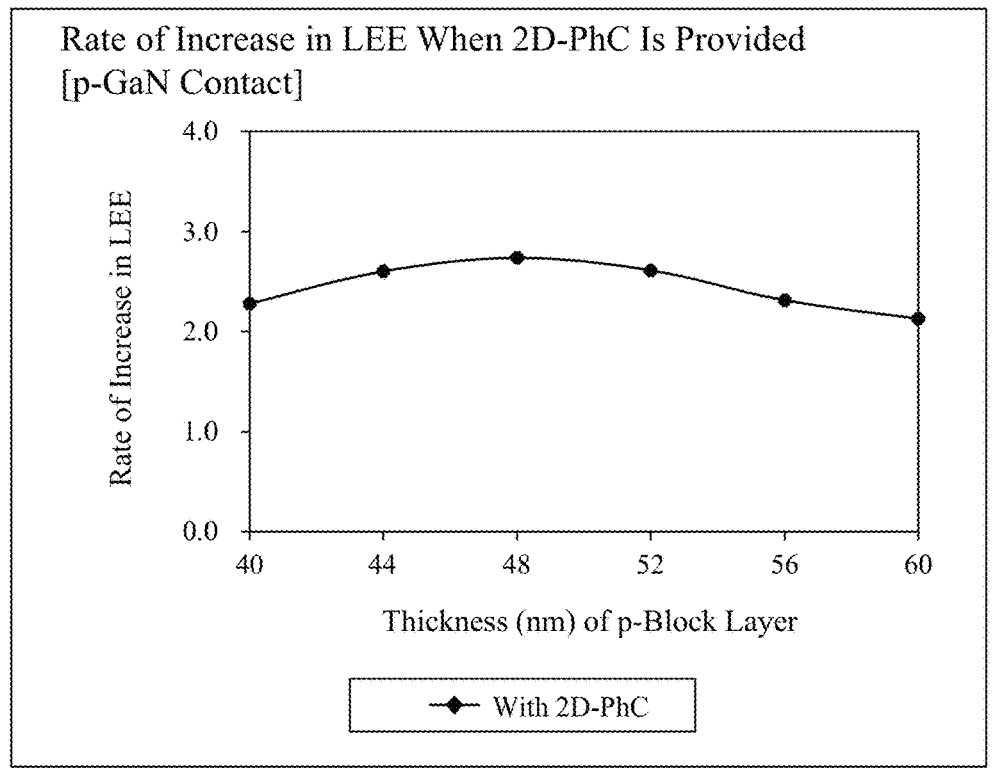
FIG. 6 is a graph illustrating the analysis results of the FDTD method regarding the comparison between the rates of increase in the LEE of a structure with two-dimensional photonic crystals and a structure without two-dimensional photonic crystals.

FIGS. 5 and 6 illustrate the simulation analysis results of the aforementioned computation model. FIG. 5 illustrates changes in the output (w) when the thickness of the p-block layer is varied in increments of 4 nm in the range of 40 to 60 nm for both cases where 2D-PhC (with the order m=4 and R/a=0.40) is provided and is not provided. As can be seen in FIG. 5, the output greatly increases in the thickness range of the p-block layer of 52 to 56 nm both when 2D-PhC is provided and when it is not provided.

Also, as can be seen in FIG. 5, the output of the structure without 2D-PhC and with a p-block layer in the thickness range of 52 to 56 nm is about twice that of the structure without 2D-PhC and with a p-block layer with a thickness of 40 nm. Such a phenomenon illustrates that a stacked structure of the i-guide layer and the p-block layer of the present structure can obtain the effect of Bragg reflection in the perpendicular direction when the thickness of the p-block layer is 52 to 56 nm.

FIG. 6 illustrates the rate of increase in the LEE of a structure with 2D-PhC compared with that of a structure without 2D-PhC. As can be seen in FIG. 6, the LEE increases by about 2.6 times when the thickness of the p-block layer is 52 nm, and increases by about 2.3 times when the thickness of the p-block layer is 56 nm. Thus, it can be said that the combined effect of Bragg reflection in the perpendicular direction and the two-dimensional reflecting photonic crystals is obtained when the thickness of the p-block layer is 52 to 56 nm.

Figure 7:
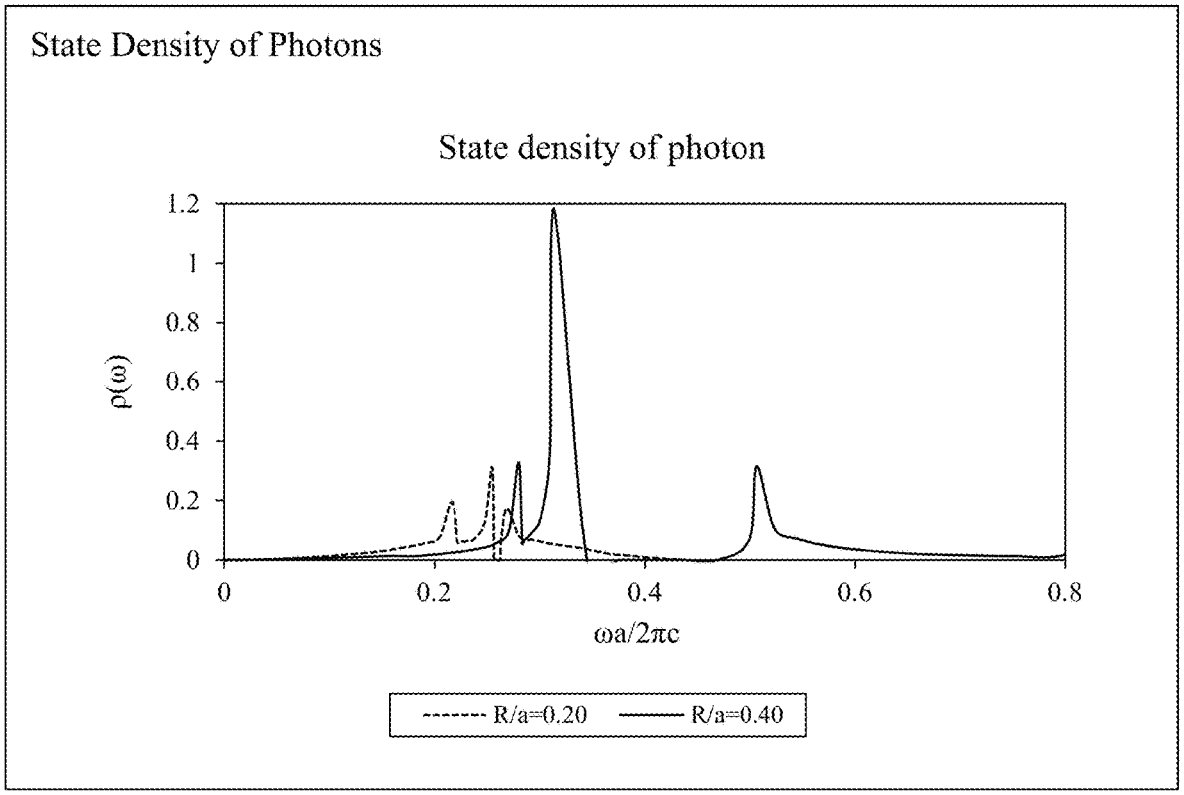
FIG. 7 is a graph representing the state density of photons in two-dimensional photonic crystals.

The design of the two-dimensional reflecting photonic crystals (2D-PhC) is computed from the formula of the Bragg scattering condition: $m\lambda/n_{2Deff}=2a\sin\theta$ (where m is the order, $n_{2Deff}$ is the effective refractive index of the 2D-PhC periodic structure, $\lambda$ is the design wavelength, and a is the period of the 2D-PhC) in the plane of the 2D-PhC. FIG. 7 is a graph representing the state density of photons in each of 2D-PhCs with R/a=0.20 and R/a=0.40. The reflection intensity of the photonic crystals is correlated with the state density of photons. As illustrated in FIG. 7, the greater the R/a, the greater the change in the state density of photons. In addition, DUV light that has entered the 2D-PhC formed in proximity to the quantum well layer (i.e., light emitting layer) generates standing waves in the plane of the 2D-PhC. Then, when the distance between the quantum well layer and the 2D-PhC satisfies $\lambda/2n_{1Deff}$, DUV light that has entered the plane of the 2D-PhC is reflected in the direction of the sapphire substrate due to Bragg reflection occurring in the perpendicular direction (see FIG. 8).

The deep ultraviolet LED structure of the present embodiment is considered to be able to obtain high reflection effect when the distance between the quantum well layer and the 2D-PhC is 53 nm because it best satisfies the condition of Bragg reflection in the perpendicular direction.

Figure 9:
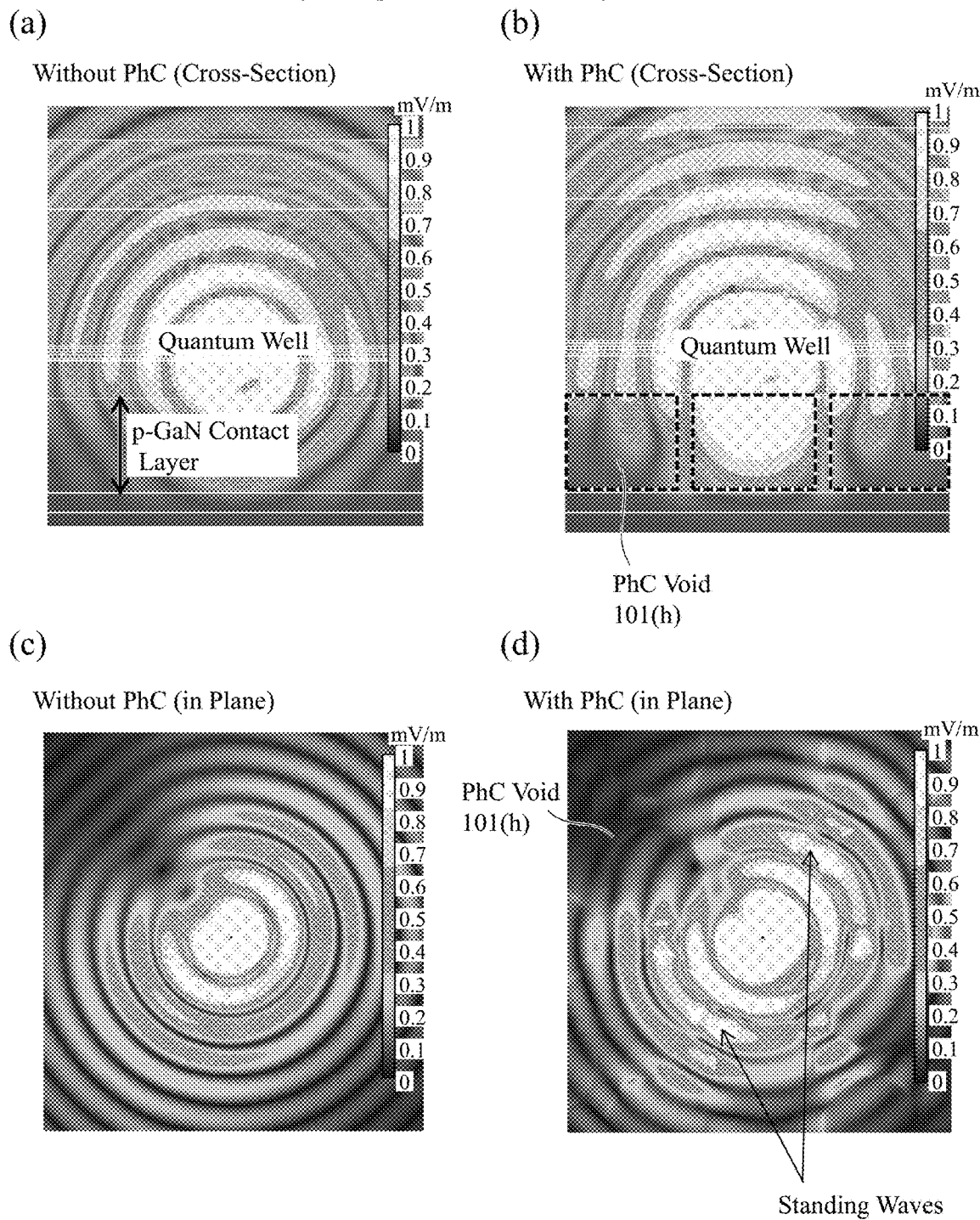
FIGS. 9 are views illustrating changes with time of the intensity of an electric field around a region from the quantum well layer to the p-GaN contact layer.

FIGS. 9 illustrate changes with time of the intensity of an electric field around a region from the quantum well layer to the p-GaN contact layer when the distance between the quantum well layer and the 2D-PhC is set to 53 nm, as the analysis results of the FDTD method for verifying the foregoing. FIGS. 9 represent the intensity of an electric field in the cross-section and the plane of 2D-PhC when the 2D-PhC is provided and is not provided. FIG. 9(a) illustrates the cross-section of a structure without 2D-PhC, in which an electric field is propagating in all directions, whereas when 2D-PhC is provided as in FIG. 9(b), it is seen that an electric field is reflected without entering the 2D-PhC. In addition, referring to an electric field distribution in the plane of the 2D-PhC, it can be confirmed that standing waves appear in the structure with 2D-PhC of FIG. 9(d), in contrast to the structure without 2D-PhC of FIG. 9(c).

Based on the above premise, the optimal value of the distance (G) between the quantum well layer and the 2D-PhC that can obtain the combined effect of the 1D-PhC and the 2D-PhC will be determined through simulation analysis.

Figure 10:
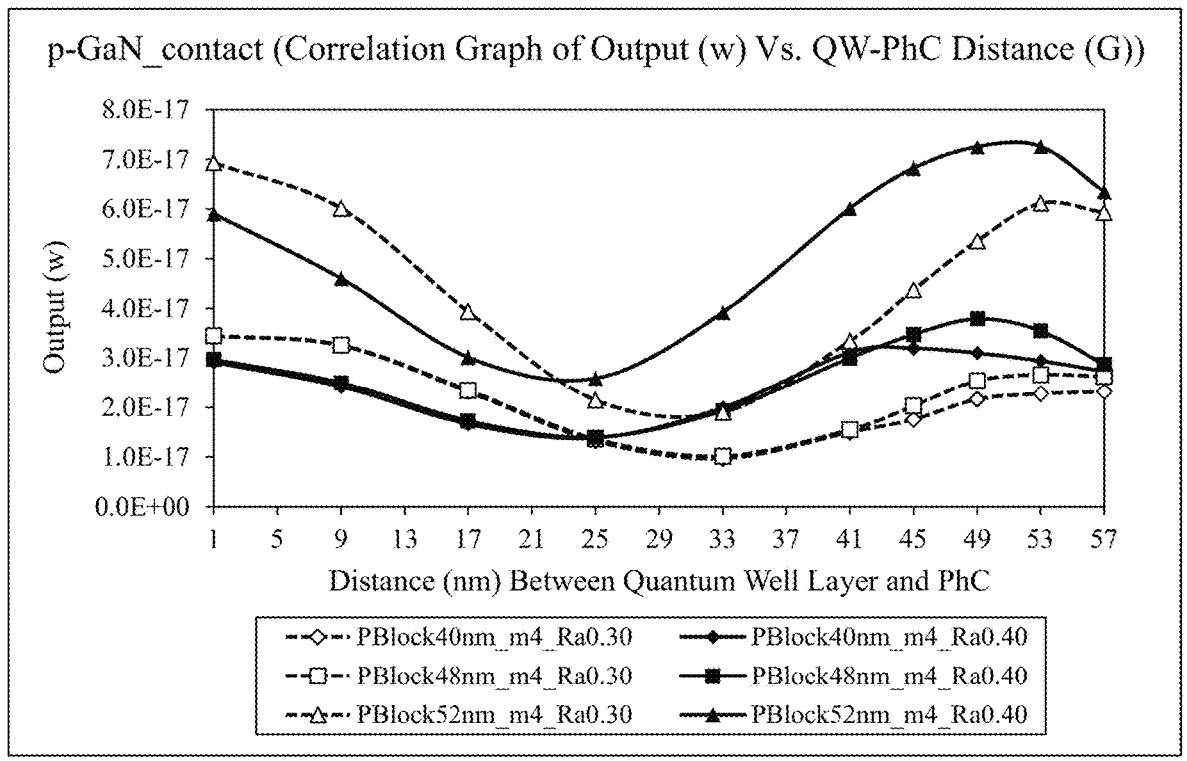
FIG. 10 is a graph illustrating the analysis results of the FDTD method when a p-GaN contact layer is provided, regarding the comparison between the output values when the thickness of the p-block layer as well as the distance between the quantum well layer and the two-dimensional photonic crystals is made variable.

First, outputs that differ depending on the distance G between the quantum well layer and the 2D-PhC are confirmed for each of structures having a p-block layer with a thickness of 40, 48, and 52 nm. The distance G between the quantum well layer and the 2D-PhC was made variable in increments of 4 nm in the range of 1 to 57 nm, R/a of the 2D-PhC was set to R/a=0.30 or R/a=0.40, and the order m for each case was set to m=4. FIG. 10 illustrates the analysis results of the FDTD method.

As illustrated in FIG. 10, comparison of the outputs of the structures that differ in the thickness of the p-block layer, specifically, between structures having a p-block layer with a thickness of 40 nm and that with a thickness of 48 nm, reveals that the output of the structure having a p-block layer with a thickness of 48 nm is higher than the structure having a p-block layer with a thickness of with 40 nm by about 1.2 times when the distance G is 49 nm at which both the structures have the maximum output. Meanwhile, it can be confirmed that a structure having a p-block layer with a thickness of 52 nm has the maximum output when the distance G is 53 nm, and the output is twice or more as high as when the p-block layer has a thickness of 48 nm.

Figure 11:
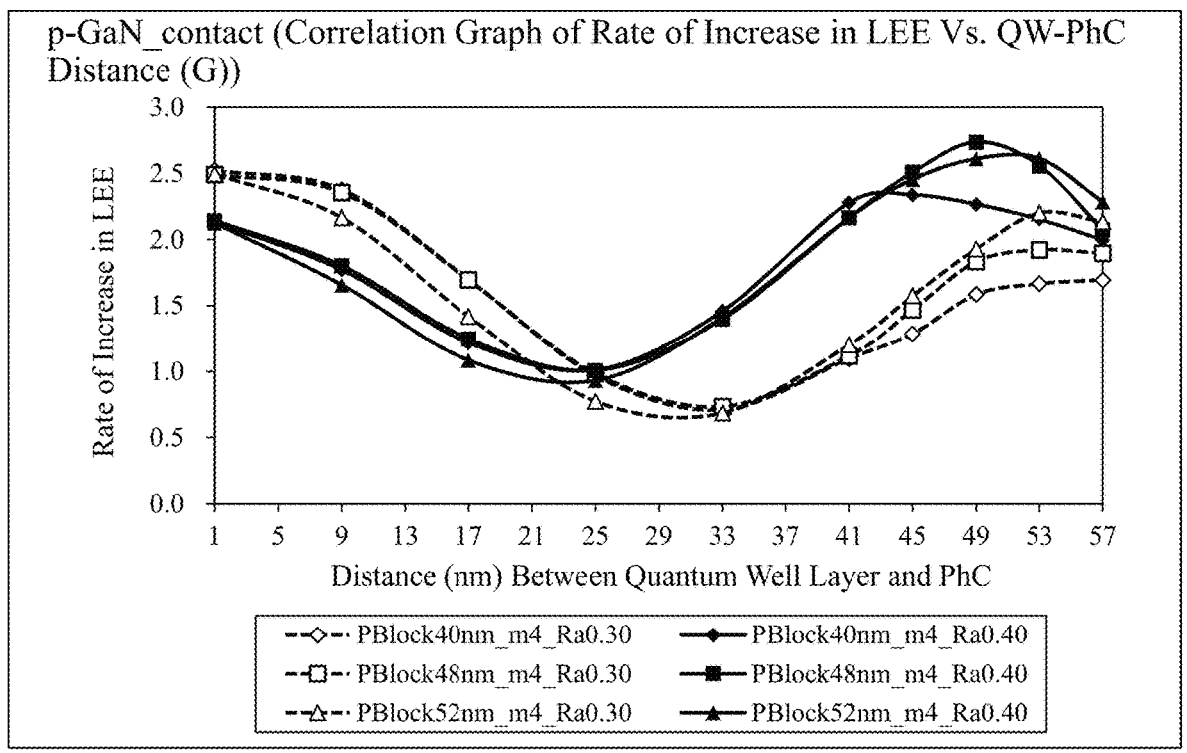
FIG. 11 is a graph illustrating the analysis results of the FDTD method when a p-GaN contact layers is provided, regarding the comparison between the rates of increase in the LEE when the thickness of the p-block layer as well as the distance between the quantum well layer and the two-dimensional photonic crystals is made variable.

FIG. 11 illustrates the rate of increase in the LEE of a structure with 2D-PhC compared with that of a structure without 2D-PhC, analyzed under the same simulation conditions as in FIG. 10. FIG. 11 can confirm that the LEE of a structure with 2D-PhC and with a p-block layer with a thickness of 52 nm is increased by 2.6 times when the distance G is 53 nm. Such a distance G between the quantum well layer and the 2D-PhC coincides with the distance of 53 nm that satisfies the aforementioned Bragg condition in the perpendicular direction. This indicates that a structure that has a p-block layer with a thickness of 52 nm and that satisfies a period of 53 nm, with which the maximum effect of Bragg reflection in the perpendicular direction is obtained, satisfies the optimal conditions regarding both the output and the rate of increase in the LEE that can obtain the combined effect of Bragg reflection in the perpendicular direction and the two-dimensional reflecting photonic crystals.

It should be noted that in FIG. 10, the output of a structure having a p-block layer with a thickness of 52 nm when the distance G is 49 nm is about equal to that when the distance G is 53 nm. However, if the distance G is 49 nm, not only the p-GaN contact layer but also the p-block layer is partially etched when voids of the two-dimensional reflecting photonic crystal structure are formed by etching, which may cause damage to the p-block layer due to the etching. Thus, the distance G of 49 nm cannot be selected. Meanwhile, when the distance G is 57 nm, a relatively high output is found to be obtained, though it is lower than when the distance G is 53 nm. Therefore, the distance G between the quantum well layer and the two-dimensional reflecting PhC is selected from 53 to 57 nm.

Further, since the distance G of 57 nm is selectable as the maximum distance G that aims to obtain the combined effect of Bragg reflection in the perpendicular direction and the two-dimensional reflecting photonic crystals, it follows that the optimal thickness of the p-block layer is 52 to 56 nm if the thickness of the i-guide layer is 1 nm. Thus, analysis based on the FDTD method was conducted on a structure having a p-block layer with a thickness of 52 nm and a structure having a p-block layer with a thickness of 56 nm, both from the perspectives of the dependence of the 2D-PhC on R/a and on the order. For purposes of comparison with a standard LED structure, the analysis was conducted through comparison with a standard structure without 2D-PhC and with a p-block layer with a thickness of 40 nm as a comparative example. Regarding the dependence on R/a, the order m was set to m=4 and R/a was made variable in the range of R/a=0.20 to 0.40. Meanwhile, Regarding the dependence on the order, R/a was set to 0.40 and the order m was made variable in the range of m=1 to 4. FIGS. 12 and 13 illustrate the comparison of the rates of increase in the LEE and the output values.

Regarding the dependence on R/a, FIG. 12(*a*) illustrates the dependence of the rate of increase in the LEE on R/a, and FIG. 12(*b*) illustrates the dependence of the output value on R/a. Regarding the dependence on the order, FIG. 13(*a*) illustrates the dependence of the rate of increase in the LEE on the order, and FIG. 13(*b*) illustrates the dependence of the output value on the order. The results illustrated in FIGS. 12(*a*), 12(*b*), 13(*a*), and 13(*b*) can confirm that substantially the same output value or substantially the same rate of increase in the LEE is obtained both when the thickness of the p-block layer is 52 nm and when it is 56 nm. The analysis results can also confirm that R/a=0.30 or R/a=0.40 is an optimal parameter for the 2D-PhC, and m=3 or m=4 is an optimal order.

Further, optimal conditions for R/a of the 2D-PhC and the order are also described below based on simulation analysis using the FDTD method. FIGS. 11 and 12 illustrate that when comparison is made between a structure with R/a=0.30 and that with R/a=0.40, higher reflection effect is obtained with the structure with R/a=0.40, where the state density of photons greatly changes (see FIG. 7), for each of the cases where the thickness of the p-block layer is 40 nm, 48 nm, and 52 nm. Thus, the dependence on the order when R/a=0.40 was confirmed by fixing the distance G between the quantum well layer and the 2D-PhC to 53 nm that satisfies the aforementioned Bragg condition in the perpendicular direction (FIGS. 15). Concurrently, the dependence on R/a when the order m is m=4 was also confirmed (FIGS. 14). This analysis was also conducted using a standard structure without 2D-PhC and with a p-block layer with a thickness of 40 nm as a comparative example for purposes of comparison with a standard LED structure.

FIG. 14(*a*) illustrate the dependence of the rate of increase in the LEE on R/a for each of R/a=0.20, R/a=0.30, and R/a=0.40 when the distance G is 53 nm and the order m is m=4, and FIG. 14(*b*) similarly illustrates the dependence of the output value on R/a. FIG. 14(*a*) can confirm that the LEE of a structure with "pGaN_block52 nm_4" is increased by about 2.5 times when R/a=0.20, and is increased by 5 times or more when R/a=0.40. FIG. 14(*b*) can also confirm that the greater the R/a, the greater the output.

FIG. 15(*a*) illustrates the dependence of the rate of increase in the LEE on the order for each of the orders m=1 to 4 when the distance G is 53 nm and R/a=0.40, and FIG. 15(*b*) similarly illustrates the dependence of the output value on the order. FIG. 15(*a*) can confirm that the rate of increase in the LEE of a structure with "pGaN_block52 nm_/a0.40" is increased by about 3 to 4 times when the order m is m=1 to 2, and is increased by about 5 to 6 times when the order m is m=3 to 4. FIG. 15(*b*) can also confirm that when the order m is m=3 to 4, an output that is higher than when the order m is m=1 to 2 is obtained.

For verification purposes, the LEE value was determined and confirmed through cross-simulation between the FDTD method and the ray-tracing method. FIG. 16 illustrates a computation model obtained with the ray-tracing method and the analysis results. With the ray-tracing method, nanometer-scale computation is impossible. Thus, cross-simulation was performed by multiplying the LEE value computed with the ray-tracing method by the rate of increase in the LEE derived with the FDTD method, so that the LEE value of the LED structure of the present embodiment was computed. Table 4 illustrates the results.

TABLE 4

Analysis Results of LEE Obtained by Cross-Simulation between FDTD Method and Ray-Tracing Method [p-GaN Contact]

| | | Dependence on R/a | | | | | | | | |
|---|---|---|---|---|---|---|---|---|---|---|
| | | R/a = 0.2 | | | R/a = 0.3 | | | R/a = 0.4 | | |
| | Flat LEE (%) | Power (w) | Rate of Increase in LEE | LEE (%) | Power (w) | Rate of Increase in LEE | LEE (%) | Power (w) | Rate of Increase in LEE | LEE (%) |
| pGaN_Pblock52nm_m4_G53nm | 4.8% | 3.5E-17 | 2.5 | 12.2% | 6.1E-17 | 4.5 | 21.5% | 7.3E-17 | 5.3 | 25.5% |
| pGaN_Pblock56nm_m4_G57nm | 4.8% | 4.0E-17 | 2.9 | 13.9% | 6.5E-17 | 4.7 | 22.8% | 6.7E-17 | 4.9 | 23.5% |

| | | Dependence on Order | | | | | |
|---|---|---|---|---|---|---|---|
| | | m = 1 | | | m = 2 | | |
| | Flat LEE (%) | Power (w) | Rate of Increase in LEE | LEE (%) | Power (w) | Rate of Increase in LEE | LEE (%) |
| pGaN_Pblock52nm_R/a0.40_G53nm | 4.8% | 4.5E-17 | 3.3 | 15.7% | 5.2E-17 | 3.8 | 18.4% |
| pGaN_Pblock56nm_R/a0.40_G57nm | 4.8% | 4.5E-17 | 3.3 | 15.6% | 6.0E-17 | 4.4 | 21.1% |

TABLE 4-continued

Analysis Results of LEE Obtained by Cross-Simulation between FDTD Method and Ray-Tracing Method [p-GaN Contact]

| | Dependence on Order | | | | | |
|---|---|---|---|---|---|---|
| | m = 3 | | | m = 4 | | |
| | Power (w) | Rate of increase in L EE | LEE (%) | Power (w) | Rate of Increase in LEE | LEE (%) |
| pGaN_Pblock52nm_R/a0.40_G53nm | 7.8E−17 | 5.7 | 27.5% | 7.3E−17 | 5.3 | 25.5% |
| pGaN_Pblock56nm_R/a0.40_G57nm | 7.9E−17 | 5.8 | 27.7% | 6.7E−17 | 4.9 | 23.5% |

As can be seen in Table 4, when the thickness of the p-block layer is 52 nm, the distance G between the quantum well layer and the 2D-PhC is 53 nm, R/a=0.40, and the order m is m=3, a LEE of 27.5% is obtained, and similarly, when the order m is m=4, a LEE of 25.5% is obtained. This can confirm that the LEE can be further improved based on the present embodiment.

Second Embodiment

FIGS. 1B(b-1) and 1B(b-2) represent the structure (i.e., a cross-sectional view and a plan view, respectively) of an AlGaN-based deep ultraviolet LED with a design wavelength λ of 275 nm, as a deep ultraviolet LED in accordance with a second embodiment of the present invention.

Specifically, the deep ultraviolet LED includes, sequentially arranged from the top of the cross-sectional view of FIG. 1B(b-1), a sapphire substrate 1, an AlN template 2, a u-AlGaN layer 3, an n-AlGaN contact layer 4, a multi-quantum well layer 5 (which includes three quantum well layers (51, 53, and 55) and barrier layers (52 are 54) sandwiched between the respective adjacent quantum well layers), an i-guide layer 6 (which is made of an AlN layer), a p-block layer 7 (which is made of an AlGaN layer), a p-AlGaN contact layer 8a, a metal layer 9 (which is made of a Ni layer), and a reflecting electrode layer 10 (which contains Au). The thickness of the p-block layer 7 is 44 to 48 nm. In addition, a two-dimensional reflecting photonic crystal periodic structure 100 is provided within the range of the thickness direction of the p-AlGaN contact layer 8a in a position not beyond the interface between the p-AlGaN contact layer 8a and the p-block layer 7. The photonic crystal periodic structure 100 has voids (i.e., columnar structures or holes) 101(h). Each void 101 is provided in a position such that the distance G between an end face of the void 101 in the direction of the sapphire substrate 1 and the interface between the multi-quantum well layer 5 and the i-guide layer 6 is 53 to 61 nm, and this distance G satisfies the condition of Bragg reflection in the perpendicular direction.

The entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

Figure 17:
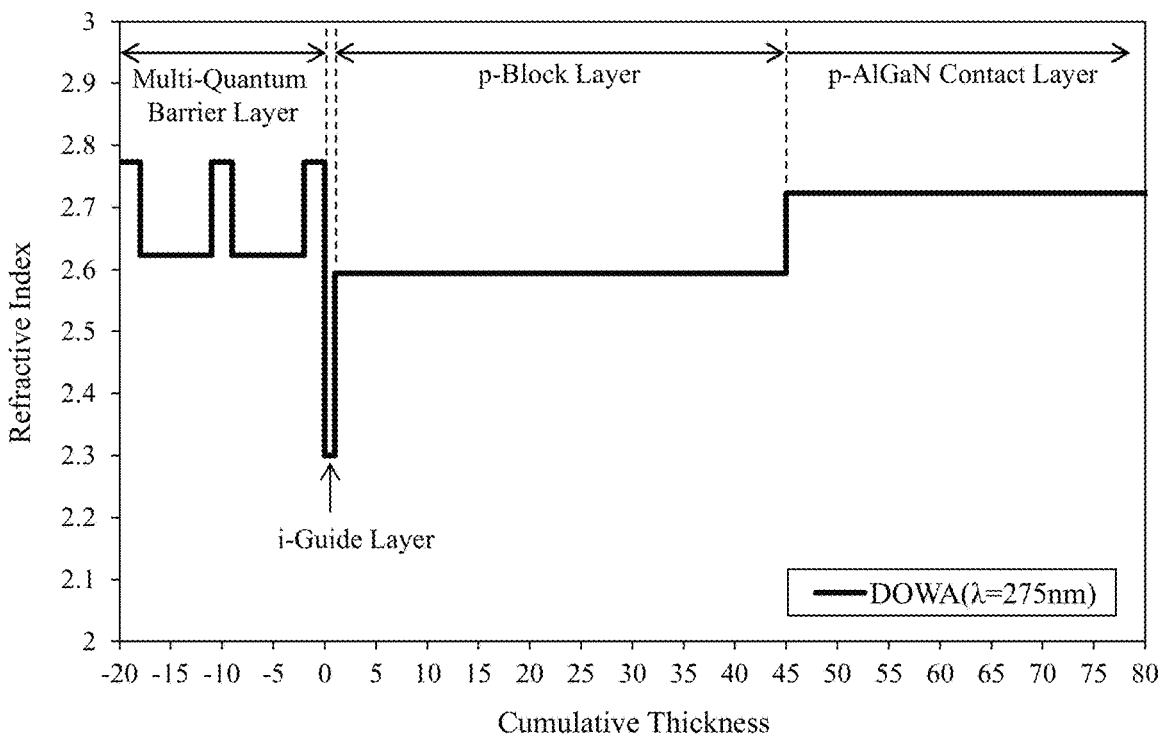
FIG. 17 is a graph illustrating the relationship between the cumulative thickness of the layers from the multi-quantum well layer and the difference in refractive index, regarding Bragg reflection in the perpendicular direction.

FIG. 17 illustrates the relationship between the cumulative thickness of the stacked structure from the multi-quantum well layer 5 to the p-AlGaN contact layer 8a, and the difference in refractive index, regarding Bragg reflection in the perpendicular direction.

The distance G (i.e., period) and the thickness of the p-block layer 7 at which the effect of Bragg reflection in the perpendicular direction is obtained are computed from the formula of the Bragg scattering condition ($m\lambda/n_{1Deff}=2a$, where m is the order, $n_{1Deffav}$ is the effective refractive index of each film of the stacked structure from an end face of each void 101(h) to the i-guide layer 6, λ is the design wavelength, and a is the period).

The refractive indices (n) of the i-guide layer 6 and the p-block layer 7 at a design wavelength of 275 nm are $n_1=2.300$ and $n_2=2.594$, respectively. The effective refractive index $n_{1Deff}$ is determined by the formula: $n_{1deff}=[n_2^2+(n_1^2-n_2^2)(d/a)^2]^{0.5}$. Provided that the thickness of the i-guide layer 6 is d, which is 1 nm, for example, the value of d/a equals 0.019. Therefore, $n_{1Deff}$ is 2.589. Provided that m=1 and these values are substituted into the formula of the Bragg scattering condition, the period a is derived as 53 nm. That is, herein, the distance at which the reflection effect in the perpendicular direction is obtained is 53 nm.

Table 5 illustrates the simulation analysis results of the FDTD method regarding the effect of Bragg reflection in the perpendicular direction.

TABLE 5

FDTD Simulation Analysis Illustrating Bragg Reflection in Perpendicular Direction [p-AlGaN Contact] p-AlGaN Contact Layer

| Center | −G53 nm | | +G53 nm | |
|---|---|---|---|---|
| Wavelength (275 nm) | Output (w) | Output Ratio | Output (w) | Output Ratio |
| P-Block with Thickness of 40 nm | 4.7E−24 | — | 4.2E−24 | — |
| P-Block with Thickness of 44 nm | 9.2E−24 | 2.0 | 7.5E−24 | 1.8 |

[Note]
−G53 nm: A monitor was disposed at a position of 53 nm in the direction of the sapphire substrate from the interface between the quantum well layer 55 and the i-guide layer 6.
+G53 nm: A monitor was disposed at a position of 53 nm in the direction of the p-AlGaN contact layer from the interface between the quantum well layer 55 and the i-guide layer 6.
Output ratio: P-block thickness: 44 nm/40 nm Table 5 illustrates the output values of structures having a p-block layer with a thickness of 40 nm and that with a thickness of 44 nm, which have been measured by disposing monitors in the respective structures at a position of a distance of 53 nm in the direction of the sapphire substrate 1 from the interface between the quantum well layer 55 and the i-guide layer 6 (indicated by "–G53 nm" in Table 5) and a position of a distance of 53 nm in the direction of the p-AlGaN contact layer 8 from the interface between the quantum well layer 55 and the i-guide layer 6 (indicated by "+G53 nm" in Table 5), and the output ratio between them.

Table 5 can confirm that from each of the upper and lower monitors sandwiching the quantum well layer, the output of the structure having the p-block layer with a thickness of 44 nm is found to be about twice that of the structure having the p-block layer with a thickness of 40 nm. In addition, the output value obtained with the monitor (+G53 nm) disposed on the side of the p-AlGaN contact layer in the structure having the p-block layer with a thickness of 40 nm is found to have not decreased almost at all in comparison with when a p-GaN contact layer is provided. This is because the p-AlGaN contact layer absorbs little light unlike the p-GaN contact layer.

These results can confirm that the distance G at which the effect of Bragg reflection in the perpendicular direction is obtained in the LED structure with the p-AlGaN contact layer is also 53 nm.

Next, the two-dimensional reflecting photonic crystal periodic structure 100 has, as illustrated in the xy plan view of FIG. 1B(b-2), columnar structures (i.e., hole structures) formed in a triangular lattice pattern with a period of a along the x-direction and the y-direction such that voids 101(h) each having a circular cross-section with a radius R include air with a refractive index smaller than that of the p-AlGaN contact layer 8a. The voids 101(h) are structures formed so as not to reach the interface between the p-AlGaN contact layer 8a and the p-block layer 7 to prevent damage to the p-block layer 7 due to dry etching. Each void 101(h) is provided in a position such that the distance (G) from an end face of the void 101(h) in the direction of the sapphire substrate 1 to the quantum well layer 55 is in the range of 53 to 61 nm.

In the two-dimensional reflecting photonic crystal periodic structure 100, TE light and TM light of deep ultraviolet light with a wavelength λ emitted from the multi-quantum well layer 5 is radiated in all directions and propagate through the medium while being elliptically polarized.

The two-dimensional reflecting photonic crystal periodic structure 100 provided in the p-AlGaN contact layer 8a at a distance G of 53 to 61 nm from the quantum well layer 55 is formed to include two structures that are the p-AlGaN contact layer 8a and the air having different refractive indices. Provided that R/a (the ratio of the radius R of each void 101(h) to the period a) is 0.40, for example, the filling factor of the photonic crystals 100, which is computed by the formula: $f=2\pi/3^{0.5} \times (R/a)^2$, is f=0.58. In addition, from the refractive index of the air ($n_3$=1.0), the refractive index of the p-AlGaN contact layer 8a ($n_4$=2.723), and f=0.58, the effective refractive index $n_{2Deff}$ is computed by the formula:

$$n_{2Deff}=(n_4^2+(n_3^2-n_4^2)\times f)^{0.5}=1.921.$$

It should be noted that the wavelength region of deep ultraviolet (DUV) light is 200 to 355 nm, and the refractive index n and the extinction coefficient k will differ depending on the wavelength. Thus, when the wavelength λ selected is changed, computation parameters related to the photonic crystals will also change, and thus, the thickness of the p-block layer as well as the distance between the quantum well layer and the two-dimensional photonic crystals will also change. It should be noted that the refractive index and the extinction coefficient used for the computation herein are based on the values from a document. These values will slightly change depending on the thickness of each layer. Thus, the thickness of the p-block layer as well as the distance between the quantum well layer and the two-dimensional photonic crystals will also change.

Photonic band structures for TM light and TE light when the light emission wavelength λ=275 nm and the two-dimensional reflecting photonic crystal periodic structure 100 satisfies the Bragg scattering condition ($m\lambda/n_{2Deff}$=2a, where $n_{2Deff}$ is the effective refractive index of the two-dimensional photonic crystals, a is the period of the 2D-PhC, and m is the order) are determined using the plane wave expansion method. FIGS. 18(a) and 18(b) illustrate the photonic band structures for TM light and TE light, respectively, when R/a=0.40.

In the two-dimensional reflecting photonic crystals, a photonic band gap (PBG) for TM light is not observed as can be seen in FIG. 18(a), while a large PBG for TE light is observed between a first photonic band (ω1TE) and a second photonic band (ω2TE) as can be seen in FIG. 18(b). The PBG for TE light is the largest when R/a=0.40 and becomes larger with an increase in R/a.

By the way, as described in the first embodiment of the present invention, when the thickness of the p-block layer 7 is increased, the forward voltage (Vf) is increased correspondingly. Therefore, it is important to optimize the thickness of the p-block layer by reducing the thickness of the p-block layer as much as possible while at the same time suppressing Vf so that the light extraction efficiency (LEE) significantly improves with the combined effect of Bragg reflection in the perpendicular direction and the two-dimensional reflecting photonic crystals. In the present embodiment, for a deep ultraviolet LED structure in which a p-AlGaN contact layer that is transparent to light with the wavelength λ is used, replacing the p-GaN contact layer of the first embodiment, optimal conditions under which the LEE significantly improves with the combined effect of Bragg reflection in the perpendicular direction and the two-dimensional reflecting photonic crystals and for which trade-off between Vf and the thickness of the p-block layer is also considered are analyzed, that is, parameters of the distance between the quantum well layer 55 and the two-dimensional reflecting photonic crystal structure, the thickness of the p-block layer, and the two-dimensional photonic crystal periodic structure (i.e., the order m, the period a, and R/a that satisfy the Bragg scattering condition $m\lambda/n_{2Deff}$=2a) are determined through simulation analysis using the FDTD method and the ray-tracing method.

Table 6 illustrates a computation model of the deep ultraviolet LED structure obtained with the FDTD method, and Table 7 illustrates the parameters of a computation model of the two-dimensional reflecting photonic crystal structure.

TABLE 6

Computation Model of LED with pAlGaN Contact Layer Obtained with FDTD Method

| | Thickness (nm) | Al Content (%) | Refractive Index | Extinction Coefficient |
|---|---|---|---|---|
| Reflecting Electrode (Au) | 200 nm | — | 1.644 | 1.85 |
| Metal Layer (Ni) | 30 nm | — | 1.667 | 2.072 |
| p-AlGaN Contact | 70 nm | 56% | 2.723 | |

TABLE 6-continued

Computation Model of LED with pAlGaN Contact Layer Obtained with FDTD Method

| Layer | Thickness (nm) | Al Content (%) | Refractive Index | Extinction Coefficient |
|---|---|---|---|---|
| p-Block Layer (Variable in Increments of 4 nm) | 40 nm-60 nm | 68% | 2.594 | — |
| i-Guide Layer | 1 nm | 100% | 2.300 | — |
| Multi-Quantum Well Layer: 3pair | — | — | — | — |
| Well | 2 nm | 45% | 2.773 | — |
| Barrier | 7 nm | 65% | 2.623 | — |
| n-AlGaN Contact Layer | 200 nm | 65% | 2.623 | — |
| u-AlGaN Layer | 100 nm | 85% | 2.415 | — |
| AlN Template | 200 nm | 100% | 2.300 | — |
| Sapphire Substrate | 1,300 nm | — | 1.830 | — |

TABLE 7

Computation Model and Shape Parameters of Two-Dimensional Reflecting Photonic Crystal Structure When pAlGaN Is Provided

| R/a | Order | Diameter (nm) | Period (nm) |
|---|---|---|---|
| R/a = 0.20 | m = 4 | 86 nm | 216 nm |
| R/a = 0.30 | m = 4 | 143 nm | 228 nm |
| R/a = 0.40 | m = 1 | 57 nm | 72 nm |
| R/a = 0.40 | m = 2 | 115 nm | 143 nm |
| R/a = 0.40 | m = 3 | 172 nm | 215 nm |
| R/a = 0.40 | m = 4 | 229 nm | 286 nm |

Figure 19:
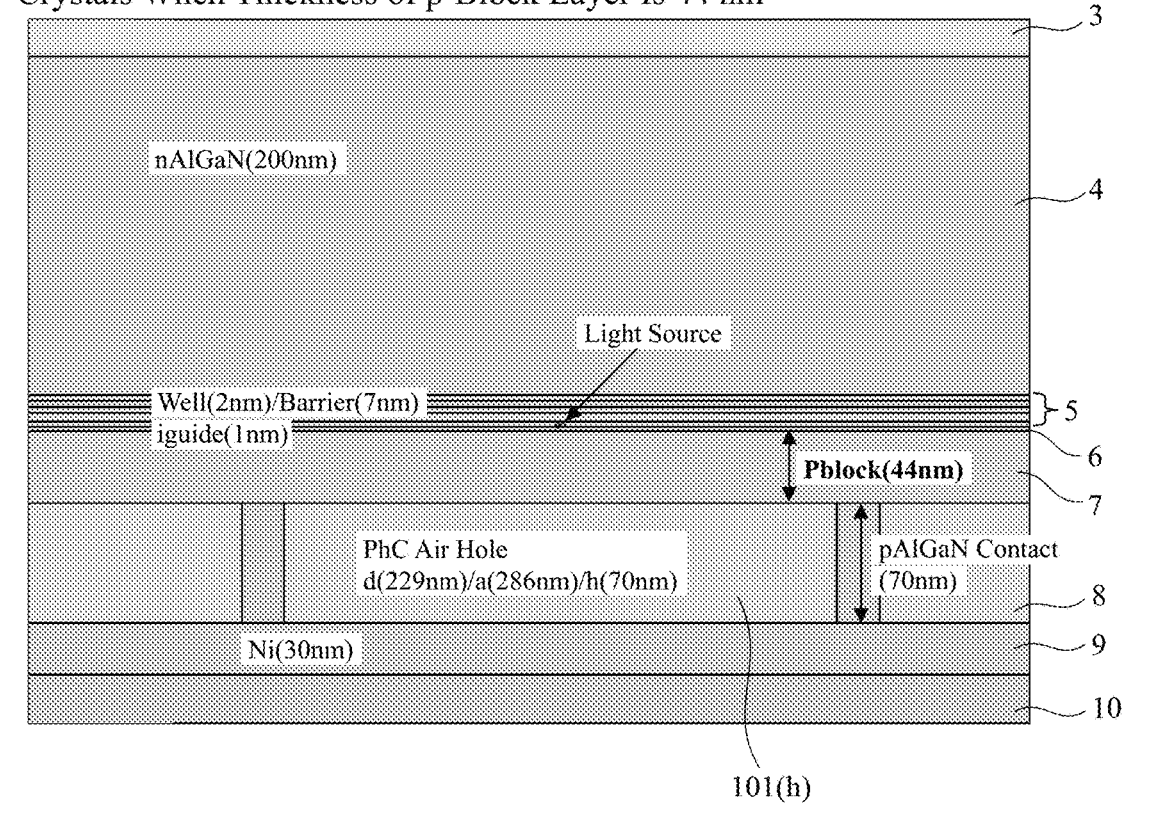
FIG. 19 is a cross-sectional view of a region around photonic crystals when the thickness of a p-block layer is 44 nm as a computation model obtained with the FDTD method.

FIG. 19 is a cross-sectional view of a region around a photonic crystal periodic structure of a deep ultraviolet LED structure having a p-block layer with a thickness of 44 nm as an exemplary computation model obtained with the FDTD method. The structure of the computation model was analyzed by varying the thickness of the p-block layer in increments of 4 nm in the range of 40 to 60 nm and also through comparison between cases where a two-dimensional reflecting photonic crystal periodic structure (2D-PhC) was provided and was not provided. The 2D-PhC was formed in a region from the interface between the p-block layer and the p-AlGaN contact layer to the interface between the metal layer (Ni) and the p-AlGaN contact layer, as illustrated in FIG. 19.

Figure 20:
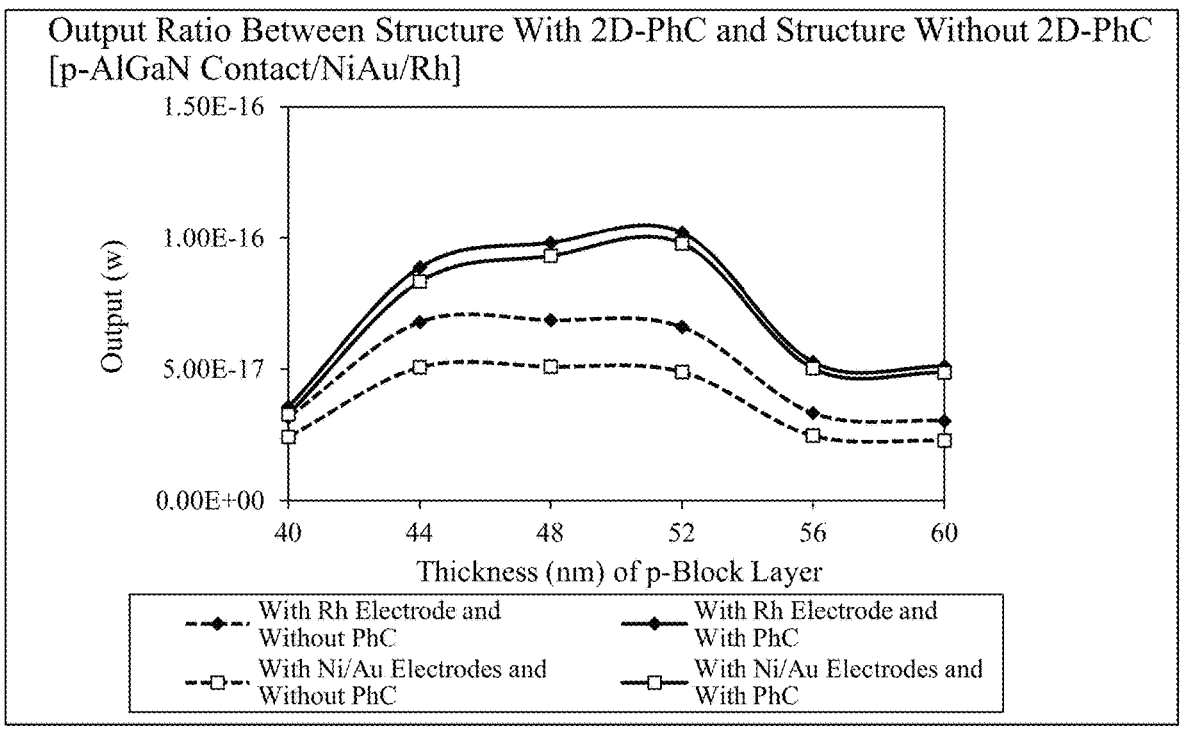
FIG. 20 is a graph illustrating the analysis results of the FDTD method regarding the comparison between the output values of a structure with two-dimensional photonic crystals and a structure without two-dimensional photonic crystals.
Figure 21:
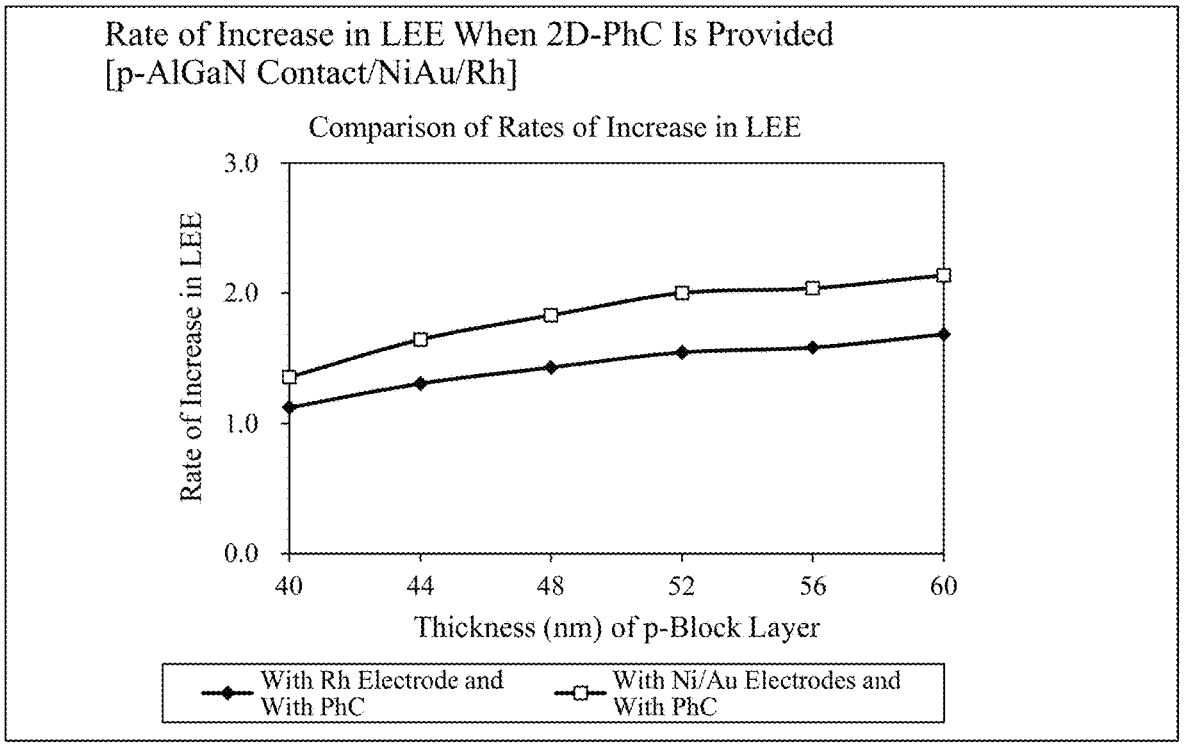
FIG. 21 is a graph illustrating the analysis results of the FDTD method regarding the comparison between the rates of increase in the LEE of a structure with two-dimensional photonic crystals and a structure without two-dimensional photonic crystals.

FIGS. 20 and 21 illustrate the simulation analysis results of the aforementioned computation model. FIG. 20 illustrates changes in the output (w) when the thickness of the p-block layer is varied in increments of 4 nm in the range of 40 to 60 nm for both cases where 2D-PhC (with the order m=4 and R/a=0.40) is provided and is not provided. As can be seen in FIG. 20, the output greatly increases in the thickness range of the p-block layer of 44 to 52 nm both when 2D-PhC is provided and when it is not provided.

Also, as can be seen in FIG. 20, the output of the structure without 2D-PhC and with a p-block layer in the thickness range of 44 to 52 nm is about twice that of the structure without 2D-PhC and with a p-block layer with a thickness of 40 nm. Such a phenomenon illustrates that a stacked structure of the i-guide layer and the p-block layer of the present structure can obtain the effect of Bragg reflection in the perpendicular direction when the thickness of the p-block layer is 44 to 52 nm.

FIG. 21 illustrates the rate of increase in the LEE of a structure with 2D-PhC compared with that of a structure without 2D-PhC, analyzed under the same conditions. As can be seen in FIG. 21, the rate of increase in the LEE increases with an increase in the thickness of the p-block layer, which illustrates that the thickness of the p-block layer is correlated with the rate of increase in the LEE. However, as described previously, increasing the thickness of the p-block layer will also increase the Vf. Therefore, the thickness of the p-block layer to be selected is preferably 44 nm and up to 48 nm.

Figure 8:
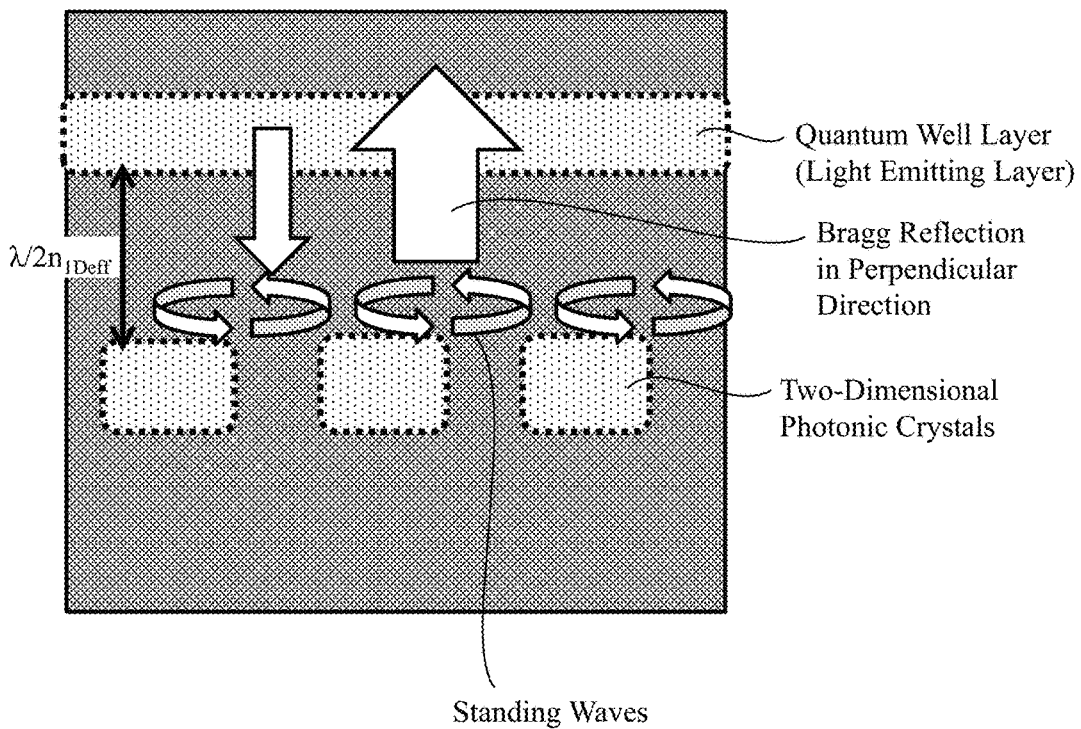
FIG. 8 is a view illustrating the principle of high reflection of a two-dimensional reflecting photonic crystal structure that satisfies the condition of Bragg reflection in the perpendicular direction.

The design of the two-dimensional reflecting photonic crystals (2D-PhC) is computed from the formula of the Bragg scattering condition: $m\lambda/n_{2Deff}=2a\sin\theta$ (where m is the order, $n_{2Deff}$ is the effective refractive index of the 2D-PhC periodic structure, $\lambda$ is the design wavelength, and a is the period of the 2D-PhC) in the plane of the 2D-PhC. As described in the first embodiment with reference to FIG. 7, the greater the R/a, the greater the change in the state density of photons. In addition, as illustrated in FIG. 8, DUV light that has entered the 2D-PhC formed in proximity to the quantum well layer (i.e., light emitting layer) generates standing waves in the plane of the 2D-PhC. Then, when the distance between the quantum well layer and the photonic crystals satisfies $\lambda/2n_{1Deff}$, DUV light that has entered the plane of the 2D-PhC is reflected in the direction of the sapphire substrate due to Bragg reflection occurring in the perpendicular direction.

The deep ultraviolet LED structure of the present embodiment is considered to be able to obtain high reflection effect when the distance between the quantum well layer and the 2D-PhC is 53 nm because it best satisfies the condition of Bragg reflection in the perpendicular direction.

Based on the above premise, the optimal value of the distance (G) between the quantum well layer and the 2D-PhC that can obtain the combined effect of Bragg reflection in the perpendicular direction and the 2D-PhC is determined through simulation analysis.

Figure 22:
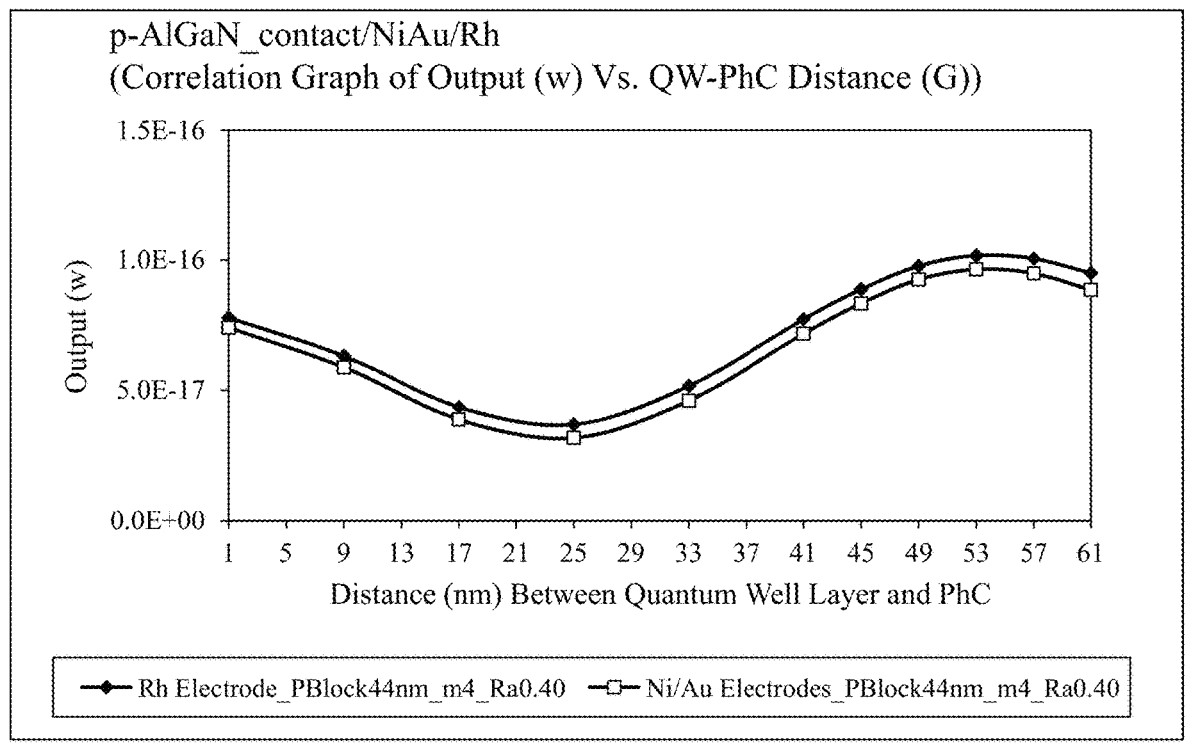
FIG. 22 is a graph illustrating the analysis results of the FDTD method when a p-AlGaN contact layer is provided, regarding the comparison between the output values when the distance between the quantum well layer and the two-dimensional photonic crystals is made variable.

The thickness of the p-block layer is set to 44 nm, and outputs that differ depending on the distance G between the quantum well layer and the 2D-PhC are confirmed. Herein, the distance G between the quantum well layer and the 2D-PhC was made variable in increments of 4 nm in the range of 1 to 61 nm, R/a of the 2D-PhC was set to R/a=0.4, and the order m was set to m=4. FIG. 22 illustrates the analysis results of the FDTD method.

FIG. 22 can confirm that the maximum output is obtained when the distance G between the quantum well layer and the 2D-PhC is 53 nm.

Figure 23:
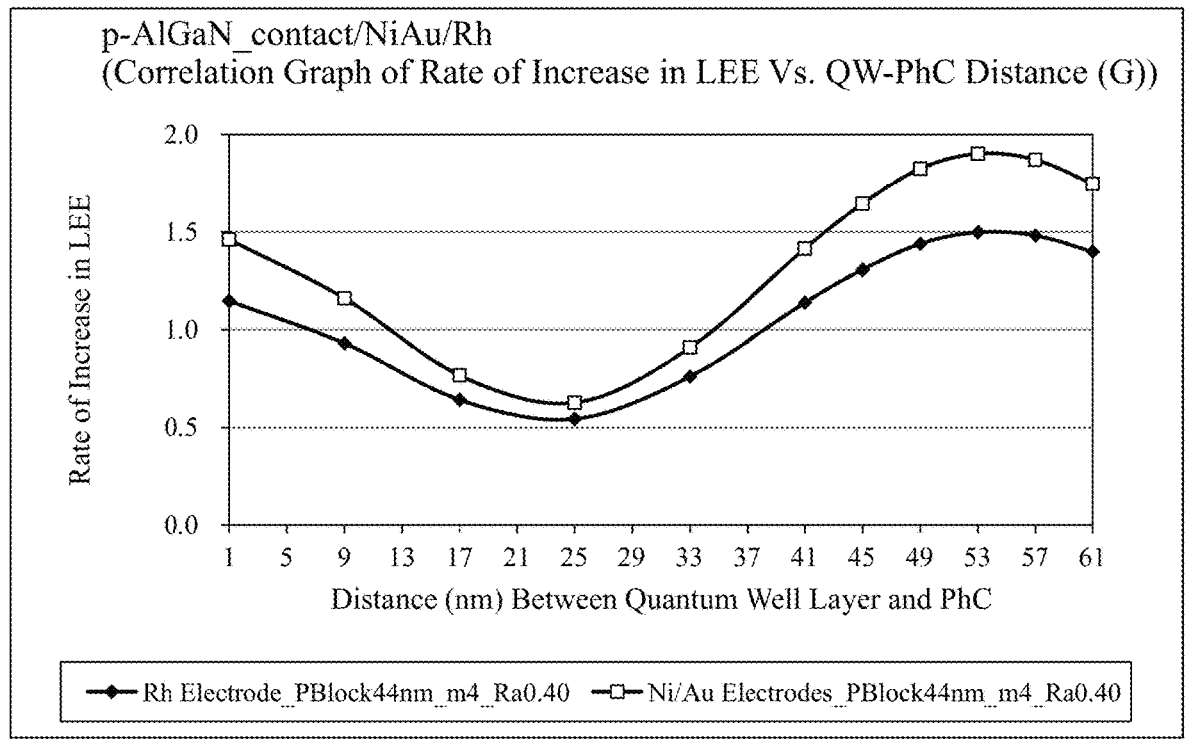
FIG. 23 is a graph illustrating the analysis results of the FDTD method when a p-AlGaN contact layer is provided, regarding the comparison between the rates of increase in the LEE when the distance between the quantum well layer and the two-dimensional photonic crystals is made variable.

FIG. 23 illustrates the rate of increase in the LEE of a structure with 2D-PhC compared with that of a structure without 2D-PhC, analyzed under the same simulation conditions as in FIG. 22. The rate of increase in the LEE is also maximum at a distance G between the quantum well layer and the 2D-PhC of 53 nm, and this value coincides with the distance of 53 nm that satisfies the aforementioned Bragg condition in the perpendicular direction. This indicates that the period of 53 nm at which the maximum effect of Bragg reflection in the perpendicular direction is obtained satisfies the optimization conditions regarding both the output and the rate of increase in the LEE that can obtain the combined effect of Bragg reflection of vertical direction and two-dimensional reflecting photonic crystals.

The distance between the quantum well layer and the 2D-PhC is selected from 53 nm to 61 nm at which a relatively high output is indicated.

Next, R/a of the 2D-PhC and the order m to be selected were confirmed through analysis based on the FDTD method. Comparison was made between a structure without 2D-PhC and with a p-block layer with a thickness of 44 nm and a structure with 2D-PhC and with a p-block layer with a thickness of 44 nm. First, regarding the dependence on R/a, the order m was set to m=4 and R/a was made variable in the range of R/a=0.20 to 0.40. Meanwhile, regarding the dependence on the order, R/a was set to 0.40 and the order m was made variable in the range of m=1 to 4. FIGS. 14 and 15 illustrate the comparison of the rates of increase in the LEE and the output values.

FIG. 14(a) illustrate the dependence of the rate of increase in the LEE on R/a for each of R/a=0.20, R/a=0.30, and R/a=0.40 when the distance G is 53 nm and the order m is m=4, and FIG. 14(b) similarly illustrates the dependence of the output value on R/a. FIG. 14(a) can confirm that the LEE of a structure with "pAlGaN_NiAu_Pblock44 nm_4" is increased by about 2 times when R/a=0.20, and is increased by about 4 times when R/a=0.40. FIG. 14(b) can also confirm that the greater the R/a, the greater the output.

FIG. 15(a) illustrates the dependence of the rate of increase in the LEE on the order for each of the orders m=1 to 4 when the distance G is 53 nm and R/a=0.40, and FIG. 15(b) similarly illustrates the dependence of the output value on the order. FIG. 15(a) can confirm that the rate of increase in the LEE of a structure with "pAlGaN_NiAu_Pblock44 nm R/a0.40" is increased by about 2 to 2.5 times when the order m is m=1 to 2, and is increased by about 4 times when the order m is m=3 to 4. FIG. 15(b) can also confirm that when the order m is m=3 to 4, an output that is higher than when the order m is m=1 to 2 is obtained.

Figure 24:
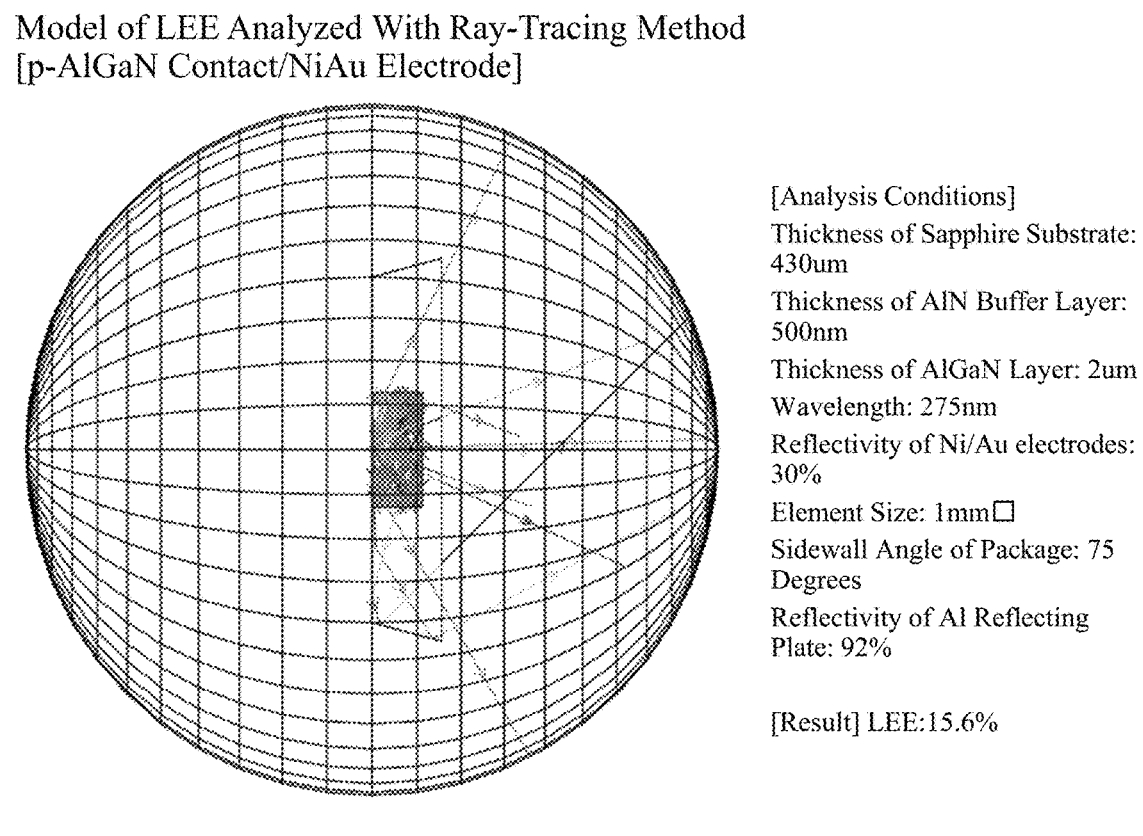
FIG. 24 illustrates a model of the LEE, analyzed with the ray-tracing method, of a structure with a p-AlGaN contact layer and with Ni and Au electrodes used as the electrodes.

For verification purposes, the LEE value was determined and confirmed through cross-simulation between the FDTD method and the ray-tracing method. FIG. 24 illustrates a computation model obtained with the ray-tracing method and the analysis results. With the ray-tracing method, nanometer-scale computation is impossible. Thus, cross-simulation was performed by multiplying the LEE value computed with the ray-tracing method by the rate of increase in the LEE derived with the FDTD method, so that the LEE value of the LED structure of the present embodiment was computed. Table 8 illustrates the results.

TABLE 8

Analysis Results of LEE Obtained by Cross-Simulation between FDTD Method and Ray-Tracing Method [p-AlGaN Contact/Ni and Au Electrodes]

| | Flat LEE (%) | Dependence on R/a | | | | | | | | |
|---|---|---|---|---|---|---|---|---|---|---|
| | | R/a = 0.2 | | | R/a = 0.3 | | | R/a = 0.4 | | |
| | | Power (w) | Rate of Increase in LEE | LEE (%) | Power (w) | Rate of Increase in LEE | LEE (%) | Power (w) | Rate of Increase in LEE | LEE (%) |
| pAlGaN_NiAu_Pblock44nm_m4 | 15.6% | 4.9E−17 | 2.0 | 31.8% | 8.0E−17 | 3.3 | 51.4% | 9.6E−17 | 4.0 | 62.2% |

| | | Dependence on Order | | | | | | |
|---|---|---|---|---|---|---|---|---|
| | | m = 1 | | | m = 2 | | | |
| | Flat LEE (%) | Power (w) | Rate of Increase in LEE | LEE (%) | Power (w) | Rate of Increase in LEE | LEE (%) | |
| pAlGaN_NiAu_Pblock44nm_R/a0.40 | 15.6% | 5.2E−17 | 2.1 | 33.5% | 6.7E−17 | 2.8 | 43.1% | |

| | Dependence on Order | | | | | |
|---|---|---|---|---|---|---|
| | m = 3 | | | m = 4 | | |
| | Power (w) | Rate of Increase in LEE | LEE (%) | Power (w) | Rate of Increase in LEE | LEE (%) |
| pAlGaN_NiAu_Pblock44nm_R/a0.40 | 9.8E−17 | 4.1 | 63.5% | 9.6E−17 | 4.0 | 62.2% |

As can be seen in Table 8, when the thickness of the p-block layer is 44 nm, the distance G between the quantum well layer and the 2D-PhC is 53 nm, R/a=0.40, and the order m is m=3, a LEE of 63.5% is obtained, and similarly, when the order m is m=4, a LEE of 62.2% is obtained. This can confirm that the LEE can be further improved based on the present embodiment.

Third Embodiment

FIGS. 1C(c-1) and 1C(c-2) represent the structure (a cross-sectional view and a plan view, respectively) of an AlGaN-based deep ultraviolet LED with a design wavelength λ of 275 nm, as a deep ultraviolet LED in accordance with a third embodiment of the present invention.

As illustrated in FIG. 1C, the LED structure of the present embodiment is a modified example in which a Rh electrode is used instead of the metal layer (Ni) and the reflecting electrode (Au) that are the electrode portions of the deep ultraviolet LED structure of the second embodiment of the present invention including a p-AlGaN contact layer, which is transparent to light with a wavelength λ, as the p-contact layer.

It has been confirmed from the results of simulation that a Rh electrode (with a reflectivity of 70%) has higher reflectivity than Ni and Au electrodes (with a reflectivity 20%) and can, as illustrated in FIG. 20, obtain a higher output than the Ni and Au electrodes. The reflection effect of 2D-PhC with R/a=0.40 is almost 100% for TE light, and is lower than that for TM light. DUV light with a wavelength of 275 nm is polarized. The degree of polarization has been computed as 0.35 through analysis based on the FDTD method illustrated in the present invention, and the intensity ratio is TE:TM=7:3. Thus, it is considered that the reflection of TM light, which has passed through the 2D-PhC and reached the Rh electrode, has a greater influence as a high output in comparison with when the Ni and Au electrodes are used.

The stacked structure portion of the LED structure of the present embodiment is a modified example of the second embodiment and differs from the second embodiment only in the electrode. Thus, the optimal conditions that can obtain the combined effect of Bragg reflection in the perpendicular direction and 2D-PhC were analyzed through simulation based on the FDTD method under the same conditions as in the second embodiment and only by replacing the electrodes with a Rh electrode. Table 9 illustrates the parameters of a computation model of the deep ultraviolet LED structure obtained with the FDTD method. The parameters of a computation model of the two-dimensional reflecting photonic crystal structure are illustrated in Table 7. FIG. 22 illustrates the results of simulation analysis of the FDTD method.

TABLE 9

Computation Model of LED with pAlGaN Contact Layer Obtained with FDTD Method [Rh electrode]

| | Thickness (nm) | | Al Content (%) | Refractive Index | Extinction Coefficient |
|---|---|---|---|---|---|
| Reflecting Electrode (Rh) | 230 | nm | — | 0.791 | 2.679 |
| p-AlGaN Contact Layer | 70 | nm | 56% | 2.723 | — |
| p-Block Layer (Variable in Increments of 4 nm) | 40 nm-60 | nm | 68% | 2.594 | — |
| i-Guide Layer | 1 | nm | 100% | 2.300 | — |
| Multi-Quantum Well Layer: 3pair | — | | — | — | — |
| Well | 2 | nm | 45% | 2.773 | — |
| Barrier | 7 | nm | 65% | 2.623 | — |
| n-AlGaN Contact Layer | 200 | nm | 65% | 2.623 | — |
| u-AlGaN Layer | 100 | nm | 85% | 2.415 | — |
| AlN Template | 200 | nm | 100% | 2.300 | — |
| Sapphire Substrate | 1,300 | nm | — | 1.830 | — |

In FIG. 22, the thickness of the p-block layer is set to 44 nm, and outputs that differ depending on the distance (G) between the quantum well layer and the 2D-PhC are confirmed. Herein, the distance G between the quantum well layer and the 2D-PhC is made variable in increments of 4 nm in the range of 1 to 61 nm, R/a of the 2D-PhC was set to R/a=0.40, and the order m was set to m=4.

FIG. 22 can confirm that when a Rh electrode is used, the maximum output is also obtained at a distance G between the quantum well layer and the 2D-PhC of 53 nm.

FIG. 23 illustrates the rate of increase in the LEE of a structure with 2D-PhC compared with that of a structure without 2D-PhC, analyzed under the same simulation conditions as in FIG. 22. The rate of increase in the LEE is also maximum at a distance G between the quantum well layer and the 2D-PhC of 53 nm, and this value coincides with the distance of 53 nm that satisfies the aforementioned Bragg condition in the perpendicular direction. This indicates that the period of 53 nm at which the maximum reflection effect in the perpendicular direction is obtained satisfies the optimization conditions regarding both the output and the rate of increase in the LEE that can obtain the combined effect of Bragg reflection of vertical direction and two-dimensional reflecting photonic crystals.

The distance between the quantum well layer and the 2D-PhC is selected from 53 nm to 61 nm at which a relatively high output is indicated.

Next, R/a of the 2D-PhC and the order m to be selected were confirmed through analysis based on the FDTD method. Comparison was made between a structure without 2D-PhC and with a p-block layer with a thickness of 44 nm and a structure with 2D-PhC and with a p-block layer with a thickness of 44 nm. First, regarding the dependence on R/a, the order m was set to m=4 and R/a was made variable in the range of R/a=0.20 to 0.40. Meanwhile, regarding the dependence on the order, R/a was set to 0.40 and the order m was made variable in the range of m=1 to 4. FIGS. 14 and 15 illustrate the comparison of the rates of increase in the LEE and the output values.

FIG. 14(a) illustrate the dependence of the rate of increase in the LEE on R/a for each of R/a=0.20, R/a=0.30, and R/a=0.40 when the distance G is 53 nm and the order m is m=4, and FIG. 14(b) similarly illustrates the dependence of the output value on R/a. FIG. 14(a) can confirm that the LEE of a structure with "pAlGaN_Rh_Pblock44 nm_4" is increased by about twice when R/a=0.20, and is increased by more than three times when R/a=0.40. FIG. 14(b) can also confirm that the greater the R/a, the greater the output.

FIG. 15(a) illustrates the dependence of the rate of increase in the LEE on the order for each of the orders m=1 to 4 when the distance G is 53 nm and R/a=0.40, and FIG. 15(b) similarly illustrates the dependence of the output value on the order. FIG. 15(a) can confirm that the rate of increase in the LEE of a structure with "pAlGaN_Rh_Pblock44 nm_R/a0.40" is increased by about twice when the order m is m=1 to 2, and is increased by about three times when the order m is m=3 to 4. FIG. 15(b) can also confirm that when the order m is m=3 to 4, an output that is higher than when the order m is m=1 to 2 is obtained.

Figure 25:
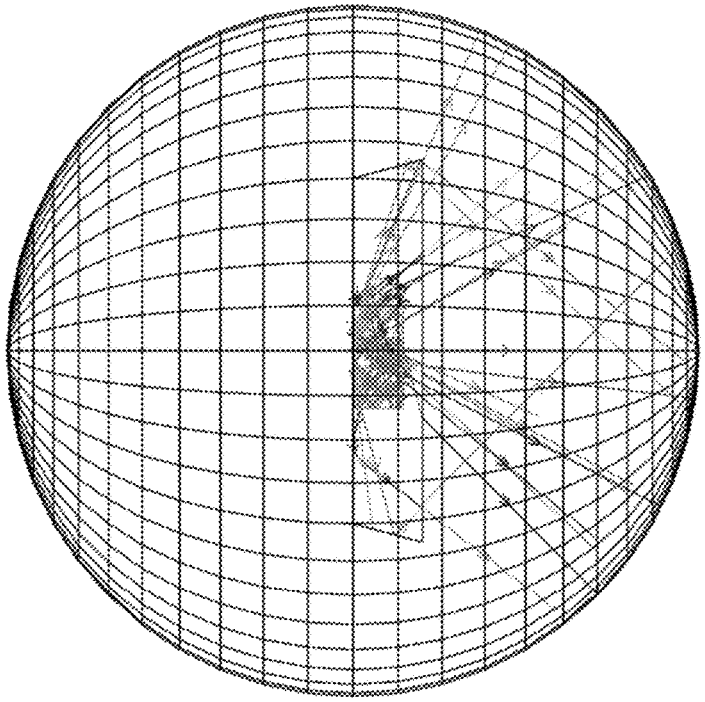
FIG. 25 illustrates a model of the LEE, analyzed with the ray-tracing method, of a structure with a p-AlGaN contact layer and with a Rh electrode used as the electrode.

For verification purposes, the LEE value was determined and confirmed through cross-simulation between the FDTD method and the ray-tracing method. FIG. 25 illustrates a computation model obtained with the ray-tracing method and the analysis results. With the ray-tracing method, nanometer-scale computation is impossible. Thus, cross-simulation was performed by multiplying the LEE value computed with the ray-tracing method by the rate of increase in the LEE derived with the FDTD method, so that the LEE value of the LED structure of the present embodiment was computed. Table 10 illustrates the results.

TABLE 10

Analysis Results of LEE Obtained by Cross-Simulation between FDTD Method and Ray-Tracing Method [p-AlGaN Contact/Rh Electrode]

| | | Dependence on R/a | | | | | | | | |
|---|---|---|---|---|---|---|---|---|---|---|
| | | R/a = 0.2 | | | R/a = 0.3 | | | R/a = 0.4 | | |
| | Flat LEE (%) | Power (w) | Rate of Increase in LEE | LEE (%) | Power (w) | Rate of Increase in LEE | LEE (%) | Power (w) | Rate of Increase in LEE | LEE (%) |
| pAlGaN_Rh_Pblock44nm_m4 | 17.2% | 6.2E−17 | 1.9 | 33.5% | 8.8E−17 | 2.8 | 47.6% | 1.0E−16 | 3.2 | 55.2% |

| | | Dependence on Order | | | | | |
|---|---|---|---|---|---|---|---|
| | | m = 1 | | | m = 2 | | |
| | Flat LEE (%) | Power (w) | Rate of Increase in LEE | LEE (%) | Power (w) | Rate of Increase in LEE | LEE (%) |
| pAlGaN_Rh_Pblock44nm_R/a0.40 | 17.2% | 5.5E−17 | 1.7 | 29.7% | 7.8E−17 | 2.5 | 42.2% |

| | Dependence on Order | | | | | |
|---|---|---|---|---|---|---|
| | m = 3 | | | m = 4 | | |
| | Power (w) | Rate of Increase in LEE | LEE (%) | Power (w) | Rate of Increase in LEE | LEE (%) |
| pAlGaN_Rh_Pblock44nm_R/a0.40 | 1.1E−16 | 3.4 | 58.7% | 1.0E−16 | 3.2 | 55.2% |

As can be seen in Table 10, when the thickness of the p-block layer is 44 nm, the distance G between the quantum well layer and the 2D-PhC is 53 nm, R/a=0.40, and the order m is m=3, a LEE of 58.7% is obtained, and similarly, when the order m is m=4, a LEE of 55.2% is obtained. This can confirm that the LEE can be further improved based on the present embodiment.

Fourth Embodiment

A fourth embodiment of the present invention will describe a method for producing a deep ultraviolet LED that includes a p-GaN contact layer as a p-contact layer.

First, an AlN template, a u-AlGaN layer, an n-AlGaN contact layer, and a multi-quantum well layer are sequentially stacked through crystal growth on a sapphire substrate as a substrate for growth. The multi-quantum well layer is deposited such that it includes three well layers each having a thickness of 2 nm, and two barrier layers each having a thickness of 7 nm and sandwiched between the adjacent well layers. Then, an i-guide layer (AlN) and a p-block layer (a p-AlGaN layer) are stacked thereon to a thickness of 52 to 56 nm. Then, a p-GaN contact layer is stacked thereon. The entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS.

Then, a two-dimensional reflecting photonic crystal periodic structure is formed in the deep ultraviolet LED stacked structure that has the layers up to the p-GaN contact layer formed therein through crystal growth.

Figure 26:
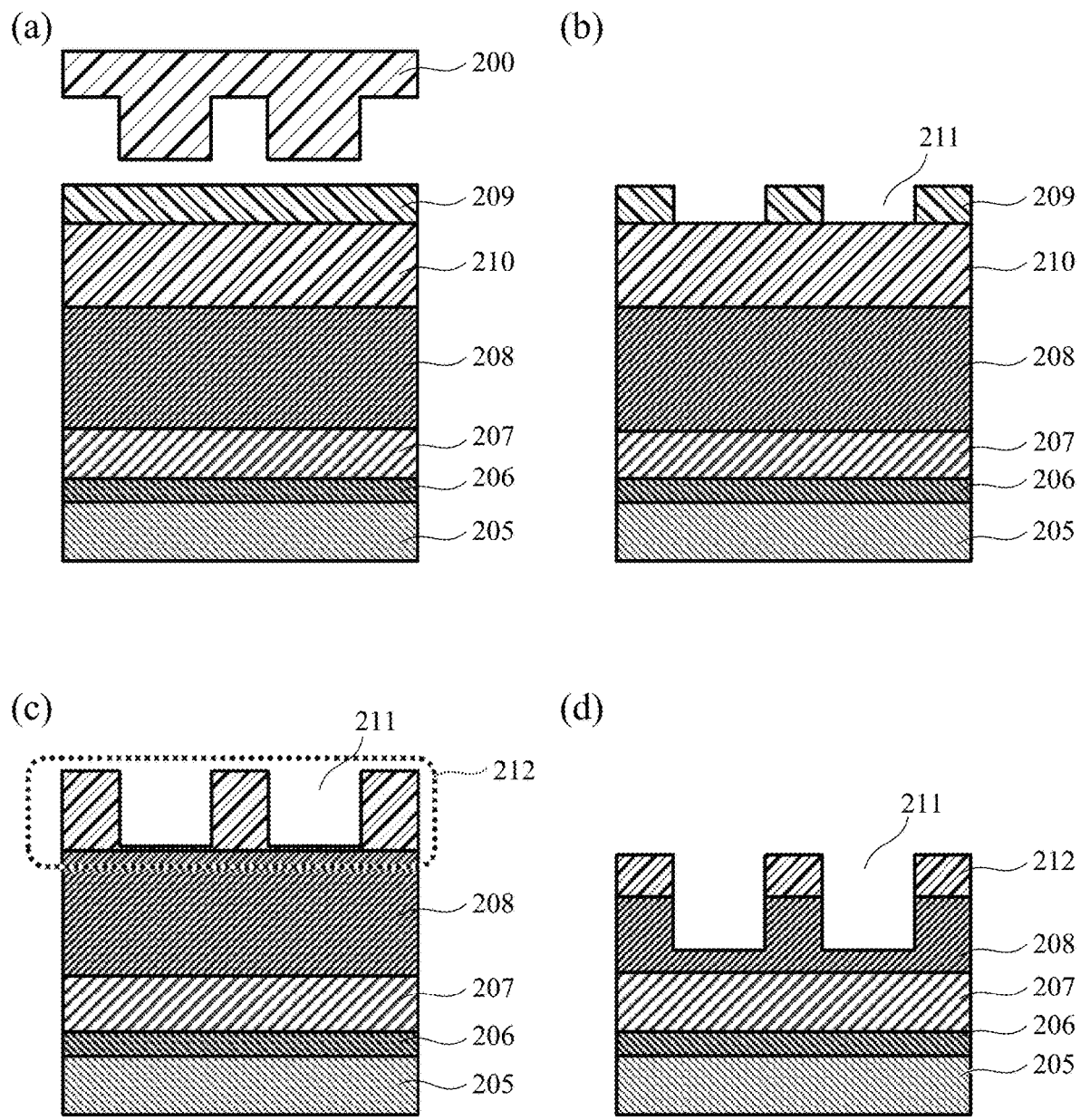
FIG. 26 illustrate an exemplary process of forming a two-dimensional reflecting photonic crystal periodic structure of a deep ultraviolet LED structure that includes a p-GaN contact layer.

FIGS. 26 illustrate an exemplary process of forming the two-dimensional reflecting photonic crystal periodic structure.

To form two-dimensional reflecting photonic crystals, the nanoimprint lithography technique is used. The surface of the p-GaN contact layer 208 has a warp of 100 μm or more in the protruding direction. Thus, a resin mold 200 is used as the mold. In addition, bi-layer resist is used to accurately maintain the diameters of the holes nearly perpendicularly during dry etching.

Specifically, for a wafer having the deep ultraviolet LED stacked structure of the layers up to the p-GaN contact layer 208, the surface of the p-GaN contact layer 208 is spin-coated with lower-layer resist 210. Next, the lower-layer resist 210 is spin-coated with Si-containing upper-layer resist 209 so that bi-layer resist is formed (see FIG. 26(a)).

The resin mold 200, which has an inverted pattern of a predetermined photonic crystal periodic structure, is pressed against the upper-layer resist and then the upper-layer resist is cured with ultraviolet rays so that a photonic crystal pattern 211 is imprinted to the upper-layer resist 209 (see FIG. 26(b)). Next, the upper-layer resist 209 is etched with oxygen plasma to form a mask 212. See FIG. 26(c). Then, the mask 212 is partially etched with ICP plasma to a position not beyond the p-block layer 207 and a position at which the distance from an end face of the photonic crystal pattern (i.e., hole) 211 to the quantum well layer 205 is 53 to 57 nm. See FIG. 26(d). Finally, the remaining lower-layer resist 210 is washed to obtain a clean surface. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

Further, considering the damage to the p-GaN contact layer due to etching, ammonium sulfide treatment or annealing treatment may be applied to repair the damage.

After that, a metal layer (Ni) and a reflecting electrode layer (Au) are formed on the two-dimensional reflecting photonic periodic structure. The metal layer (Ni) and the reflecting electrode layer (Au) may be formed through oblique deposition.

The oblique deposition allows the metal layer (Ni) and the reflecting electrode layer (Au) to be formed on the surface of the p-GaN contact layer without filling the voids of the two-dimensional reflecting photonic crystal periodic structure.

Fifth Embodiment

A fifth embodiment of the present invention will describe a method for producing a deep ultraviolet LED that includes a p-AlGaN contact layer as a p-contact layer.

An AlN template, a u-AlGaN layer, an n-AlGaN contact layer, and a multi-quantum well layer are sequentially stacked through crystal growth on a sapphire substrate as a substrate for growth. The multi-quantum well layer is deposited such that it includes three well layers each having a thickness of 2 nm, and two barrier layers each having a thickness of 7 nm and sandwiched between the adjacent well layers. Then, an i-guide layer (AlN) and a p-block layer (a p-AlGaN layer) are stacked thereon to a thickness of 44 to 48 nm. Then, a p-AlGaN contact layer is stacked thereon.

The entire thickness of each layer formed through epitaxial growth can be measured with an optical interference film thickness meter. Further, when the composition of each of the adjacent layers sufficiently differs from one another (for example, differs in the Al composition ratio by 0.01 or more), the thickness of each layer can be computed by observing the cross-section of the grown layer with a transmission electron microscope. Furthermore, when the thickness of each layer is thin like the multi-quantum wells and the superlattice structure, the thickness of such layer can be measured with TEM-EDS.

Figure 27:
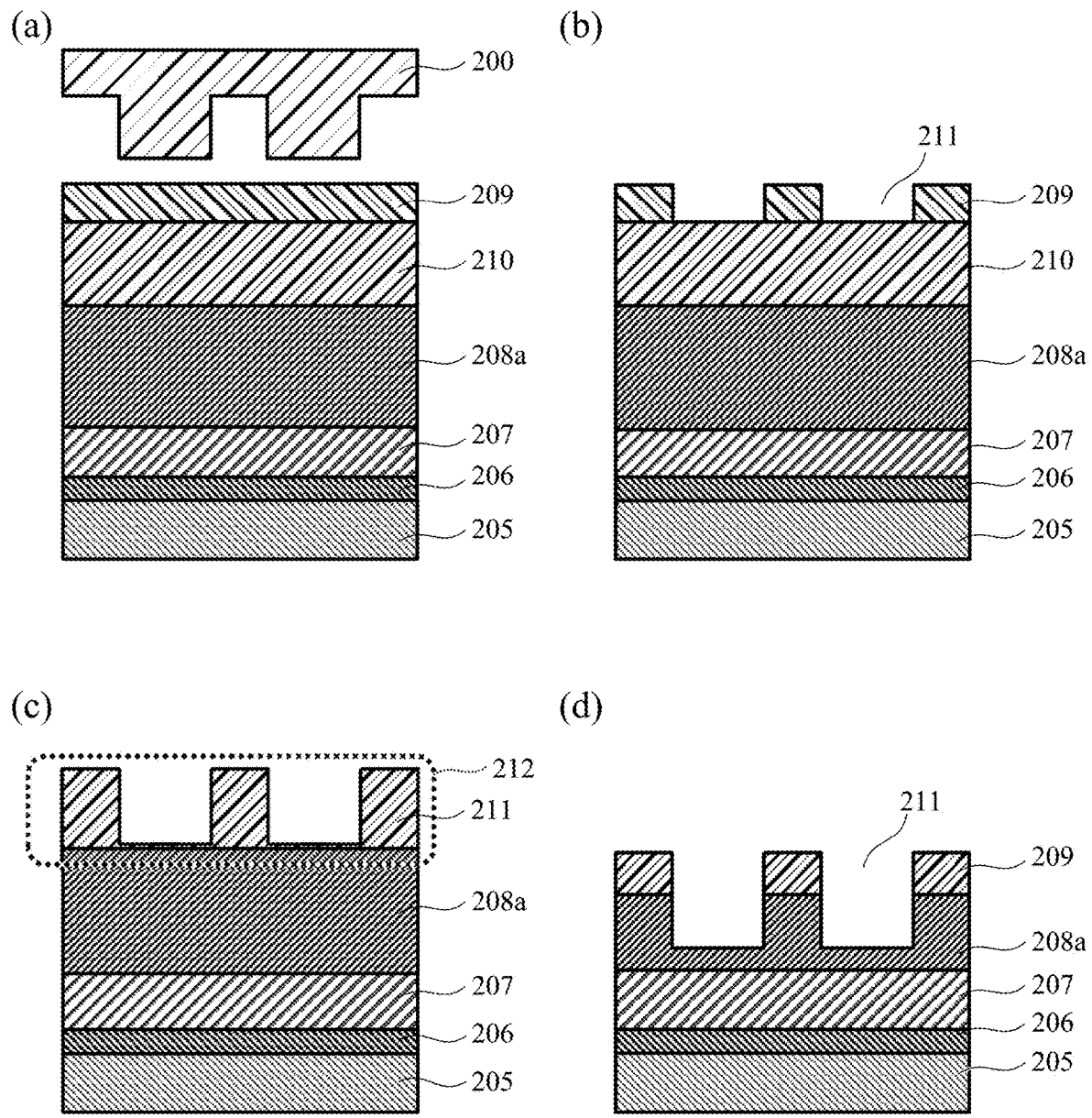
FIG. 27 illustrate an exemplary process of forming a two-dimensional reflecting photonic crystal periodic structure of a deep ultraviolet LED structure that includes a p-AlGaN contact layer.

Then, a two-dimensional reflecting photonic periodic structure is formed in the deep ultraviolet LED stacked structure that has the layers up to the p-AlGaN contact layer formed therein through crystal growth. The two-dimensional reflecting photonic crystals are formed using a method similar to that described in the fourth embodiment (see FIG. 27).

That is, for a wafer having the deep ultraviolet LED stacked structure of the layers up to the p-AlGaN contact layer 208a, the surface of the p-AlGaN contact layer 208a is spin-coated with lower-layer resist 210. Next, the lower-layer resist 210 is spin-coated with Si-containing upper-layer resist 209 so that bi-layer resist is formed. A resin mold 200, which has an inverted pattern of a predetermined photonic crystal periodic structure, is pressed against the upper-layer resist 209 and then the upper-layer resist 209 is cured with ultraviolet rays (see FIG. 27(a)) so that a photonic crystal pattern 211 is imprinted to the upper-layer resist 209 (see FIG. 27(b)). Next, the upper-layer resist 209 is etched with oxygen plasma to form a mask 212 (See FIG. 27(c)). Then, the mask 212 is partially etched with ICP plasma to a position not beyond the p-block layer 207 and a position at which the distance from an end face of the photonic crystal pattern (i.e., hole) 211 to the quantum well layer 205 is 53 to 61 nm (See FIG. 27(d)). Finally, the remaining lower-layer resist 210 is washed to obtain a clean surface. For the measurement of the periodic structure or the shapes of the photonic crystals and the distance between the quantum well layer and the photonic crystals, computation can be performed by observing a HAADF (high-angle annular dark-field) image in a STEM (scanning transmission electron microscope) mode of a transmission electron microscope.

Further, considering the damage to the p-AlGaN contact layer due to etching, ammonium sulfide treatment or annealing treatment may be applied to repair the damage.

After that, a metal layer (Ni) and a reflecting electrode layer (Au) are formed on the two-dimensional reflecting photonic periodic structure. The metal layer (Ni) and the reflecting electrode layer (Au) may be formed through oblique deposition.

The oblique deposition allows the metal layer (Ni) and the reflecting electrode layer (Au) to be formed on the surface of the p-GaN contact layer without filling the voids of the two-dimensional reflecting photonic crystal periodic structure.

As the electrode, a Rh electrode may be formed instead of the metal layer (Ni) and the reflecting electrode layer (Au) after the two-dimensional reflecting photonic crystal periodic structure is formed. The Rh electrode may also be formed through oblique deposition.

INDUSTRIAL APPLICABILITY

The present invention is applicable to deep ultraviolet LEDs.

REFERENCE SIGNS LIST

1 Sapphire substrate
2 MN template
3 u-AlGaN layer
4 n-AlGaN contact layer
5 Multi-quantum well layer
6 i-guide layer
7 p-block layer
8 p-GaN contact layer
8a p-AlGaN contact layer
9 Metal layer (Ni)
10 Reflecting electrode layer (Au)
11 Reflecting electrode layer (Rh)
100 Two-dimensional reflecting photonic crystal periodic structure
101(h) Voids (columnar structures or holes)

All publications, patents, and patent applications cited in this specification are incorporated herein by reference in their entirety.

The invention claimed is:

1. A deep ultraviolet LED with a design wavelength λ, comprising a reflecting electrode layer (Au), a metal layer (Ni), a p-GaN contact layer, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate,
wherein:
a thickness of the p-block layer is 52 to 56 nm,
a two-dimensional reflecting photonic crystal periodic structure having a plurality of voids is provided in a region from an interface between the metal layer and the p-GaN contact layer to a position not beyond an interface between the p-GaN contact layer and the p-block layer in a thickness direction of the p-GaN contact layer, a distance from an end face of each of the voids in a direction of the sapphire substrate to an interface between the multi-quantum well layer and the i-guide layer satisfies $\lambda/2n_{1Deff}$ (where $\lambda$ is the design wavelength and n1Deff is the effective average refractive index of each film of the stacked structure from the end face of each void to the i-guide layer) in a perpendicular direction, the distance being in a range of 53 to 57 nm, the two-dimensional reflecting photonic crystal periodic structure has a photonic band gap that opens for TE polarized components, and provided that a period a of the two-dimensional reflecting photonic crystal periodic structure satisfies a Bragg condition with respect to light with the design wavelength $\lambda$, an order m of a formula of the Bragg condition: $m\lambda/n_{2Deff}=2a$ (where m is the order, $\lambda$ is the design wavelength, $n_{2Deff}$ is an effective refractive index of two-dimensional photonic crystals, and a is the period of the two-dimensional photonic crystals) satisfies $2 \leq m \leq 4$, and a radius of each void is R, R/a satisfies $0.30 \leq R/a \leq 0.40$.

2. A deep ultraviolet LED with a design wavelength $\lambda$, comprising a reflecting electrode layer (Au), a metal layer (Ni), a p-AlGaN contact layer transparent to light with the wavelength $\lambda$, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate, wherein:
a thickness of the p-block layer is 44 to 48 nm, a two-dimensional reflecting photonic crystal periodic structure having a plurality of voids is provided in a region from an interface between the metal layer and the p-AlGaN contact layer to a position not beyond an interface between the p-AlGaN contact layer and the p-block layer in a thickness direction of the p-AlGaN contact layer, a distance from an end face of each of the voids in a direction of the sapphire substrate to an interface between the multi-quantum well layer and the i-guide layer satisfies $\lambda/2n_{1Deff}$ (where $\lambda$ is the design wavelength and n1Deff is the effective average refractive index of each film of the stacked structure from the end face of each void to the i-guide layer) in a perpendicular direction, the distance being in a range of 53 to 61 nm, the two-dimensional reflecting photonic crystal periodic structure has a photonic band gap that opens for TE polarized components, and provided that a period a of the two-dimensional reflecting photonic crystal periodic structure satisfies a Bragg condition with respect to light with the design wavelength $\lambda$, an order m of a formula of the Bragg condition: $m\lambda/n_{2Deff}=2a$ (where m is the order, $\lambda$ is the design wavelength, $n_{2Deff}$ is an effective refractive index of two-dimensional photonic crystals, and a is the period of the two-dimensional photonic crystals) satisfies $1 \leq m \leq 4$, and a radius of each void is R, R/a satisfies 0.20R/a0.40.

3. A deep ultraviolet LED with a design wavelength $\lambda$, comprising a reflecting electrode layer (Rh), a p-AlGaN contact layer transparent to light with the wavelength $\lambda$, a p-block layer made of a p-AlGaN layer, an i-guide layer made of an AlN layer, a multi-quantum well layer, an n-AlGaN contact layer, a u-AlGaN layer, an AlN template, and a sapphire substrate that are arranged in this order from a side opposite to the sapphire substrate, wherein:
a thickness of the p-block layer is 44 to 48 nm, a two-dimensional reflecting photonic crystal periodic structure having a plurality of voids is provided in a region from an interface between the reflecting electrode layer and the p-AlGaN contact layer to a position not beyond an interface between the p-AlGaN contact layer and the p-block layer in a thickness direction of the p-AlGaN contact layer, a distance from an end face of each of the voids in a direction of the sapphire substrate to an interface between the multi-quantum well layer and the i-guide layer satisfies $\lambda/2n_{1Deff}$ (where $\lambda$ is the design wavelength and n1Deff is the effective average refractive index of each film of the stacked structure from the end face of each void to the i-guide layer) in a perpendicular direction, the distance being in a range of 53 to 61 nm, the two-dimensional reflecting photonic crystal periodic structure has a photonic band gap that opens for TE polarized components, and provided that a period a of the two-dimensional reflecting photonic crystal periodic structure satisfies a Bragg condition with respect to light with the design wavelength $\lambda$, an order m of a formula of the Bragg condition: $m\lambda/n_{2Deff}=2a$ (where m is the order, $\lambda$ is the design wavelength, $n_{2Deff}$ is an effective refractive index of two-dimensional photonic crystals, and a is the period of the two-dimensional photonic crystals) satisfies $1 \leq m \leq 4$ and a radius of each void is R, R/a satisfies 0.20R/a0.40.

4. A method for producing a deep ultraviolet LED with a design wavelength $\lambda$, comprising:

preparing a stacked structure formed on a sapphire substrate as a substrate for growth, the stacked structure including a reflecting electrode layer, a metal layer, a p-GaN contact layer, a p-block layer made of a p-AlGaN layer transparent to light with the wavelength $\lambda$, an i-guide layer made of an AlN layer, a multi-quantum well layer, an n-AlGaN contact layer, a u-AlGaN layer, and an AlN template that are arranged in this order from a side opposite to the sapphire substrate, the p-block layer being formed to a thickness of 52 to 56 nm through crystal growth;

forming a two-dimensional reflecting photonic crystal periodic structure having a plurality of voids in a region from an interface between the metal layer and the p-GaN contact layer to a position not beyond an interface between the p-GaN contact layer and the p-block layer in a thickness direction of the p-GaN contact layer, each of the voids being formed in a position such that a distance from an end face of the void in a direction of the sapphire substrate to an interface between the multi-quantum well layer and the i-guide layer is 53 to 57 nm;

preparing a mold for forming the two-dimensional reflecting photonic crystal periodic structure;

forming a resist layer on the p-GaN contact layer and imprinting a structure of the mold to the resist layer through nanoimprinting;

partially etching the p-GaN contact layer using the resist layer as a mask, thereby forming a two-dimensional photonic crystal periodic structure;

forming the metal layer in this order on the two-dimensional reflecting photonic crystal structure through oblique deposition; and forming the reflecting electrode layer on the metal layer.

5. A method for producing a deep ultraviolet LED with a design wavelength $\lambda$, comprising:

forming a stacked structure on a sapphire substrate as a substrate for growth, the stacked structure including a reflecting electrode layer, a metal layer, a p-AlGaN contact layer transparent to light with the wavelength $\lambda$, a p-block layer made of a p-AlGaN layer, an i-guide layer made of an AlN layer, a multi-quantum well layer, an n-AlGaN contact layer, a u-AlGaN layer, and an AlN template that are arranged in this order from a side opposite to the sapphire substrate, the p-block layer being formed to a thickness of 44 to 48 nm through crystal growth;

forming a two-dimensional reflecting photonic crystal periodic structure having a plurality of voids in a region from an interface between the metal layer and the p-AlGaN contact layer to a position not beyond an interface between the p-AlGaN contact layer and the p-block layer in a thickness direction of the p-AlGaN contact layer, each of the voids being formed in a position such that a distance from an end face of the void in a direction of the substrate for growth to an interface between the multi-quantum well layer and the i-guide layer is 53 to 61 nm;

preparing a mold for forming the two-dimensional reflecting photonic crystal periodic structure;

forming a resist layer on the p-AlGaN contact layer and imprinting a structure of the mold to the resist layer through nanoimprinting;

partially etching the p-AlGaN contact layer using the resist layer as a mask, thereby forming a two-dimensional photonic crystal periodic structure;

forming the metal layer on the two-dimensional reflecting photonic crystal structure through oblique deposition; and forming the reflecting electrode layer on the metal layer.

6. A method for producing a deep ultraviolet LED with a design wavelength $\lambda$, comprising:

forming a stacked structure on a sapphire substrate as a substrate for growth, the stacked structure including a reflecting electrode layer, a p-AlGaN contact layer transparent to light with the wavelength $\lambda$, a p-block layer made of a p-AlGaN layer, an i-guide layer made of an AlN layer, a multi-quantum well layer, an n-AlGaN contact layer, a u-AlGaN layer, and an AlN template that are arranged in this order from a side opposite to the sapphire substrate, the p-block layer being formed to a thickness of 44 to 48 nm through crystal growth;

forming a two-dimensional reflecting photonic crystal periodic structure having a plurality of voids in a region from an interface between the reflecting electrode and the p-AlGaN contact layer to a position not beyond an interface between the p-AlGaN contact layer and the p-block layer in a thickness direction of the p-AlGaN contact layer;

forming each of the voids in a position such that a distance from an end face of the void in a direction of the substrate for growth to an interface between the multi-quantum well layer and the i-guide layer is 53 to 61 nm;

preparing a mold for forming the two-dimensional reflecting photonic crystal periodic structure;

forming a resist layer on the p-AlGaN contact layer and imprinting a structure of the mold to the resist layer through nanoimprinting;

partially etching the p-AlGaN contact layer using the resist layer as a mask, thereby forming a two-dimensional photonic crystal periodic structure; and forming the reflecting electrode layer on the two-dimensional reflecting photonic crystal structure through oblique deposition.

* * * * *

UNITED STATES PATENT AND TRADEMARK OFFICE
CERTIFICATE OF CORRECTION

| | |
|---|---|
| PATENT NO. | : 11,309,454 B2 |
| APPLICATION NO. | : 16/964881 |
| DATED | : April 19, 2022 |
| INVENTOR(S) | : Kashima et al. |

It is certified that error appears in the above-identified patent and that said Letters Patent is hereby corrected as shown below:

On the Title Page

Item (73): after TOKYO OHKA KOGYO CO., LTD., delete "Kanaga (JP)" and insert --Kanagawa (JP)--.

Signed and Sealed this
Twenty-first Day of March, 2023

Katherine Kelly Vidal
*Director of the United States Patent and Trademark Office*